(12) United States Patent
Kimura et al.

(10) Patent No.: US 10,658,520 B2
(45) Date of Patent: May 19, 2020

(54) SEMICONDUCTOR DEVICE COMPRISING ROUNDED SOURCE AND DRAIN ELECTRODES

(71) Applicant: Semiconductor Energy Laboratory Co., Ltd., Atsugi-shi, Kanagawa-ken (JP)

(72) Inventors: Hajime Kimura, Kanagawa (JP); Yoshinori Ieda, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/681,939

(22) Filed: Aug. 21, 2017

(65) Prior Publication Data

US 2018/0061995 A1     Mar. 1, 2018

(30) Foreign Application Priority Data

Aug. 24, 2016 (JP) ................... 2016-163218

(51) Int. Cl.
| | | |
|---|---|---|
| *H01L 29/786* | (2006.01) | |
| *H01L 29/417* | (2006.01) | |
| *H01L 29/24* | (2006.01) | |
| *H01L 29/66* | (2006.01) | |

(52) U.S. Cl.
CPC ........ *H01L 29/78693* (2013.01); *H01L 29/24* (2013.01); *H01L 29/247* (2013.01); *H01L 29/41733* (2013.01); *H01L 29/66969* (2013.01); *H01L 29/7869* (2013.01); *H01L 29/78609* (2013.01); *H01L 29/78648* (2013.01)

(58) Field of Classification Search
CPC ......... H01L 29/41733; H01L 29/78693; H01L 29/247; H01L 29/24; H01L 29/66969
See application file for complete search history.

(56) References Cited

U.S. PATENT DOCUMENTS

| | | | |
|---|---|---|---|
| 7,674,650 B2 | 3/2010 | Akimoto et al. | |
| 7,759,735 B2* | 7/2010 | Maekawa | ............... H01L 27/12 257/296 |
| 8,003,420 B2* | 8/2011 | Maekawa | ............... H01L 27/12 438/149 |
| 8,841,661 B2 | 9/2014 | Akimoto et al. | |

(Continued)

FOREIGN PATENT DOCUMENTS

| | | |
|---|---|---|
| JP | 2007-096055 A | 4/2007 |
| JP | 2007-123861 A | 5/2007 |
| JP | 2011-119674 A | 6/2011 |

*Primary Examiner* — Thao X Le
*Assistant Examiner* — Gardner W. S. Swan
(74) *Attorney, Agent, or Firm* — Fish & Richardson P.C.

(57) ABSTRACT

A semiconductor device including a transistor having low leakage current between the drain and the gate is provided. The semiconductor device includes an insulating film provided so as to cover a corner of the first conductor and a second conductor provided so as to overlap with a corner of the first conductor with the insulating film provided therebetween. Variation in the thickness of the insulating film can be prevented by making the first conductor have a rounded corner. Furthermore, concentration of electric field due to the corner of the first conductor can be relaxed. Thus, the current leakage between the first conductor and the second conductor can be reduced.

8 Claims, 21 Drawing Sheets

(56) References Cited

U.S. PATENT DOCUMENTS

| | | |
|---|---|---|
| 8,860,108 B2 | 10/2014 | Yamazaki et al. |
| 9,666,697 B2 | 5/2017 | Tanaka et al. |
| 2001/0020994 A1* | 9/2001 | Kaneko ............. G02F 1/136286 349/147 |
| 2003/0185980 A1* | 10/2003 | Endo ....................... C23C 26/00 427/255.23 |
| 2009/0096033 A1* | 4/2009 | Pendharkar ....... H01L 21/76232 257/370 |
| 2010/0117086 A1* | 5/2010 | Akimoto ............. H01L 29/7869 257/57 |
| 2010/0224878 A1 | 9/2010 | Kimura |
| 2015/0008428 A1 | 1/2015 | Yamamoto et al. |
| 2015/0069384 A1* | 3/2015 | Kobayashi .......... H01L 29/7869 257/43 |
| 2015/0236044 A1* | 8/2015 | Kim ...................... H01L 27/124 257/72 |
| 2016/0118467 A1* | 4/2016 | Wang ................ H01L 29/41733 257/66 |
| 2017/0038623 A1* | 2/2017 | Lee ....................... G02F 1/1368 |

\* cited by examiner

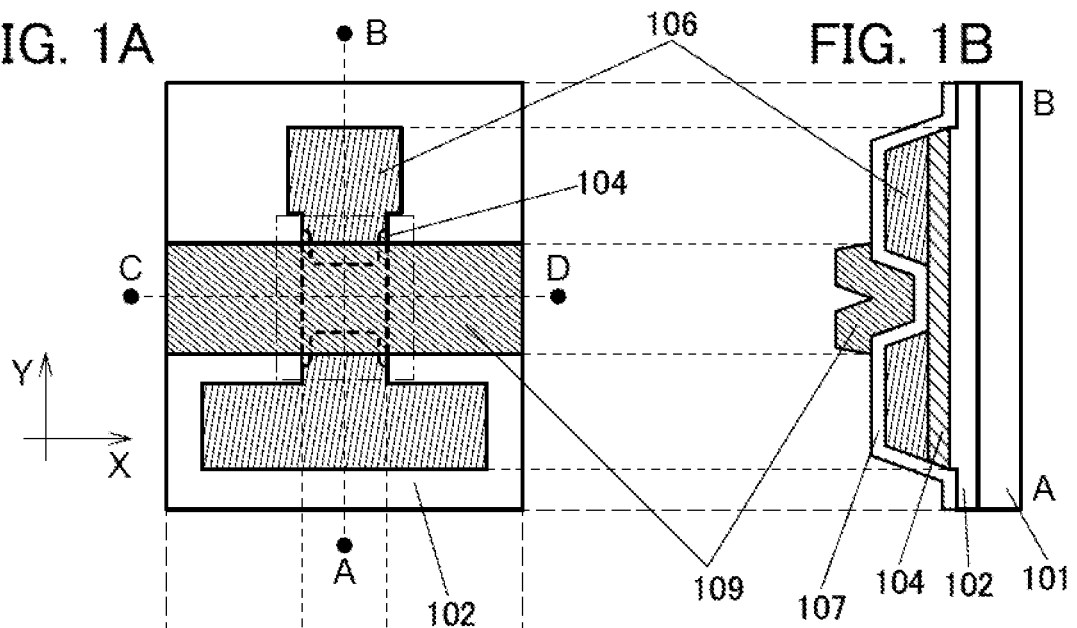
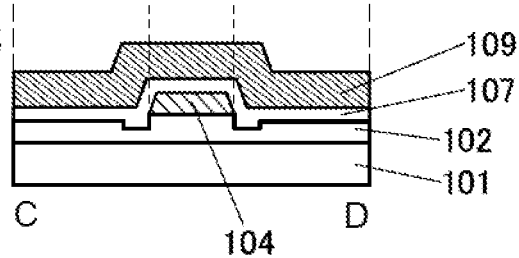
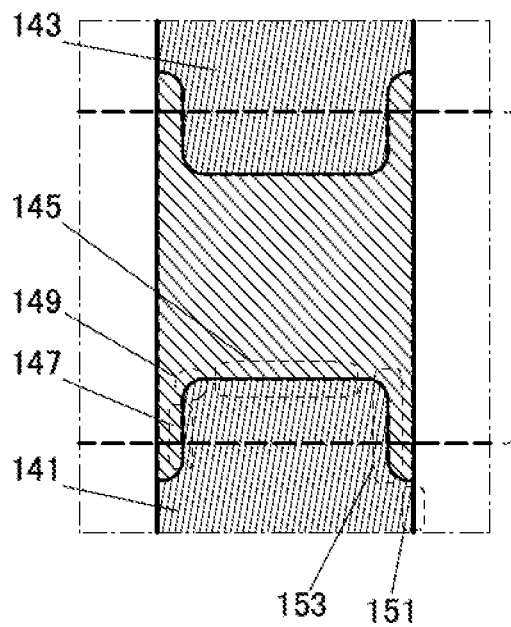
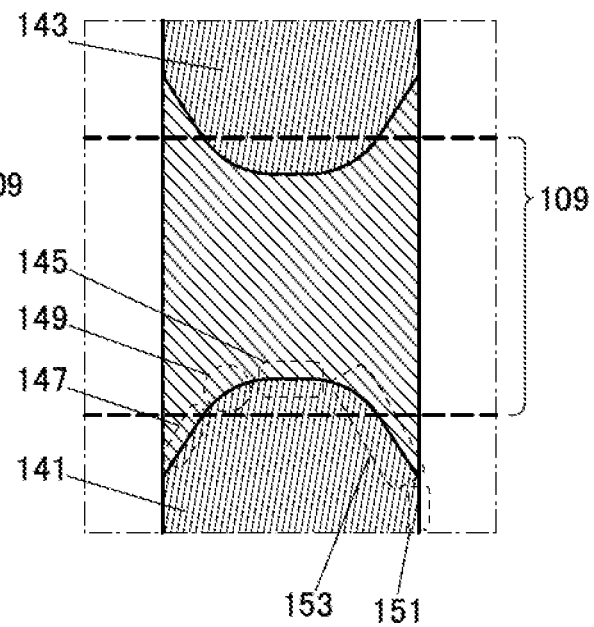

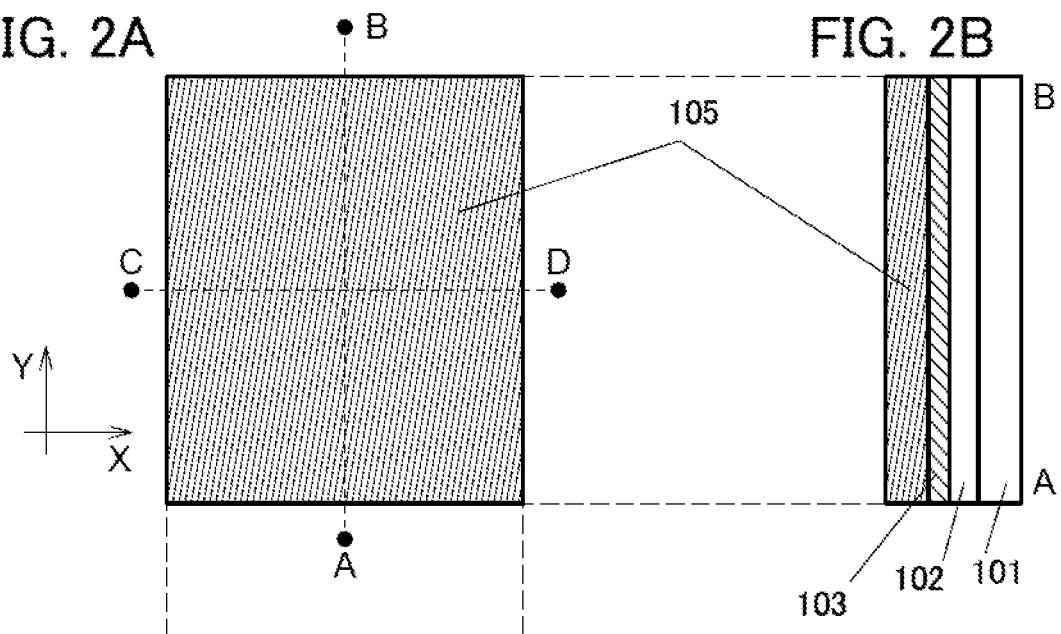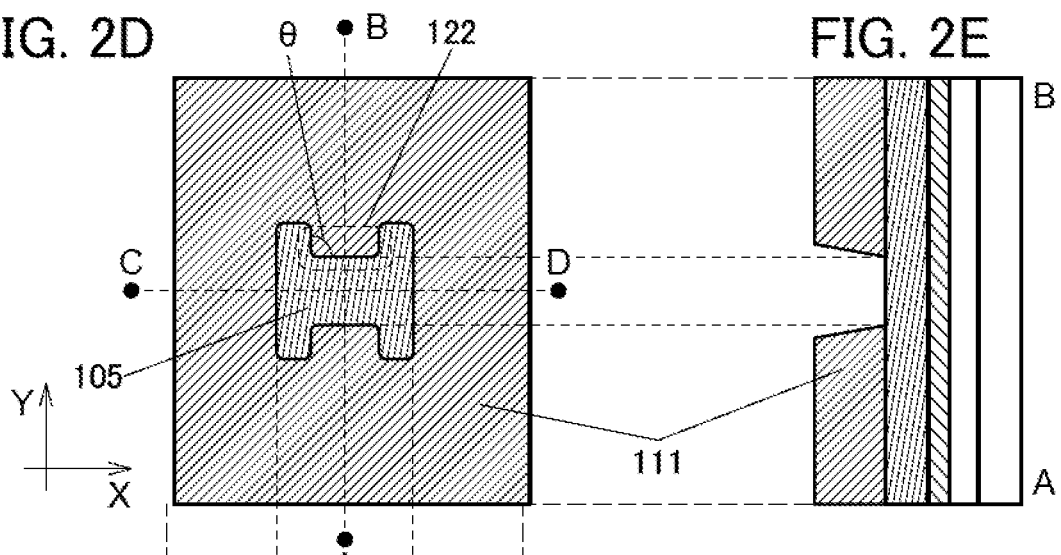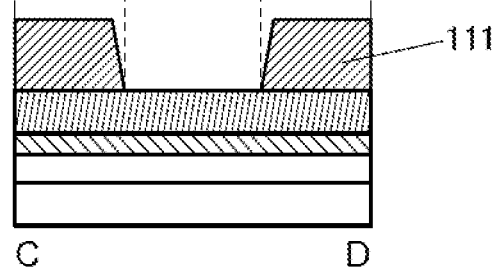

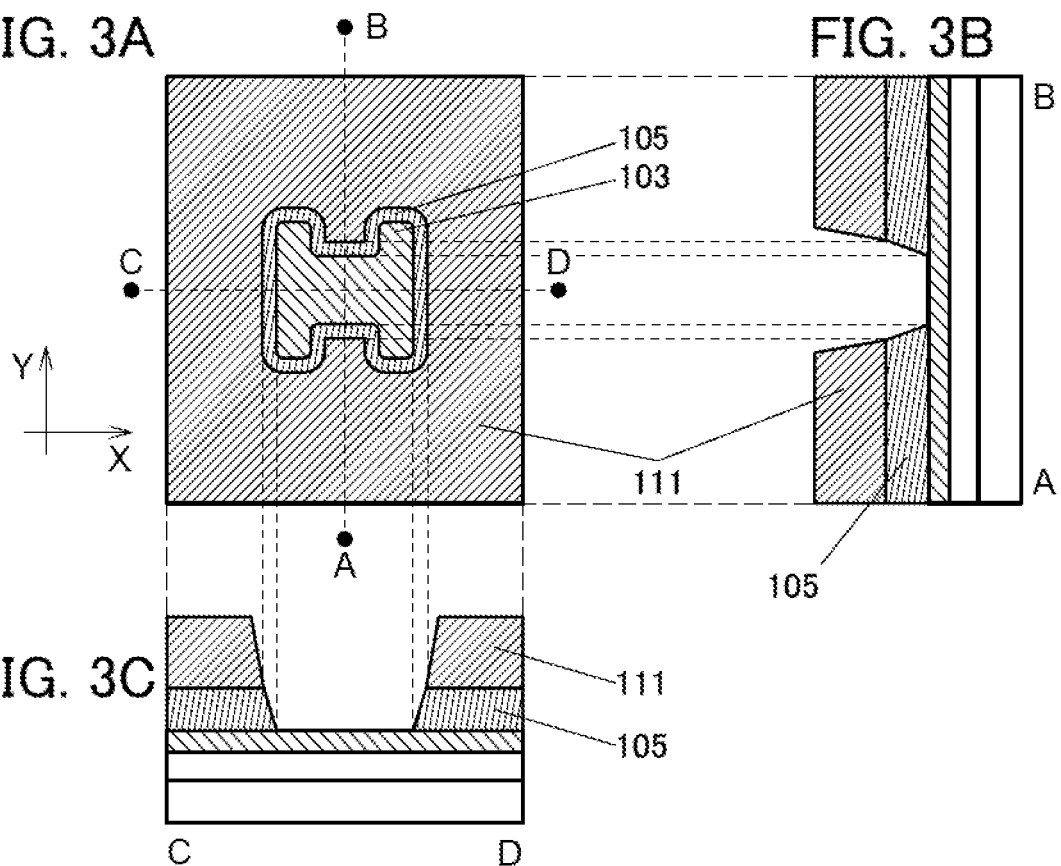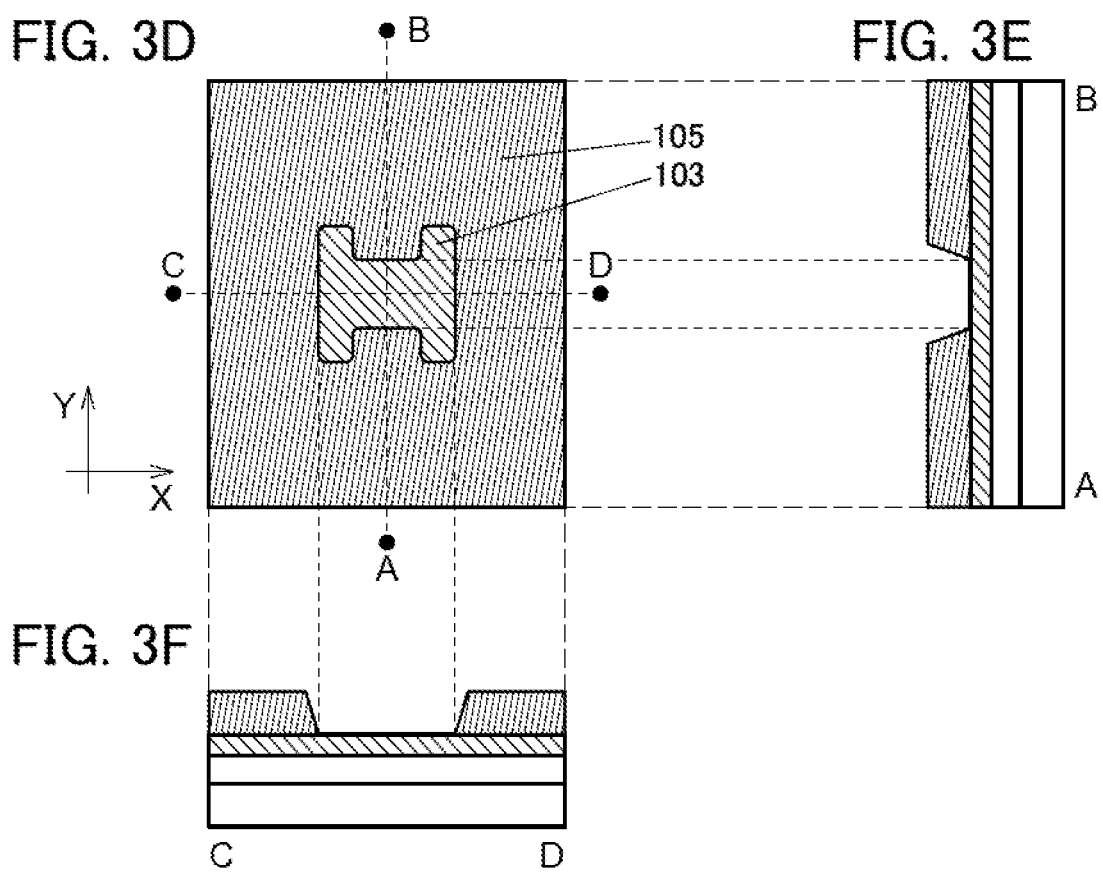

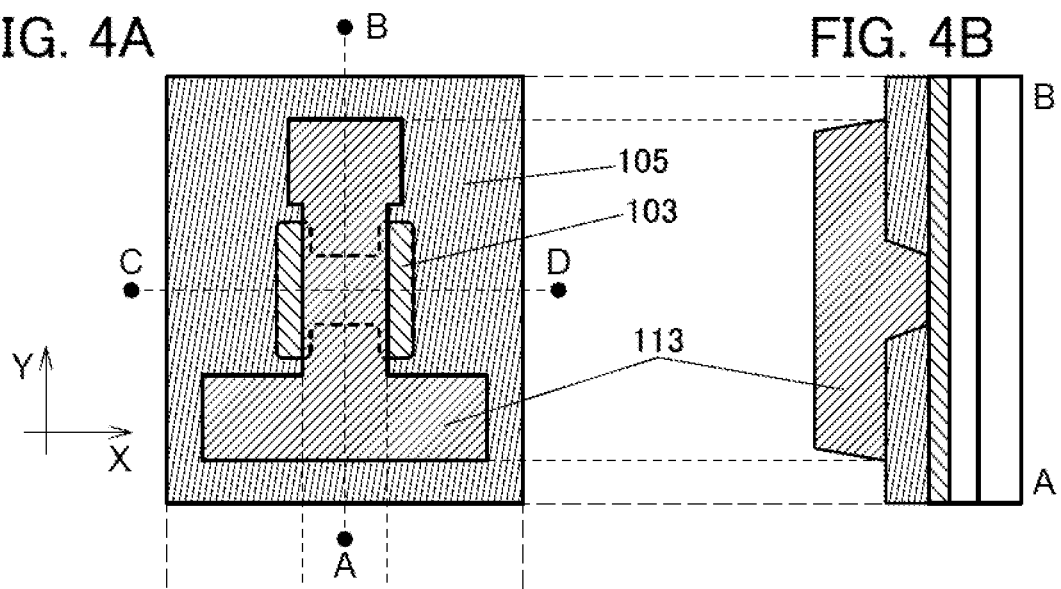
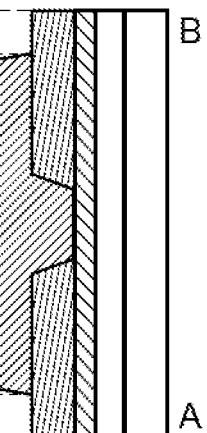
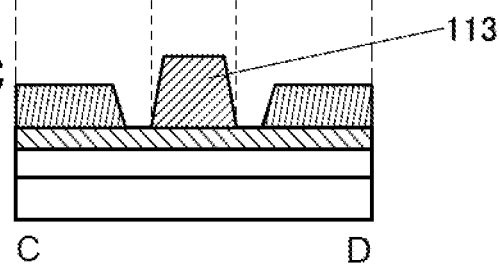
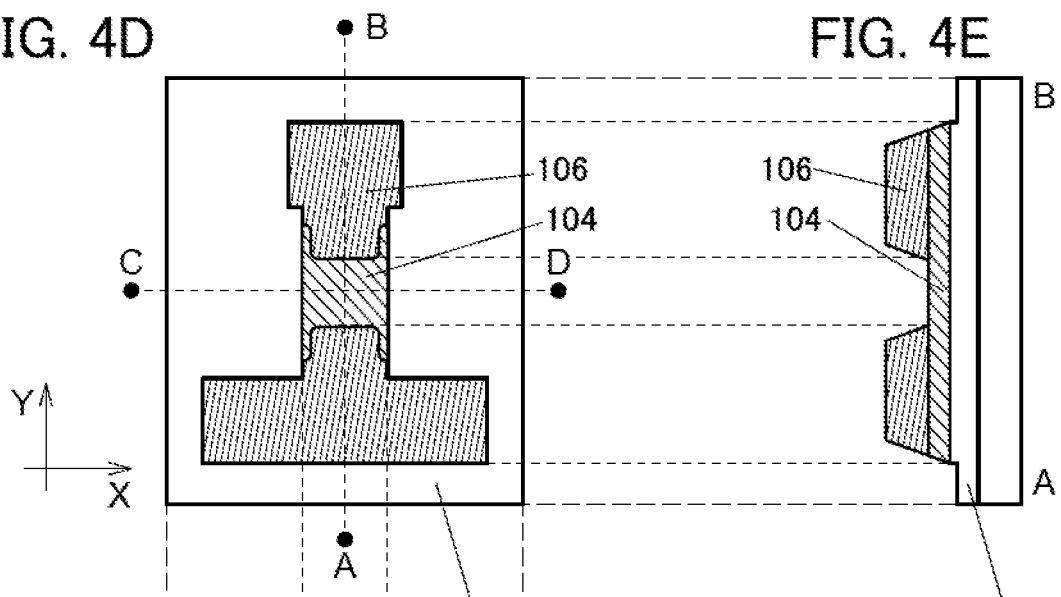
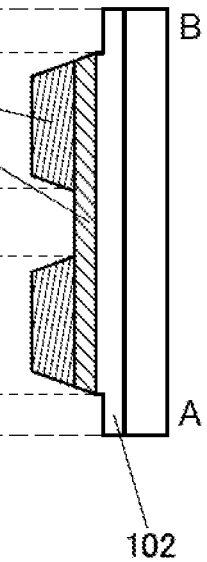
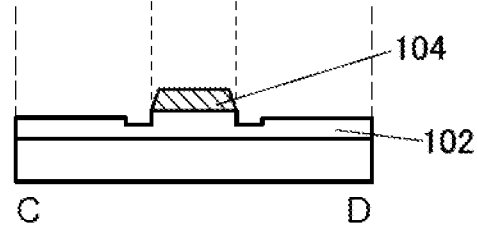

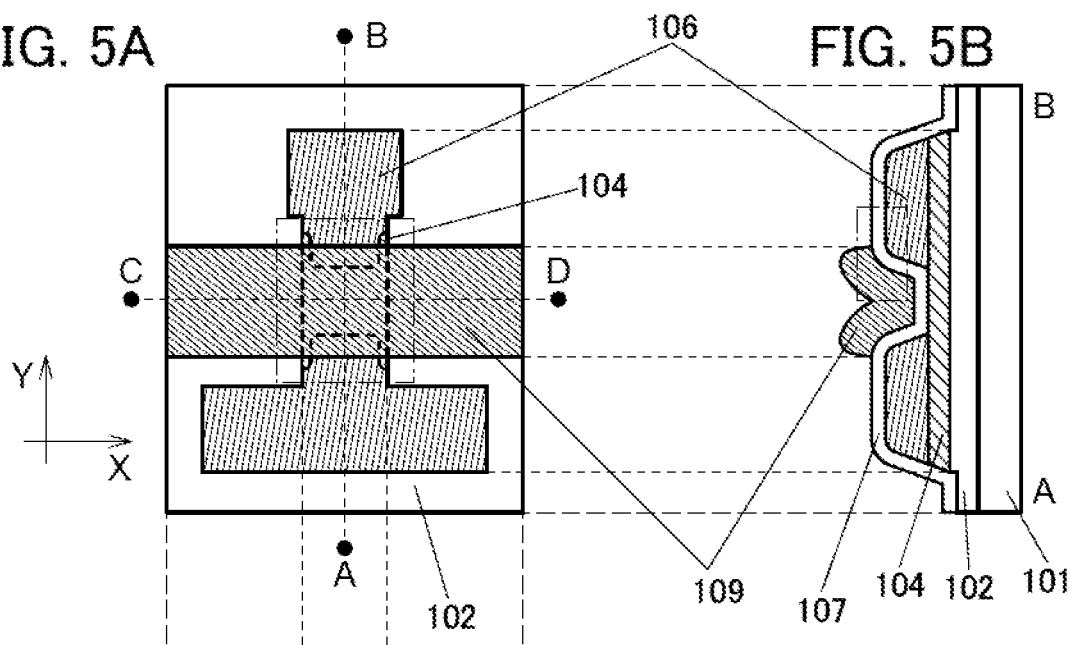
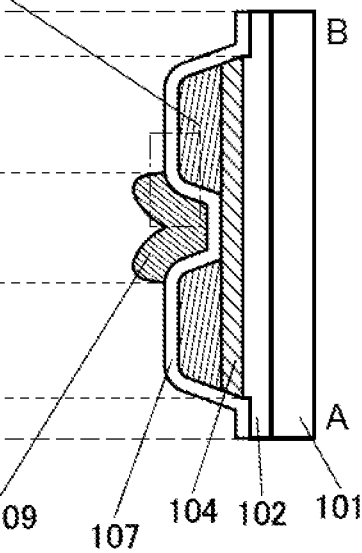
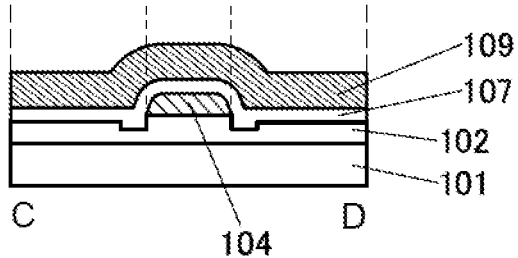
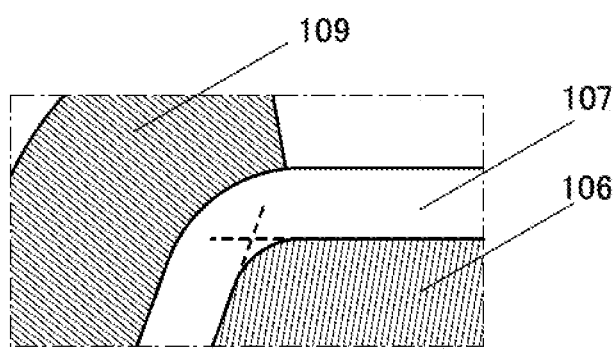
FIG. 5A
FIG. 5B
FIG. 5C
FIG. 5D

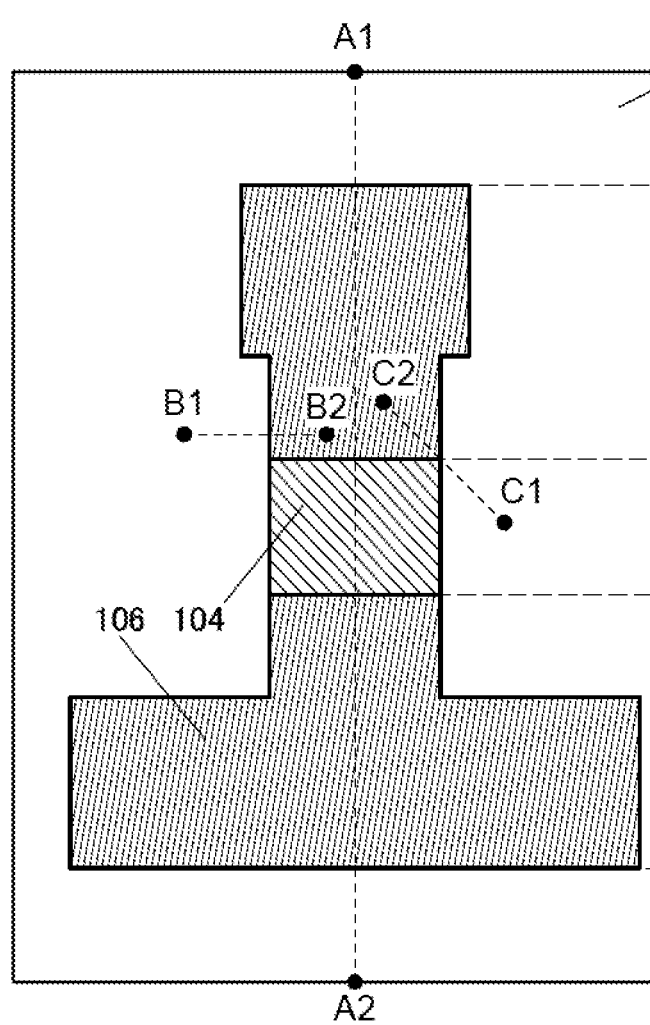
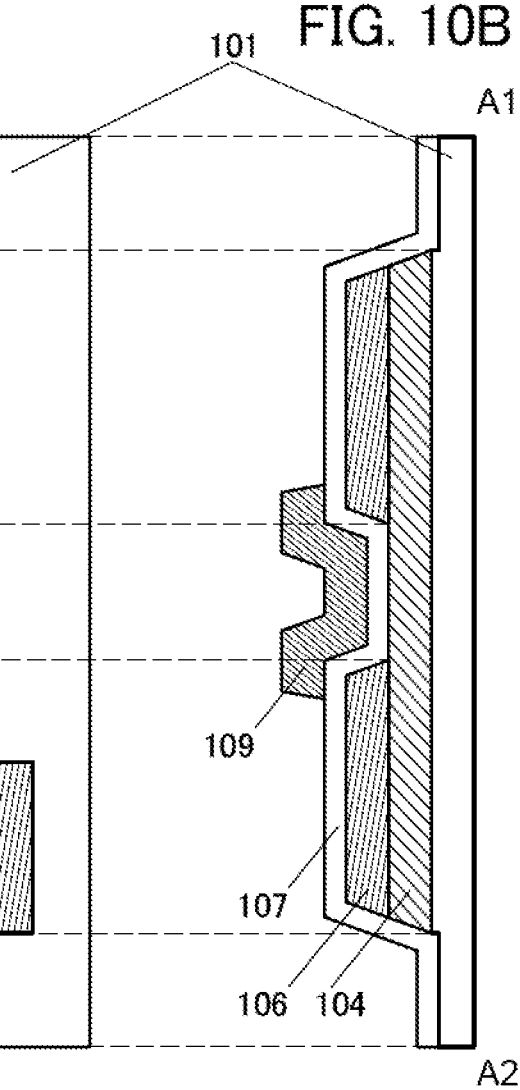
FIG. 10A  FIG. 10B
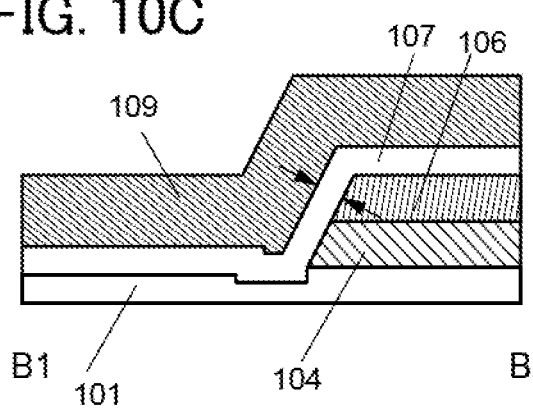
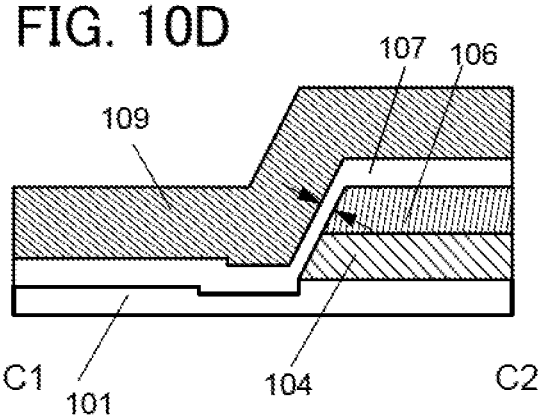
FIG. 10C  FIG. 10D

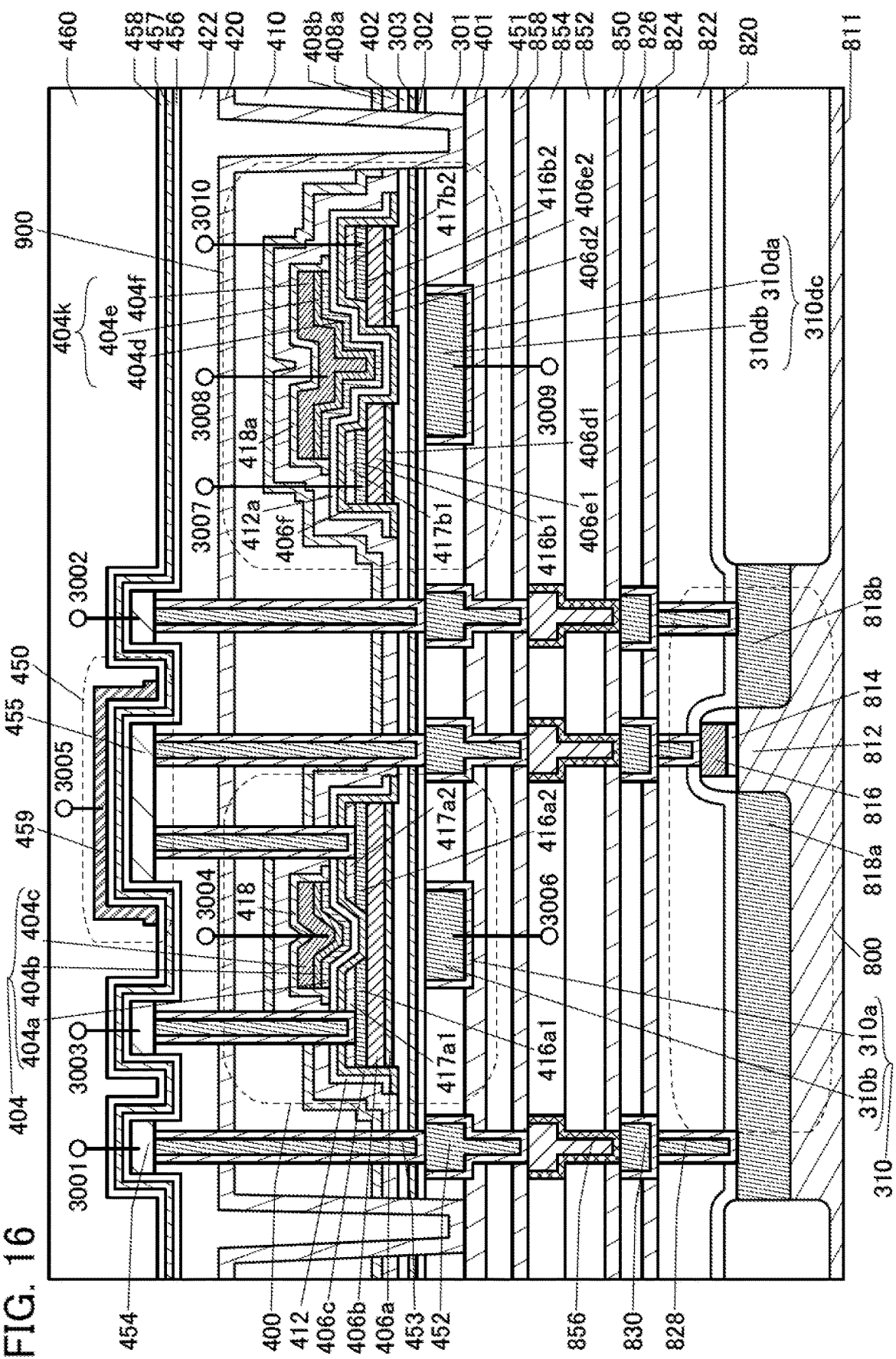

SEMICONDUCTOR DEVICE COMPRISING ROUNDED SOURCE AND DRAIN ELECTRODES

BACKGROUND OF THE INVENTION

1. Field of the Invention

The present invention relates to, for example, a transistor and a semiconductor device. The present invention relates to, for example, manufacturing methods of a transistor and a semiconductor device. The present invention relates to a display device, a light-emitting device, a lighting device, a power storage device, a memory device, a processor, or an electronic device, for example. The present invention relates to a method for manufacturing a display device, a liquid crystal display device, a light-emitting device, a memory device, or an electronic device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

A technique in which a transistor is formed using a semiconductor thin film has attracted attention. The transistor is used in a wide range of electronic devices such as an integrated circuit (IC) and an image display device (also simply referred to as a display device). A silicon-based semiconductor material is widely known as a material for a thin semiconductor film applicable to a transistor. As another material, a metal oxide material has been attracting attention.

For example, a technique in which a display device is formed using a transistor including a metal oxide (a zinc oxide or an In—Ga—Zn-based oxide) as a semiconductor layer is disclosed (see Patent Documents 1 and 2).

Furthermore, in recent years, a technique for manufacturing an integrated circuit for a memory device using a transistor including a metal oxide has been disclosed (see Patent Document 3). Furthermore, not only memory devices but also arithmetic devices and the like are manufactured using transistors including metal oxides.

A transistor including the semiconductor described above can be used as a switch and a charge retention circuit of the memory device and the display device.

REFERENCES

[Patent Document 1] Japanese Published Patent Application No. 2007-123861
[Patent Document 2] Japanese Published Patent Application No. 2007-096055
[Patent Document 3] Japanese Published Patent Application No. 2011-119674

SUMMARY OF THE INVENTION

Here, in the case of forming a transistor, when an insulating film is provided so as to cover a corner of a first conductor and a second conductor is formed so as to overlap with the corner of the first conductor with the insulating film provided therebetween, leakage current between the first conductor and the second conductor might be caused by variation in a thickness of the insulating film and concentration of electric field due to the corner of the first conductor.

An object of one embodiment of the present invention is to provide a semiconductor device with stable electrical characteristics. Another object of one embodiment of the present invention is to provide a semiconductor device including a transistor having low leakage current in an off state between a drain and a gate. Another object of one embodiment of the present invention is to provide a semiconductor device including a transistor having low leakage current in an off state between a source and a drain. Another object of one embodiment of the present invention is to provide a highly reliable semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to a semiconductor device and a manufacturing method of the semiconductor device. A thickness of an insulating film overlapping with the corners of a first conductor is equal to a thickness of an insulating film overlapping with other portions of the first conductor in an insulating film provided so as to cover the corners of the first conductor and a second conductor provided so as to overlap with the corners of the first conductor with the insulating film provided therebetween.

One embodiment of the present invention relates to a semiconductor device and a manufacturing method of the semiconductor device. A thickness of an insulating film overlapping with the corners of a first conductor is equal to a thickness of an insulating film overlapping with other portions in an insulating film provided so as to cover the corners of the first conductor having a round shape and a second conductor provided so as to overlap with the corners of the first conductor with the insulating film provided therebetween.

Another object of one embodiment of the present invention is a semiconductor device including a semiconductor layer over an insulating surface, a first conductor and a second conductor over the semiconductor layer, an insulator covering the semiconductor layer, the first conductor, and the second conductor, and a third conductor over the insulator. The semiconductor layer includes a first region, a second region, and a third region between the first region and the second region. The first conductor is located over the first region. The second conductor is located over the second region. The first conductor includes a first side surface facing the second conductor and a second side surface in contact with the first side surface. A side formed of the first side surface and the second side surface is rounded when seen from a direction perpendicular to the insulating surface. The third conductor overlaps with at least part of each of a rounded portion of the first conductor, the second conductor, and the third region of the semiconductor layer, with the insulator therebetween.

The semiconductor device described above has an angle between the first side surface and the second side surface of preferably greater than or equal to 75° and less than or equal to 150°.

The semiconductor device described above has a cross-sectional shape with an angle between the insulating surface and an side end portion of the first conductor of preferably greater than or equal to 45° and less than 90° and a cross-sectional shape with an angle between the insulating surface and an side end portion of the second conductor of preferably greater than or equal to 45° and less than 90°.

The semiconductor device described above has a thickness of the insulating film covering the rounded portion of the first conductor of preferably larger than or equal to 90% and less than or equal to 100% of a thickness of the insulating film covering the first side surface.

Another object of one embodiment of the present invention is a manufacturing method of a semiconductor device comprising the steps of forming a semiconductor film over an insulating surface, forming a first conductive film over the semiconductor film, forming a first mask comprising a first opening portion over the first conductive film, etching the first conductive film to form a second opening portion in the first conductive film, removing the first mask, and forming a second mask over the first conductive film so that the second mask overlaps with at least part of the second opening portion, and sequentially etching the first conductive film and the semiconductor film using the second mask, so that the semiconductor film is processed into an island-shaped semiconductor layer and at the same time, the first conductive film is processed into a first conductor and a second conductor. The first mask includes a first projecting portion projecting toward the inside of the first opening portion. The first conductive film includes a second projecting portion projecting toward the inside of the second opening portion. A corner of the second projecting portion has a rounded shape when seen from a direction perpendicular to the insulating surface. The rounded portion of the second projecting portion is provided over the island-shaped semiconductor layer.

The manufacturing method of a semiconductor device described above further includes the steps of forming an insulating film to cover the island-shaped semiconductor layer, the first conductor, and the second conductor, forming a second conductive film over the insulating film, and forming a third conductor to cover the rounded portion of the second projecting portion with the insulating film therebetween by processing the second conductive film.

According to one embodiment of the present invention, a semiconductor device with stable electrical characteristics can be provided. According to one embodiment of the present invention, a semiconductor device including a transistor having low leakage current between a drain and a gate in an off state can be provided. According to one embodiment of the present invention, a semiconductor device including a transistor having low leakage current between a source and a drain in an off state can be provided. According to one embodiment of the present invention, a highly reliable semiconductor device can be provided.

According to one embodiment of the present invention, the thickness of the insulating film overlapping with the corners of the conductor can be equal to that of the insulating film overlapping with the other portions of the conductor in formation of the transistor, so that a semiconductor device having an extremely low leakage current between the conductors can be provided.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF THE DRAWINGS

In the accompanying drawings:

FIGS. 1A to 1E are diagrams illustrating a semiconductor device according to one embodiment of the present invention;

FIGS. 2A to 2F illustrate a manufacturing method of a semiconductor device according to one embodiment of the present invention;

FIGS. 3A to 3F illustrate a manufacturing method of a semiconductor device according to one embodiment of the present invention;

FIGS. 4A to 4F illustrate a manufacturing method of a semiconductor device according to one embodiment of the present invention;

FIGS. 5A to 5D are diagrams illustrating a semiconductor device according to one embodiment of the present invention;

FIGS. 10A to 10D are diagrams illustrating a comparison example according to one embodiment of the present invention;

FIG. 16 is a cross-sectional view illustrating a semiconductor device according to one embodiment of the present invention;

DETAILED DESCRIPTION OF THE INVENTION

Figure 6A:
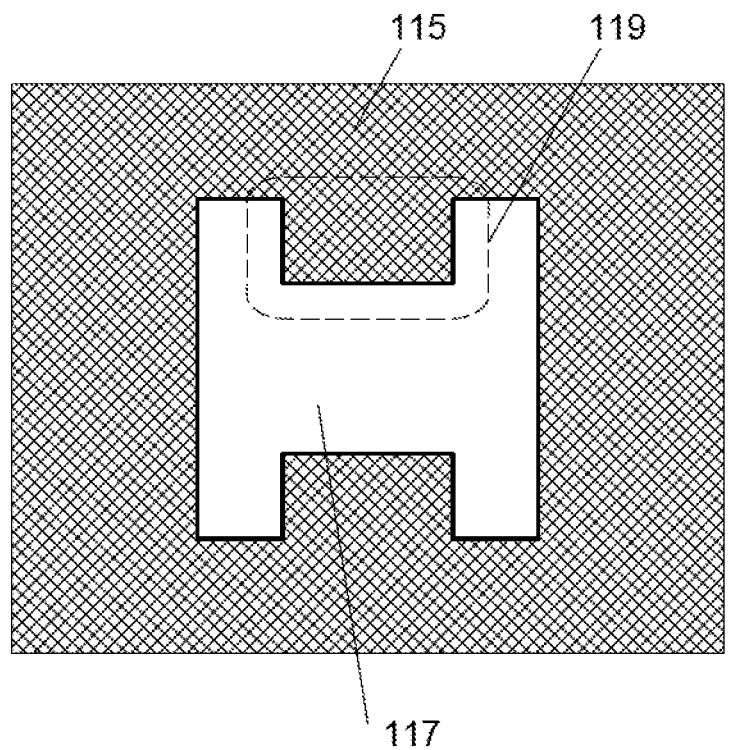
FIGS. 6A and 6B are diagrams illustrating a mask pattern according to one embodiment of the present invention.

Embodiments according to the present invention will be described in detail with reference to the accompanying drawings. However, the present invention is not limited to the description below, and it is easily understood by those skilled in the art that modes and details disclosed herein can be modified in various ways. In addition, the present invention should not be construed as being limited to the description in the embodiments given below. In describing structures of the present invention with reference to the drawings, common reference numerals are used for the same portions in different drawings. Note that the same hatched pattern is applied to similar parts, and the similar parts are not denoted by reference numerals in some cases.

A structure in one of the following embodiments can be appropriately applied to, combined with, or replaced with another structure in another embodiment, for example, and the resulting structure is also one embodiment of the present invention.

Note that the size, the thickness of films (layers), or regions in drawings is sometimes exaggerated for simplicity.

In this specification, the terms "film" and "layer" can be interchanged with each other.

A voltage usually refers to a potential difference between a given potential and a reference potential (e.g., a ground potential (GND) or a source potential). Thus, a voltage can be referred to as a potential and vice versa. Note that in general, a potential (a voltage) is relative and is determined depending on the amount relative to a certain potential. Therefore, a potential which is represented as a "ground potential" or the like is not always 0 V. For example, the lowest potential in a circuit may be represented as a "ground potential". Alternatively, a substantially intermediate potential in a circuit may be represented as a "ground potential". In these cases, a positive potential and a negative potential are set using the potential as a reference.

Note that the ordinal numbers such as "first" and "second" in this specification are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which specify one embodiment of the present invention in some cases.

Note that a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when the conductivity is sufficiently high, for example. Furthermore, a "semiconductor" and a "conductor" cannot be strictly distinguished from each other in some cases because the border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor. For example, an element with a concentration of lower than 0.1 atomic % is regarded as an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the semiconductor; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is a silicon layer, examples of an impurity which changes characteristics of the semiconductor include oxygen, Group 1 elements except hydrogen, Group 2 elements, Group 13 elements, and Group 15 elements.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of the transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

Note that the proportion of oxygen in silicon oxynitride in this specification and the like is higher than that of nitrogen. The concentration range of oxygen, nitrogen, silicon, and hydrogen is preferably from 55 atomic % to 65 atomic %, 1 atomic % to 20 atomic %, 25 atomic % to 35 atomic %, and 0.1 atomic % to 10 atomic %, respectively. In addition, the proportion of nitrogen in silicon nitride oxide is higher than that of oxygen. The concentration range of nitrogen, oxygen, silicon, and hydrogen is preferably from 55 atomic % to 65 atomic %, 1 atomic % to 20 atomic %, 25 atomic % to 35 atomic %, and 0.1 atomic % to 10 atomic %, respectively.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

Embodiment 1

A transistor in this embodiment is shown in FIGS. 1A, 1B, and 1C. FIG. 1A is a top view of the transistor. FIG. 1B is a cross-sectional view in which a cross section A-B of FIG. 1A is viewed from an X direction. FIG. 1C is a cross-sectional view in which a cross-section C-D of FIG. 1A is viewed from a Y direction. An insulating film 102 is provided over a substrate 101 and an island-shaped semiconductor layer 104 is provided over the insulating film 102. A pair of conductors 106 is provided over the semiconductor layer 104. One of the conductors can serve as one of a source electrode and a drain electrode. Furthermore, the other of the conductors can serve as the other of the source electrode and the drain electrode. Furthermore, the source electrode and the drain electrode can be referred to as a write bit line (WBL) and a floating node (FN) in consideration of their functions.

An insulating film 107 is provided so as to cover the semiconductor layer 104 and the conductors 106 and furthermore, a gate electrode 109 is provided over the insulating film 107. The insulating film 107 serves as a gate insulating film. The gate electrode 109 covers part of the conductors 106 with the insulating film 107 provided therebetween. The conductors 106 have corners over the semiconductor layer 104 and the corners are covered by the gate electrode 109 with the insulating film 107 provided therebetween. The corners in this embodiment are curved, in other words, rounded. Thus, the variations in thickness of the insulating film 107 that covers the corners of the conductors 106 and thickness of the insulating film 107 that covers portions other than the corners of the conductors 106 can be reduced. In particular, reduction in thickness of the insulating film 107 that covers the corners of the conductors 106 can be prevented. Thus, the distance between the conductors 106 and the gate electrode 109 located over the insulating film 107 can be prevented from becoming partially shortened. Therefore, leakage current between the conductors 106 and the gate electrode 109 can be reduced. Furthermore, the corners of the conductors 106 are rounded, so that defects in the device due to electric field concentration can be reduced.

Here, the corners used in this embodiment are described. FIG. 1D is an enlarged view of a portion surrounded by a dashed-dotted line in FIG. 1A. Note that the gate electrode 109 is indicated by a dotted line for easy viewing of the details of the conductors in FIG. 1D. Furthermore, one of the conductors 106 is referred to as a conductor 141 and the other of the conductors 106 is referred to as a conductor 143. In FIG. 1D, the side surface of the conductor 141 facing the conductor 143 is referred to as a side surface 145 and a side surface in contact with the side surface 145 is referred to as a side surface 147. The sides formed of the side surface 145 and the side surface 147 are referred to as a corner and are shown as a corner 149 in FIG. 1D. The corner 149 is curved, in other words, is rounded.

Furthermore, the conductor 141 includes a side surface 151 which overlaps with the side surface of the semiconductor layer 104. A side surface 153 is provided between the side surface 151 and the side surface 145. The side surface 153 is curved, in other words, is rounded.

FIG. 1E shows a conductor having a different shape from that in FIG. 1D. Although details are described later, FIG. 1E corresponds to a transistor shown in FIG. 7F. Also in FIG. 1E, the curved, in other words, rounded corner 149 and the curved, in other words, rounded side surface 153 are included.

In the above manner, the corner 149 of the conductor 141 is rounded and is covered with the gate electrode 109 with the insulating film 107 provided therebetween. Furthermore, the side surface 147 has a curved portion and part of the curved portion is covered with the gate electrode 109 with the insulating film 107 provided therebetween.

Thus, a semiconductor device with stable electrical characteristics can be provided. Furthermore, the semiconductor device including the transistor having low leakage current between the drain and the gate in an off state can be provided. Furthermore, the semiconductor device including the transistor having low leakage current between the source and the drain in an off state can be provided. A highly reliable semiconductor device can be provided.

Next, the manufacturing method of the transistor of this embodiment will be shown with reference to FIGS. 2A to 2F to FIGS. 8A to 8F.

The semiconductor film is formed over the insulating surface. The insulating surface can be a surface of an insulating film formed over a substrate or a surface of a substrate having an insulating property. Furthermore, in the case where the transistor of this invention has a back gate structure including a gate electrode below the semiconductor layer, a semiconductor film is formed over the gate insulating film formed over the gate electrode.

The insulating film 102 is formed over the substrate 101 and a semiconductor film 103 is formed over the insulating film 102 as illustrated in FIGS. 2A, 2B, and 2C in this embodiment. Note that FIG. 2B is a cross-sectional view in which a cross-section A-B of FIG. 2A is viewed from the X direction. FIG. 2C is a cross-sectional view in which a cross-section C-D of FIG. 2A is viewed from the Y direction. Note that after the transistor is formed, the X direction is referred to as a channel width direction of the transistor and the Y direction is referred to as a channel length direction of the transistor in FIGS. 2A to 2F. Furthermore, a conductive film 105 serving as the source electrode and the drain electrode is formed over the semiconductor film 103. In order to simply describe this embodiment of the present invention, the insulating film 102, the semiconductor film 103, and the conductive film 105 are each shown as a single layer in FIGS. 2A to 2F to FIGS. 4A to 4F; however, one embodiment of the present invention is not limited to this. The insulating film 102, the semiconductor film 103, and the conductive film 105 can each be formed with a multilayer film including two or more layers.

Although details are described later, as the substrate which can be used in this embodiment, an insulator substrate, a semiconductor substrate, or a conductor substrate can be given, for example. Furthermore, although details are described later, as the insulating film which can be used in this embodiment, a single layer or a stacked layer including two or more kinds of materials selected from silicon oxide film, silicon oxynitride film, silicon nitride oxide film, silicon nitride film, aluminum oxide, aluminum nitride, hafnium oxide, and hafnium nitride can be given, for example. The insulating film can be formed using a plasma CVD method, a sputtering method, an ALD method, and the like. Although details are described later, as the materials of the semiconductor film which can be used in this embodiment of the present invention, silicon and metal oxide can be given, for example.

Furthermore, although details are described later, as the conductive film which can be used in this embodiment, a single layer or a stacked layer including two or more layers is formed using a material containing one or more of metal elements selected from aluminum, chromium, copper, silver, gold, platinum, tantalum, nickel, titanium, molybdenum, tungsten, hafnium, vanadium niobium, manganese, magnesium, zirconium, beryllium, and indium, for example. Note that when using the stacked-layer structure of two or more layers, each layer is preferably formed using a material containing different metal elements. Furthermore, the stacked-layer structure may be formed using materials with different content percentages of a metal element. Furthermore, when using a stacked-layer structure of three or more layers, materials containing different metal elements may be sandwiched between materials containing the same metal elements.

A mask 111 including an opening portion is formed over the conductive film 105 as shown in FIGS. 2D, 2E, and 2F. Note that FIG. 2E is a cross-sectional view in which a cross-section A-B of FIG. 2D is viewed from a X direction. Note that FIG. 2F is a cross-sectional view in which a cross-section C-D of FIG. 2D is viewed from a Y direction. The mask 111 includes a projecting portion 122 projecting along the Y direction in the opening portion. Furthermore, at least the corner of the projecting portion 122 is curved, in other words, is rounded. A photolithography method having a photosensitive resist irradiated with light using a photomask and a direct writing method using electron beam and ion beam can be used for forming the mask 111.

When using the photolithography method, a photomask is necessary for forming the mask 111. In contrast, a photomask is not necessary when the direct writing method is used because a design data of the mask 111 can be directly written on the resist.

Figure 6B:
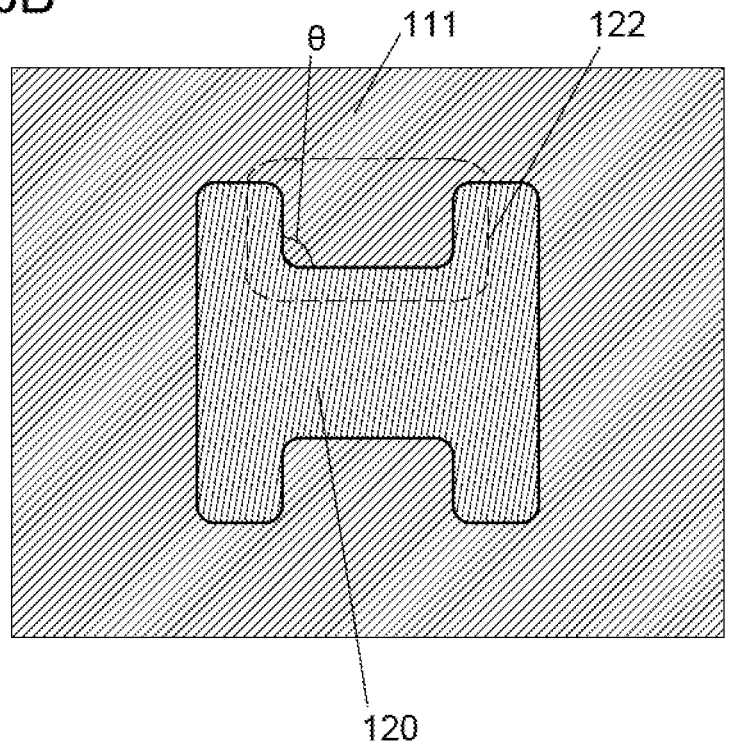

In the case where the mask 111 is formed using the photolithography method, the corners of a projecting portion 119 provided in an opening portion 117 of a photomask 115 corresponding to the corners of the projecting portion 122 provided in an opening portion 120 of the mask 111 may be sharp as illustrated in FIG. 6A. The mask 111 is formed by the photolithography method with the use of the photomask 115 the projecting portion 119 of which has sharp corners, so that the mask 111 the projecting portion 122 of which has rounded corners is formed as illustrated in FIG. 6B.

Furthermore, in the case where the mask 111 is formed using the direct writing method, the corners of the projecting portion of the opening portion may be sharp in the design data of the mask 111. By forming the mask 111 on the basis of the design data, the mask 111 the projecting portion 122 of which has rounded corners is formed as illustrated in FIG. 6B.

The conductive film 105 is etched by using the mask 111, an opening portion is formed, and part of the semiconductor film 103 is exposed as illustrated in FIGS. 3A, 3B, and 3C. Note that FIG. 3B is a cross-sectional view in which a cross-section A-B of FIG. 3A is viewed from a X direction. FIG. 3C is a cross-sectional view in which a cross-section C-D of FIG. 3A is viewed from a Y direction. Here, by using the mask 111 in this embodiment of the present invention, the conductive film 105 has a projecting portion projecting toward the opening portion. Furthermore, the conductive film 105 with a rounded corner of the projecting portion may be formed. The mask 111 is removed after the conductive film 105 is formed (see FIGS. 3D, 3E, and 3F. FIG. 3E is a cross-sectional view in which a cross-section A-B of FIG. 3D is viewed from the X direction. FIG. 3F is a cross-sectional view in which the cross-section C-D of FIG. 3D is viewed from the Y direction).

Furthermore, the side surface of the side where the conductive films 105 face each other preferably has a taper angle of less than 90°. The angle formed between the side surface and the bottom surface of the side where the conductive films 105 face each other is preferably more than or equal to 45° and less than 90°, more preferably more than or equal to 45° and less than or equal to 75°. By forming the conductive film 105 in this manner, the insulating film 107 can be formed with good coverage even in a step portion formed by the conductive film 105.

A mask 113 is formed after the mask 111 is removed as illustrated in FIGS. 4A, 4B, and 4C. Note that FIG. 4B is a cross-sectional view in which a cross-section A-B of FIG. 4A is viewed from the X direction. Note that FIG. 4C is a cross-sectional view in which the cross-section C-D of FIG. 4A is viewed from the Y direction. The conductive film 105 and the semiconductor film 103 are etched using the mask 113 (see FIGS. 4D, 4E, and 4F. Note that FIG. 4E is a cross-sectional view in which a cross-section A-B of FIG. 4D is viewed from the X direction. Note that FIG. 4F is a cross-sectional view in which the cross-section C-D of FIG. 4D is viewed from the Y direction).

When the conductive film 105 is etched, in the case where the semiconductor film 103 is etched under the etching conditions of the conductive film 105, the semiconductor film 103 in the region where the conductive film 105 does not overlap with the semiconductor film 103 is etched earlier than the semiconductor film 103 in the region where the conductive film 105 overlaps with the semiconductor film 103, so that the insulating film 102 serving as the base is exposed. The exposed insulating film 102 is etched during the etching of the conductive film 105 or during the etching of the semiconductor film 103 overlapped with the conductive film 105 and located under the conductive film 105. As a result, the insulating film 102 has a region with different thicknesses as shown in FIG. 4F. In contrast, in the case where the semiconductor film 103 is not etched in the etching conditions of the conductive film 105 or in the case where the etching rate of the semiconductor film 103 is lower than the etching rate of the conductive film 105, the insulating film 102 is not exposed during the etching of the conductive film 105 and thus, a region with different thicknesses in the insulating film 102 is not formed.

Through the above process, the island-shaped semiconductor layer 104 and the pair of conductors 106 over the island-shaped semiconductor layer 104 are formed. One of the pair of conductors 106 serves as part of a write bit line (WBL) and the other of the conductors 106 serves as a floating node (FN). A projecting portion of the conductor 106 with a rounded corner is formed so as to overlap with the island-shaped semiconductor layer 104.

Furthermore, the side surface of the conductor 106 preferably has a taper angle of less than 90°. The angle formed between the side surface and the bottom surface of the conductor 106 is more than or equal to 45° and less than 90°, more preferably more than or equal to 45° and less than or equal to 75°. By forming the conductor 106 in this manner, the insulating film 107 can be formed with good coverage even in a step portion formed by the conductor 106. Note that the angle formed between the side surface of the side where the conductors 106 face each other and the angle of the other side surfaces of the conductors 106 may be the same or different.

Although an example of etching the conductive film 105 and the semiconductor film 103 using the mask 113 in FIG. 4A after etching the conductive film 105 using the mask 111 in FIG. 2D is described in this embodiment, one embodiment of the present invention is not limited thereto. The conductive film 105 can be etched using the mask 111 after the conductive film 105 and the semiconductor film 103 are etched using the mask 113. The conductor 106 with a rounded corner can be formed even in this order.

Although the conductive film 105 and the semiconductor film 103 are processed after the conductive film 105 is formed over the semiconductor film 103 in this embodiment, one embodiment of the present invention is not limited thereto. The semiconductor film 103 can be processed using the mask 113 after the semiconductor film 103 is formed so that the island-shaped semiconductor layer 104 is formed. Then, the conductive film 105 can be processed after the conductive film 105 is formed so as to cover the island-shaped semiconductor layer 104. In this case, the pair of conductors 106 obtained from the processing of the conductive film 105 can be provided so as to cover part of the side surface of the semiconductor layer 104 or only over the semiconductor layer 104.

Then, the insulating film 107 is formed so as to cover the island-shaped semiconductor layer 104 and the conductor 106. The insulating film 107 may be a single layer or a multilayer. For example, a stack including a first layer formed using an oxide containing indium, gallium, and zinc and gallium oxide and a second layer formed using a silicon oxide film or a silicon oxynitride film can be used.

The conductor 106 has a rounded corner, so that the insulating film 107 has good coverage. Thus, the insulating film 107 overlapping with the corner of the conductor 106 is not extremely thinned, so that leakage current between the gate electrode and the conductor can be reduced. The thickness of the insulating film 107 overlapping with the corner of the conductor 106 is preferably more than or equal to 80% and less than or equal to 100%, more preferably more than or equal to 90% and less than or equal to 100% of the thickness of the insulating film 107 over the conductor 106 or the insulating film 107 overlapping with the side end portions of the conductor 106 except the corners.

Next, the gate electrode 109 is formed over the insulating film 107. The gate electrode 109 is provided so as to partly overlap with the conductor 106. In particular, even when the gate electrode 109 is provided so as to overlap with the corner of the conductor 106, leakage current between the gate electrode 109 and the conductor 106 can be reduced because the insulating film overlapping with the corner has good coverage. Through the above-described steps, the transistor illustrated in FIGS. 1A, 1B, and 1C can be fabricated.

Through the above steps, a semiconductor device including a transistor having stable electrical characteristics can be manufactured. In particular, a semiconductor device including a transistor having low leakage current between the drain and the gate and between the source and the drain in an off state can be manufactured.

Note that the cross section of the conductor 106, the semiconductor layer 104, or the gate electrode 109 may include a curved surface between the side surface and the top surface depending on the mask used for processing the conductive film 105, the semiconductor film 103, and the gate electrode 109 and depending on the processing conditions such as etching conditions as shown in FIGS. 5A to 5D. Thus, the end portion of the side surface and the end portion of the top surface are curved in some cases (hereinafter also referred to as a rounded shape).

FIG. 5D is an enlarged view of a portion surrounded by a dashed-dotted line of the cross section of the transistor in FIG. 5B. An extension line which is extended in a horizontal direction of the top surface of the conductor 106 and an extension line which is extended of the side surface of the conductor 106 are shown in a dotted line. The end portion of the side surface of the conductor 106 and the end portion of the top surface of the conductor 106 are provided inside the region surrounded by the extension lines. In this specification, such a state is expressed as "the conductor 106 including a curved surface", "the conductor 106 is curved", or "the conductor 106 is a rounded shape". Note that not only the conductor 106 but also the semiconductor layer 104 and the gate electrode 109 can be defined as a curved surface in the same way.

By having a cross sectional shape including a curved surface between the side surface and the top surface in at least one of the conductor 106, the semiconductor layer 104, and the gate electrode 109, coverage with the films formed later in the manufacturing process can be improved.

Although FIGS. 1A to 1E to FIGS. 5A to 5D show an example in which the angle θ of the corner in the projecting portion of the mask 111 is 90°, this embodiment is not limited thereto. The mask 111 formed over a film to be processed includes a projecting portion and the corner is preferably rounded so that the angle θ of the corner can be more than or equal to 75° and less than or equal to 150°, more preferably more than or equal to 85° and less than or equal to 130°. An example of the angle θ of the corner of the projecting portion which is approximately 120° is shown in FIGS. 7A to 7F.

Figure 7A:
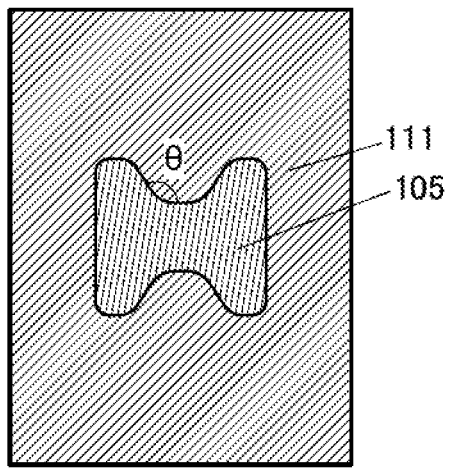
FIGS. 7A to 7F are top views illustrating a manufacturing method of a semiconductor device according to one embodiment of the present invention.
Figure 7B:
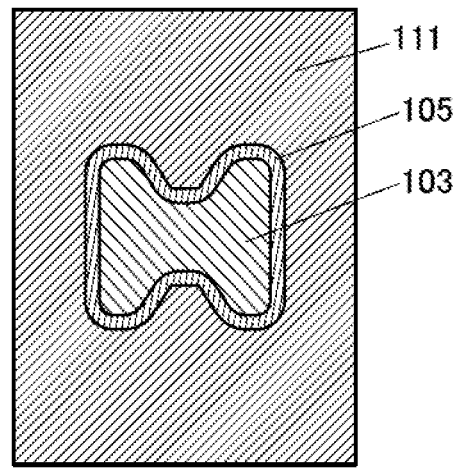
Figure 7C:
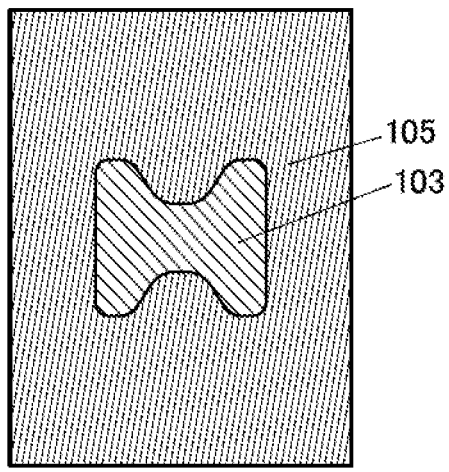
Figure 7D:
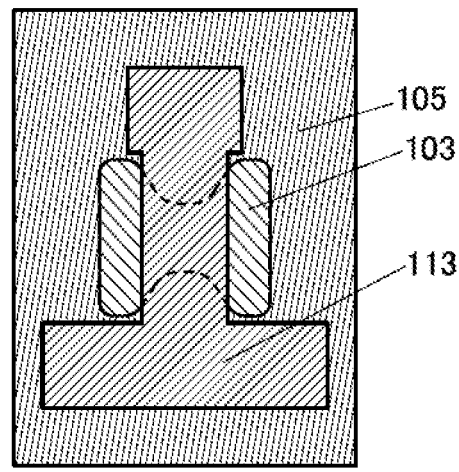
Figure 7E:
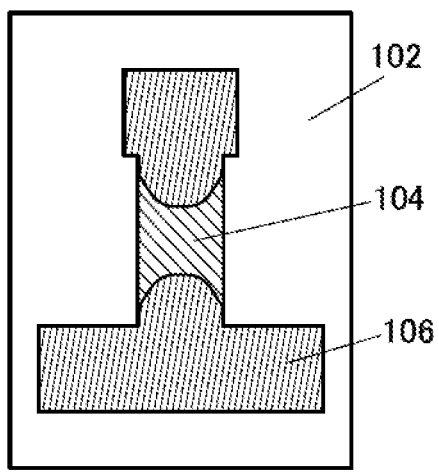
Figure 7F:
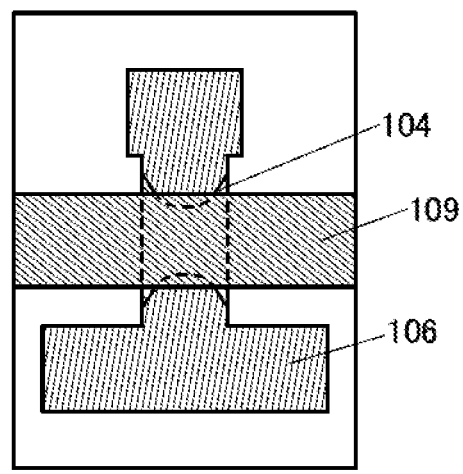

FIG. 7A corresponds to FIG. 2D. FIG. 7B corresponds to FIG. 3A. FIG. 7C corresponds to FIG. 3D. FIG. 7D corresponds to FIG. 4A. FIG. 7E corresponds to FIG. 4D. FIG. 7F corresponds to FIG. 1A.

Figure 8A:
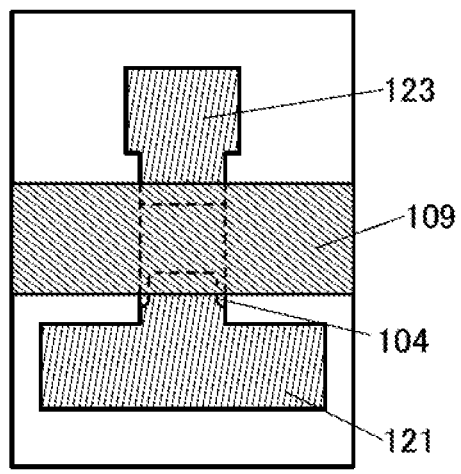
FIGS. 8A to 8F are diagrams illustrating a semiconductor device according to one embodiment of the present invention.
Figure 8B:
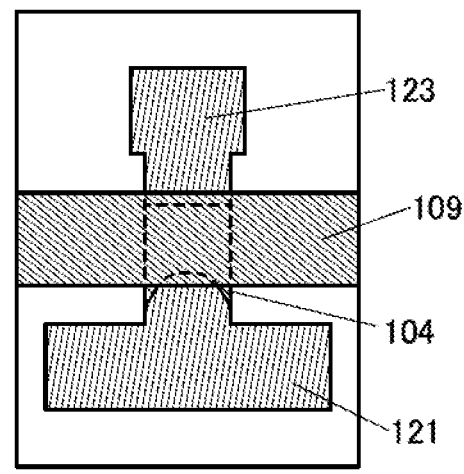

Furthermore, the structure having the projecting portion provided in the conductor and having the rounded corners is not necessarily employed in both of the source and the drain. As shown in FIGS. 8A and 8B, one of the source and the drain has the structure described above, so that the problem of leakage current can be solved in some cases. Although described in an embodiment below, in the case where the transistor of this embodiment is used as a memory element, a projecting portion is provided only in the conductor 121 of the floating node which is an electrode on the capacitor side so that the corner is rounded. The projecting portion is provided in at least the conductor 121 of the floating node and the corner is rounded, so that leakage current of the electric charge held in the capacitor is prevented. With such a memory device, stored data can be held for a long time even without power supply.

Figure 8C:
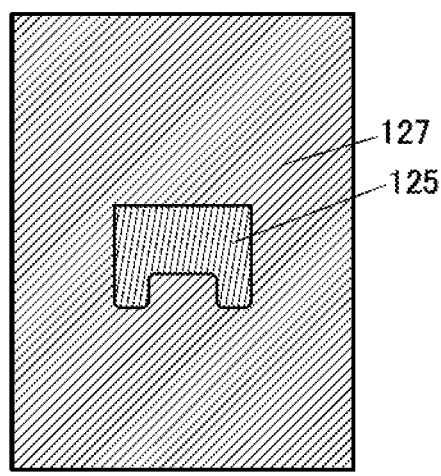
Figure 8D:
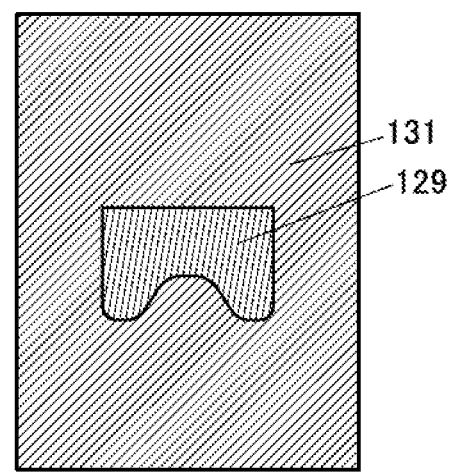
Figure 8E:
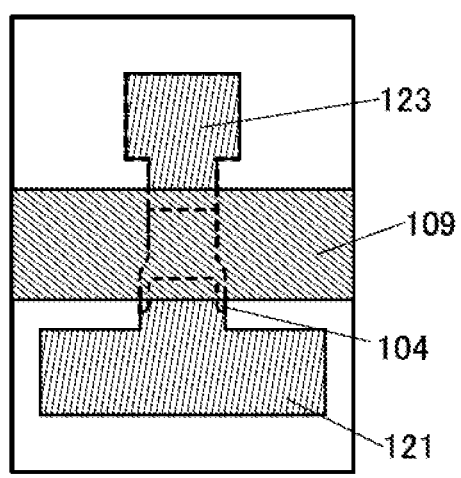
Figure 8F:
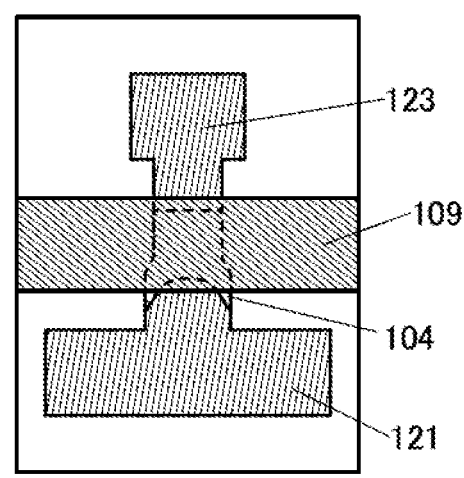

To manufacture the transistor shown in FIG. 8A, the conductor 121 and a conductor 123 are formed using a mask 127 including an opening portion 125 as shown in FIG. 8C. To manufacture the transistor shown in FIG. 8B, the conductor 121 and the conductor 123 are formed using a mask 131 including an opening portion 129 as shown in FIG. 8D.

Furthermore, to control the channel width which is one of the parameters for determining the characteristics of the transistor, the width of the conductor 123 may be adjusted as appropriate. The width of the conductor 123 which overlaps with the gate electrode is reduced in FIGS. 8E and 8F.

Figure 9A:
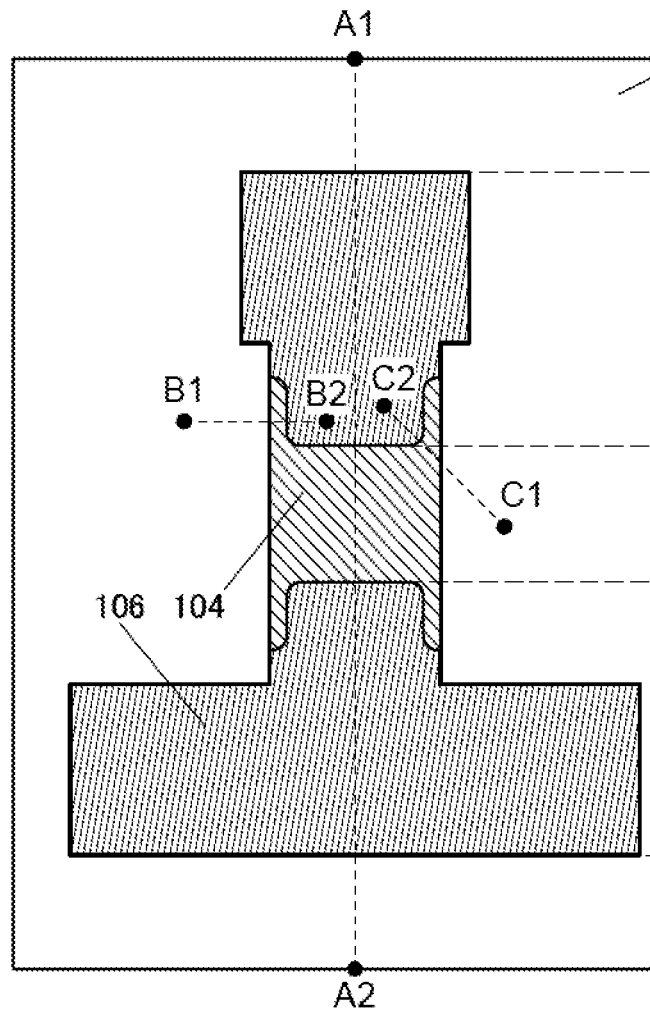
FIGS. 9A to 9D are diagrams illustrating a semiconductor device according to one embodiment of the present invention.
Figure 9B:
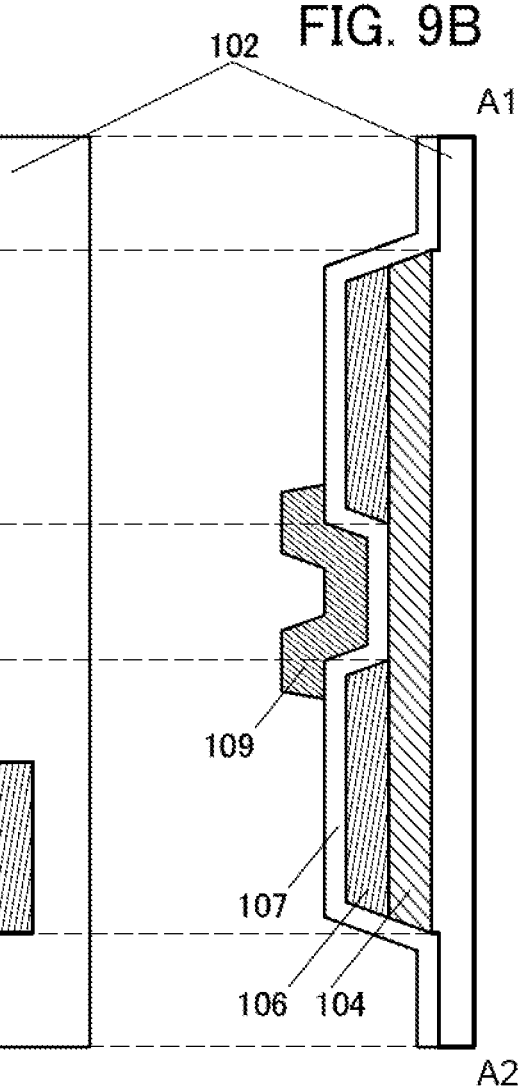
Figure 9C:
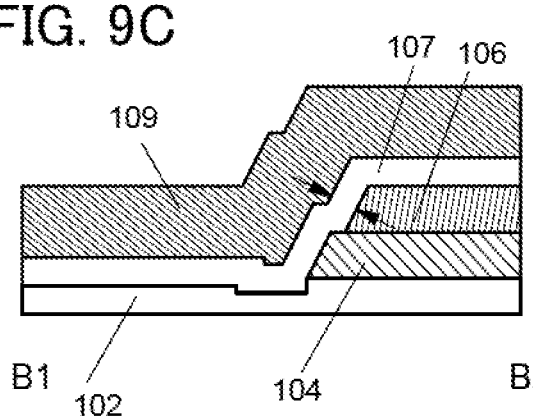
Figure 9D:
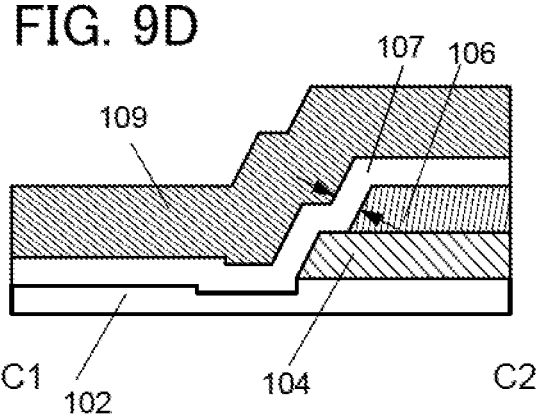

FIGS. 9A to 9D illustrate one embodiment of the transistor according to this embodiment. FIG. 9A is a top view of the transistor. Note that FIG. 9B is a cross-sectional view along line A1-A2 in FIG. 9A. Note that FIG. 9C is a cross-sectional view along line B1-B2 in FIG. 9A. Note that FIG. 9D is a cross-sectional view along line C1-C2 in FIG. 9A and illustrates a cross section of the corner of the conductor 106. Note that the insulating film 107 and the gate electrode 109 are shown in FIGS. 9B, 9C, and 9D; however, these are not shown in FIG. 9A for easy understanding.

FIG. 9D shows the cross section of the corner of the conductor 106. In this embodiment, the corner is rounded and the thickness of the portion indicated by the arrows in the insulating film 107 is substantially the same as the thickness of the portion indicated by the arrows in the insulating film 107 in FIG. 9C. Furthermore, the thickness of the portion indicated by the arrows in the insulating film 107 in FIG. 9D is preferably more than or equal to 80% and less than or equal to 100%, more preferably more than or equal to 90% and less than or equal to 100% of the insulating film 107 over the insulating film 102 or the insulating film 107 over the conductor 106.

COMPARATIVE EXAMPLE

FIGS. 10A to 10D illustrate an example of a transistor including the conductor 106 whose corners are not rounded. FIG. 10A is a top view of the transistor. FIG. 10B is a cross-sectional view along line A1-A2 in FIG. 10A. FIG. 10C is a cross-sectional view along line B1-B2 in FIG. 10A. FIG. 10D is a cross-sectional view along line C1-C2 in FIG. 10A and illustrates a cross section of the corner of the conductor 106. Note that the insulating film 107 and the gate electrode 109 are shown in FIGS. 10B, 10C, and 10D; however, these are not shown in FIG. 10A for easy understanding.

In FIG. 10A, a projecting portion is not projected toward the inside of the opening portion in the mask 111; therefore, the corner of the conductor 106 is not rounded. Thus, the insulating film 107 along line C1-C2 of FIGS. 10A and 10D is thinner than the insulating film 107 along line B1-B2 of FIGS. 10A and 10C. Therefore, leakage current may be caused between the conductor 106 and the gate electrode 109 in the corner of the conductor 106. Furthermore, concentration of electric field occurs in the corner since the corner of the conductor 106 is sharp. This may cause damage to the device and malfunction in operation.

At least part of this embodiment can be implemented in combination with any of the other embodiments described in this specification as appropriate.

Embodiment 2

In this embodiment, an example of a manufacturing method of a transistor that is different from the transistor of Embodiment 1 is described. Specifically, an example of manufacturing a transistor 400 including a barrier film provided over the conductive film serving as the source electrode or the drain electrode or the write bit line (WBL) or the floating node (FN) is described. Furthermore, an example using a hard mask in the formation of the source electrode, the drain electrode, and the semiconductor layer of the transistor 400 is described.

Furthermore, a manufacturing method of a transistor 900 including a semiconductor layer which can be formed concurrently with the transistor 400 and is different from the transistor 400 is described. Although details are described later, in the case where a memory device is manufactured as the semiconductor device of this embodiment by using the transistor 400 and the transistor 900 in combination, the memory device can hold memory data for a long time even when power supply is stopped because the drain current when the gate voltage of the transistor 900 is 0 V (also referred to as $I_{cut}$ in some cases) is extremely small.

Note that the transistor 900 is not necessarily provided, only the transistor 400 may be provided, or the transistor 400 and other components may be provided without using the transistor 900, in order to form the semiconductor device such as a memory device.

Figure 11A:
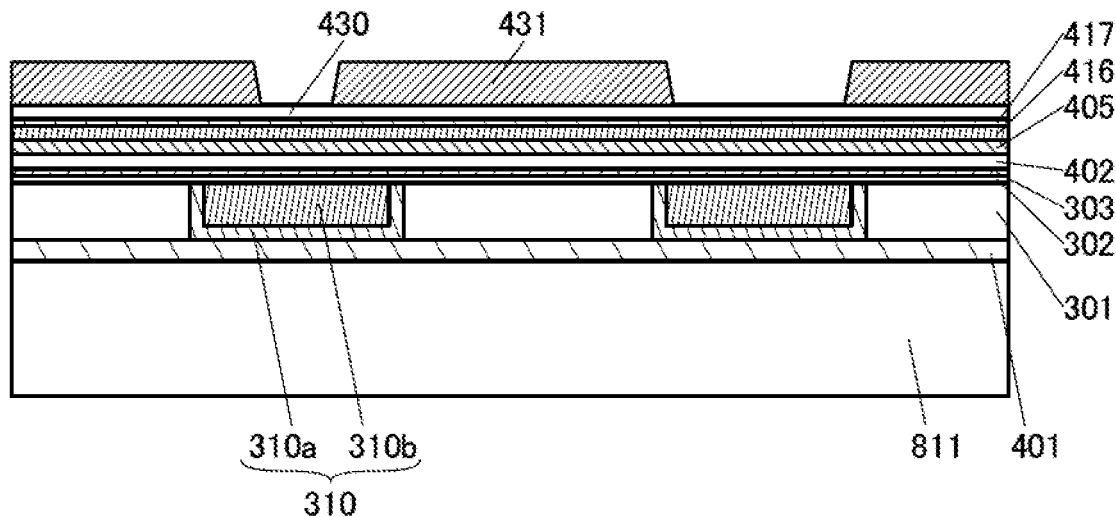
FIGS. 11A to 11C are cross-sectional views illustrating a manufacturing method of a semiconductor device according to one embodiment of the present invention.

FIG. 11A illustrates a substrate 811 provided with a conductor 310 serving as a back gate electrode. In this embodiment, an aluminum oxide film serving as an insulator 401 is provided over the substrate 811, a silicon oxynitride film serving as an insulator 301 is provided over the insulator 401, and a groove pattern is formed in the insulator 301. Then, a conductive film to be the conductor 310 is provided over the insulator 301 and inside the groove. At this time, the conductive film is formed over the substrate so that the groove is filled with the conductive film. The conductive film positioned over the insulator 301 is removed by CMP, etching, or the like, so that the conductor 310 can be formed. This process is referred to as a damascene process in some cases.

The aluminum oxide film used as the insulator 401 serves as a barrier film which prevents diffusion of hydrogen or moisture included in the substrate 811 into the semiconductor layer formed in the later process or into the insulating films in the vicinity of the semiconductor layer. Furthermore, the aluminum oxide film also serves as a film which prevents oxygen, which is supposed to be added to the semiconductor layer, from being released to the substrate 811 side.

Furthermore, the groove can be formed by processing the insulator 301. The processing of the insulator 301 can be performed by etching. The etching may be performed by dry etching or wet etching; however, it is preferable to use dry etching in terms of minute processing and size control. Here, by using the aluminum oxide film as the insulator 401, the insulator 401 serves as an etching stopper when the groove is formed in the insulator 301.

Although the insulator 401 formed using the aluminum oxide film is preferably provided because it serves as the barrier film and the etching stopper, one embodiment of the present invention is not limited to this example. As long as the functions similar to those described above are obtained, the insulator 401 may be formed using a material other than the aluminum oxide film to serve as the barrier film and the etching stopper. Furthermore, when the film having the above-described functions is unnecessary, the insulator 401 is not necessarily provided.

The conductor 310 serving as the gate electrode includes a conductor 310a and a conductor 310b. The conductor 310b may serve as a seed layer to form the conductor 310a. In the case where the conductor 310b includes a material, such as copper, which involves a risk of diffusion into the device, the conductor 310a may serve as the barrier layer. Furthermore, the conductor 310a and the conductor 310b are each not limited to a single layer and may be a stacked layer.

In this embodiment, tantalum nitride is used as the conductor 310a and a stacked-layer film of titanium nitride and tungsten is used as the conductor 310b. Tantalum nitride serves as a barrier film to prevent diffusion of impurities such as hydrogen and water included in the substrate 811 into the insulating film and the semiconductor layer formed in the later process. Tantalum nitride is particularly effective in the case where a contact hole is formed in the insulator 401 by a dual damascene process or the like described later. Furthermore, titanium nitride can serve as the seed layer when tungsten is formed with a metal CVD method.

The conductor 310 serves not only as the gate electrode but also as a lead wiring. Although the conductor 310 is formed by a single damascene process which is one of the damascene processes, one embodiment of the present invention is not limited thereto. In the case where elements such as a wiring, a transistor and a capacitor are provided under the conductor 310 and these elements are required to be connected to the conductor 310, the conductor 310 may be formed by a dual damascene process. The dual damascene process is a process of providing a contact hole in the bottom of the groove and forming a wiring and a via at the same time inside the groove and the contact hole. The dual damascene process can be carried out by a plurality of methods, for example, a method of forming the contact hole after the groove is formed, a method of forming the groove after the contact hole is formed, and a method of forming the groove and the contact hole at the same time after the contact hole is partly formed.

An insulator 302, an insulator 303, and an insulator 402 are sequentially formed so as to cover the conductor 310 and the insulator 301. The insulators 302, 303, and 402 serve as a gate insulating film on the back gate side. In this embodiment, an insulating film having a three-layer structure in which a 10-nm-thick silicon oxynitride film, a 20-nm-thick aluminum oxide film, and a 30-nm-thick silicon oxynitride film are stacked as the insulator 302, the insulator 303, and the insulator 402, respectively is used; however, this embodiment is not limited thereto.

Although details are described later, as the insulating film which can be used in this embodiment, a single layer of silicon oxide film, silicon oxynitride film, silicon nitride oxide film, silicon nitride film, aluminum oxide, aluminum nitride, hafnium oxide, hafnium nitride, or the like or a stacked layer of two or more kinds of materials selected from the aforementioned materials can be used. The insulating film can be formed using a plasma CVD method, a sputtering method, an ALD method, or the like.

Next, a semiconductor film 405 is formed over the insulator 402. Although details are described later, as examples of the material of the semiconductor film which can be used in this embodiment, silicon and metal oxides can be given. In the case of using metal oxide for the semiconductor film, a metal oxide with a different composition from the metal oxide of the semiconductor film 405 is preferably provided between the insulator 402 and the semiconductor film 405.

A conductor 416 and a barrier film 417 which prevents oxidation of the conductive film are formed over the semiconductor film 405 and a conductive film 430 serving as a hard mask is provided over the barrier film 417.

Although details are described later, as the conductor 416 which can be used in this embodiment, a single layer or a stacked layer including two or more layers is formed using a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, and indium, for example. Note that when using the stacked-layer structure of two or more layers, each layer is preferably formed using a material containing different metal elements. Furthermore, the stacked-layer structure may be formed using materials with different content percentages of a metal element. Furthermore, when using a stacked-layer structure of three or more layers, materials containing different metal elements may be sandwiched between materials containing the same metal elements. As the conductor 416, a 30-nm-thick tantalum nitride formed by a sputtering method is used in this embodiment.

Furthermore, the barrier film 417 can be formed by forming a metal oxide film of aluminum oxide, hafnium oxide, or the like and a nitride film of aluminum nitride, hafnium nitride, silicon nitride, or the like over the conductor 416. In this embodiment, a 5-nm-thick aluminum oxide formed by an ALD method is used as the barrier film 417.

Furthermore, the conductive film 430 can be formed using the same material as the conductor 416. The conductive film 430 can be formed using the same material as the conductor 416 or a different material from that of the conductor 416. As the conductive film 430, a 15-nm-thick tungsten formed by a sputtering method is used in this embodiment.

A resist mask 431 is formed over the conductive film 430 serving as a hard mask. Through the steps up to here, a cross-sectional structure illustrated in FIG. 11A can be obtained. The resist mask 431 has a shape similar to that of the mask 111 illustrated in FIG. 2D and FIG. 7A. Part of the opening portion of the resist mask 431 corresponds to a channel formation region of the transistor formed in a later step.

Figure 11B:
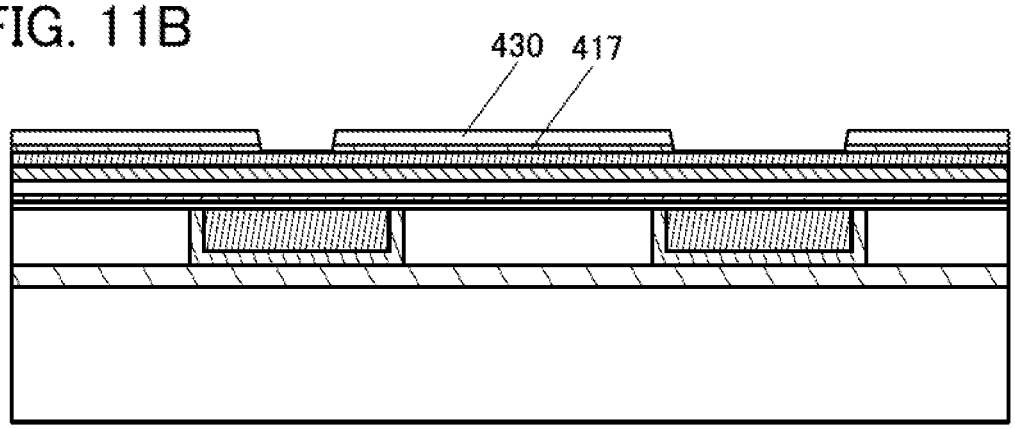

Part of the conductive film 430 and part of the barrier film 417 are removed by etching using the resist mask 431 as illustrated in FIG. 11B. The etching may be performed by dry etching or wet etching; however, it is preferable to use dry etching in terms of minute processing and size control. After the etching of the conductive film 430 and the barrier film 417, the resist mask 431 is removed. The resist mask 431 may be removed by ashing using oxygen plasma or the like, a chemical solution, or both of them in combination.

Figure 11C:
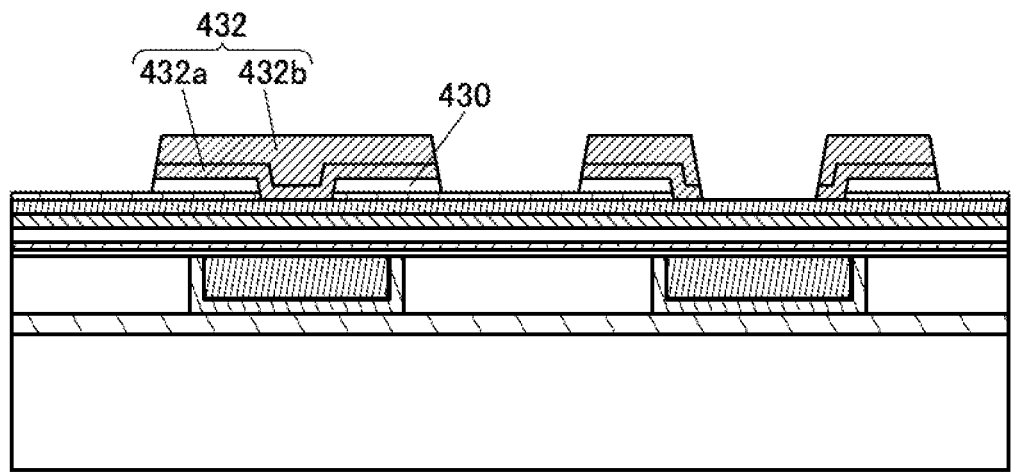

Next, a mask 432 for forming an island-shaped semiconductor layer is formed. A resist mask or a resin is used as the mask 432. In this embodiment, a resist mask 432b is formed over a 120-nm-thick resin film 432a formed by a spin coating method. The resin film 432a and the conductive film 430 are etched using the resist mask 432b (see FIG. 11C).

Figure 12A:
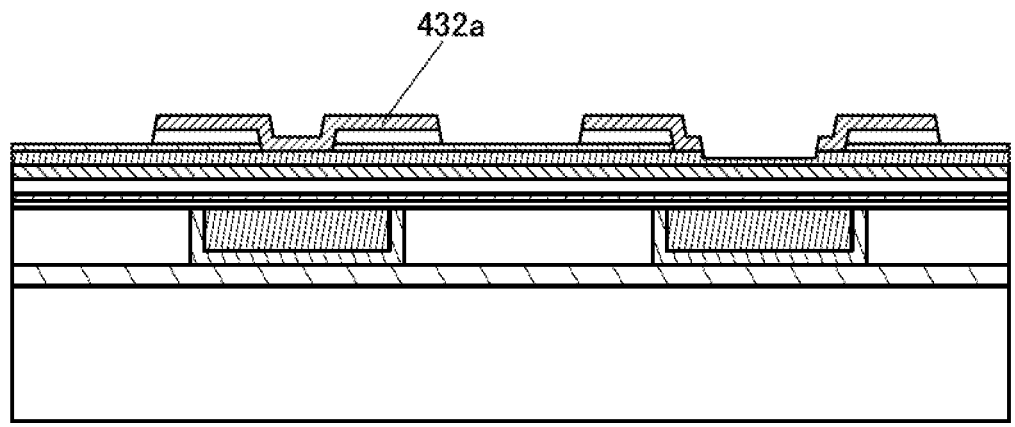
FIGS. 12A to 12C are cross-sectional views illustrating a manufacturing method of a semiconductor device according to one embodiment of the present invention.

After etching the resin film 432a and the conductive film 430, the resist mask 432b is removed (see FIG. 12A). The etched resin film 432a and the etched conductive film 430 serve as a hard mask in a later step.

Figure 12B:
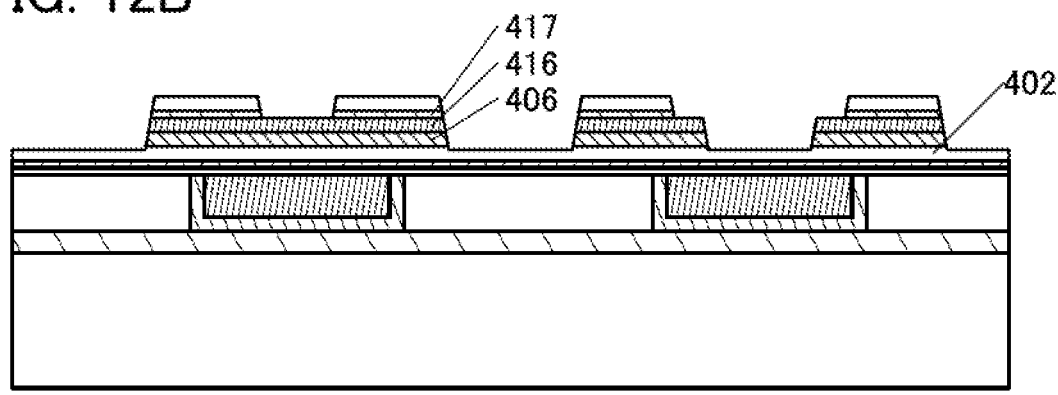

Next, the barrier film 417, the conductor 416, and the semiconductor film 405 are etched using the resin film 432a and the conductive film 430 as the mask. In this manner, an island-shaped semiconductor layer 406 can be formed. Note that in the case where a metal oxide film is used as the semiconductor film 405 and a metal oxide with a different composition from that of the metal oxide used in the semiconductor film 405 is provided between the insulator 402 and the semiconductor film 405, etching of the metal oxide may be performed following the etching of the semiconductor film 405. After that, the resin film 432a is removed (see FIG. 12B). The resin film 432a can be removed by ashing using oxygen plasma or the like.

Figure 12C:
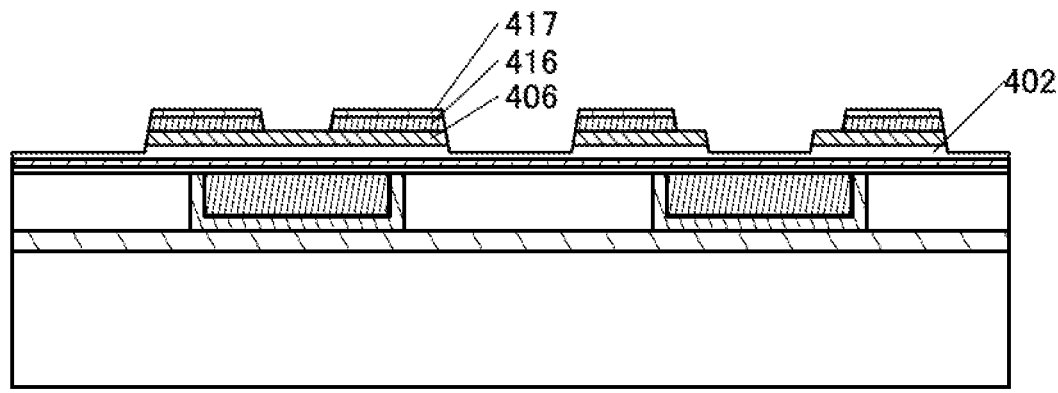

Next, part of the conductor 416 and the part of the conductive film 430 are removed (see FIG. 12C). The portion of the conductor 416 which is not covered with the barrier film 417 is removed. The conductor 416 and the conductive film 430 are preferably formed of the same material because the conductor 416 and the conductive film 430 can be removed using the same etching condition. When the conductor 416 and the conductive film 430 are formed of different materials, the conductor 416 and the conductive film 430 are preferably etched collectively by adjusting the etching condition. In this embodiment, tantalum nitride serving as the conductor 416 and tungsten serving as the conductive film 430 are dry-etched using a gas containing chlorine; however, this embodiment is not limited thereto. The conductor 416 and the conductive film 430 may be formed of the same material. Alternatively, as long as the conductor 416 and the conductive film 430 can be etched at the same time, the conductor 416 and the conductive film 430 can be formed of different materials. As long as the conductor 416 and the conductive film 430 can be etched at the same time, the conductor 416 and the conductive film 430 may be etched using gas other than gas containing chlorine.

As the gas containing chlorine, $Cl_2$, $BC_{l3}$, $SiCl_4$, $CCl_4$, or the like can be used, for example. Furthermore, as a gas other than the gas containing chlorine, a gas containing fluorine such as $CF_4$ and $SF_6$ can be used. Furthermore, as an etching gas, a mixed gas of a gas containing chlorine and a gas containing fluorine may be used, and oxygen, nitrogen, halogen, or the like may be added to the mixed gas.

Figure 13A:
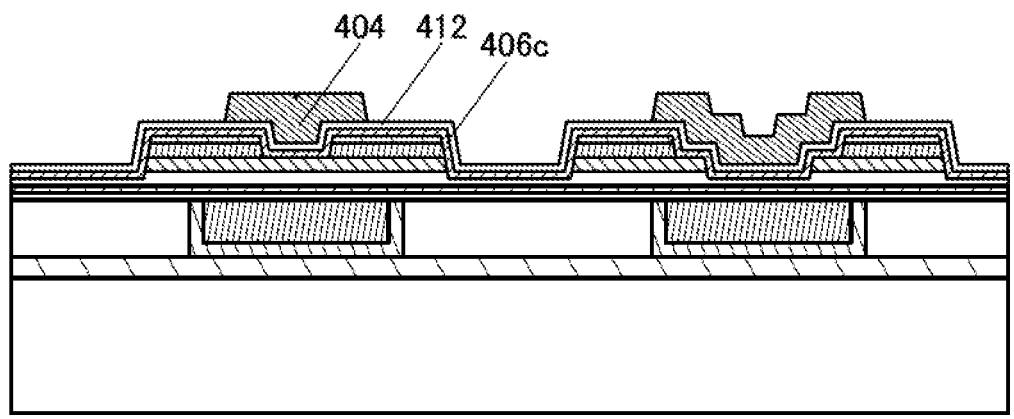
FIGS. 13A to 13C are cross-sectional views illustrating a manufacturing method of a semiconductor device according to one embodiment of the present invention.

Next, an oxide 406c is formed so as to cover the semiconductor layer 406, the conductor 416, and the barrier film 417. The oxide 406c is preferably a material with a wider band gap than the semiconductor layer 406. In this embodiment, a metal oxide containing indium (In), gallium (Ga), and Zinc (Zn) having a ratio of In:Ga:Zn=1:1:1 is used as the oxide 406c. Furthermore, in the transistor 900, the oxide 406c is used as a semiconductor layer including a channel formation region. The insulator 412 serving as the gate insulating film and the conductor 404 serving as the gate electrode are formed over the oxide 406c (FIG. 13A).

The corner of the conductor 416 is rounded, so that the oxide 406c and the insulator 412 have good coverage. Thus, the oxide 406c and the insulator 412 overlapping with the corner of the conductor 416 are not extremely thinned, so that leakage current between the conductor 404 and the conductor 416 can be reduced. The thicknesses of the oxide 406c and the insulator 412 overlapping with the corner are preferably 80% to 100%, or further preferably 90% to 100% of the thicknesses of the oxide 406c and the insulator 412 over the conductor 416.

The conductor 404 is provided so as to overlap with part of the conductor 416. In particular, even when the conductor 404 is provided so as to overlap with the corner of the conductor 416, leakage current between the conductor 404 and the conductor 416 can be reduced because the insulating film overlapping with the corner has good coverage.

Figure 13B:
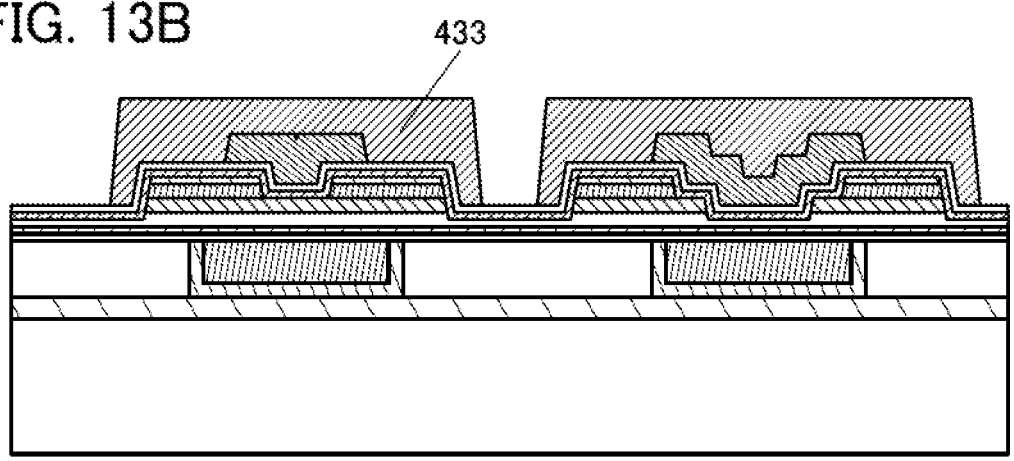
Figure 13C:
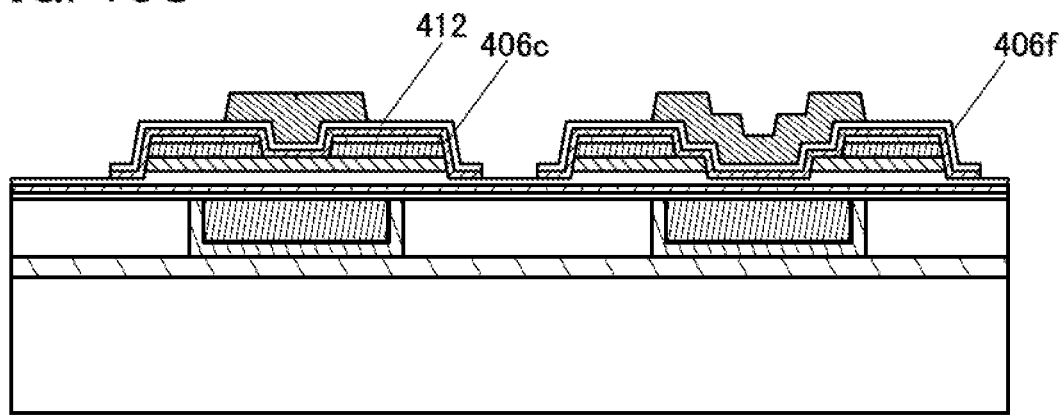

Next, a mask 433 for processing the oxide 406c into a desired shape is formed over the insulator 412 and the conductor 404 as shown in FIG. 13B. Next, part of the insulator 412 and the oxide 406c are etched and removed as shown in FIG. 13C. In this embodiment, the insulator 412 and the oxide 406c are etched using dry etching; however, this embodiment is not limited thereto. The insulator 412 and the oxide 406c can be processed by wet etching. The insulator 412 and the oxide 406c can also be processed by a combination of wet etching and dry etching. By the above processing, the oxide 406c is formed in the transistor 400 and the oxide 406f is formed in the transistor 900. After the processing of the insulator 412 and the oxide 406c, the mask 433 is removed.

Figure 14A:
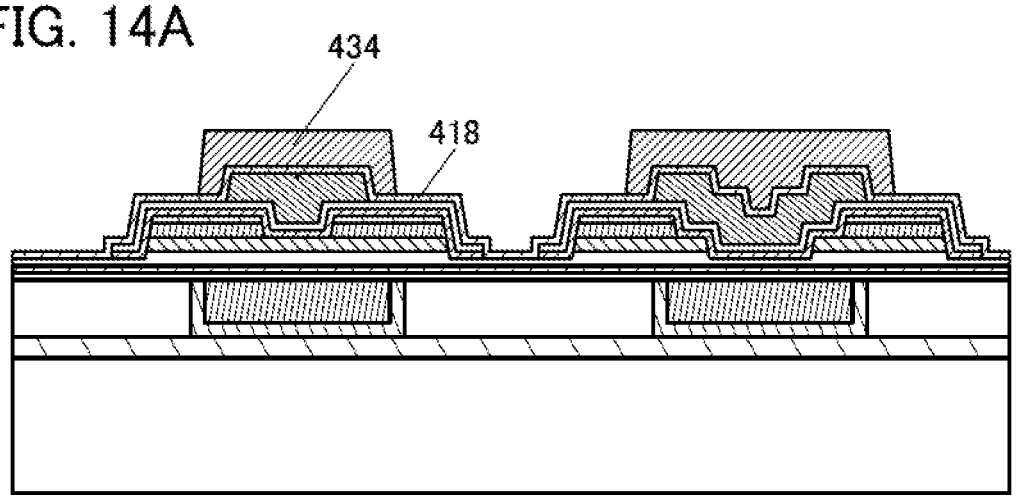
FIGS. 14A to 14C are cross-sectional views illustrating a manufacturing method of a semiconductor device according to one embodiment of the present invention.

Next, in order to prevent oxidization of the conductor 404, an aluminum oxide film is formed as a barrier film 418 by an ALD method so as to cover the conductor 404, the insulator 412, the oxide 406c, the insulator 402, and the like, and a mask 434 is formed over the aluminum oxide film (see FIG. 14A).

Figure 14B:
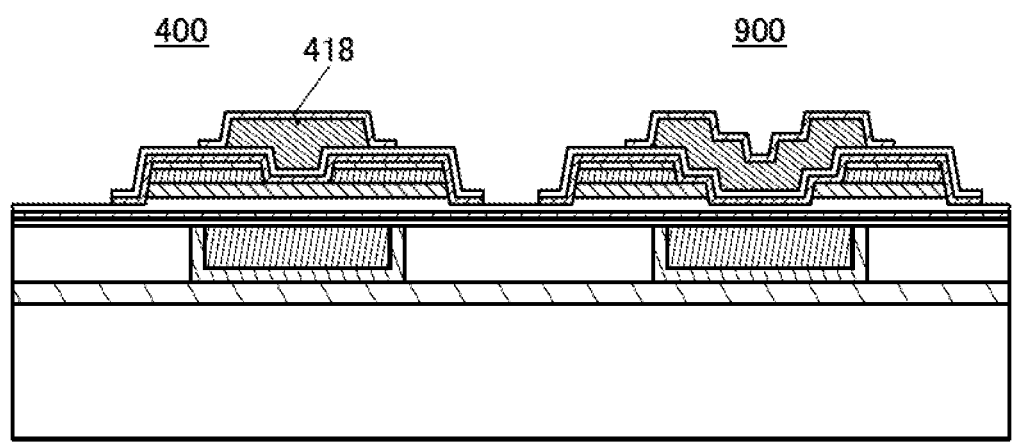

An unnecessary portion of the barrier film 418 is removed and the mask 434 is removed by dry etching or wet etching (see FIG. 14B). Through the above process, the transistor 400 including the island-shaped semiconductor layer 406, the conductor 416 provided over the island-shaped semiconductor layer 406, the barrier film 417 provided so as to protect the conductor 416, the insulator 412 serving as the gate insulating film, and the conductor 404 serving as the gate electrode is formed. In addition, the transistor 900 is formed using the oxide 406f formed in the same layer as the oxide 406c as the semiconductor layer. Although the transistor 400 and the transistor 900 have different cross-sectional shapes, the formation can be performed in the same step without adding a special step.

Figure 14C:
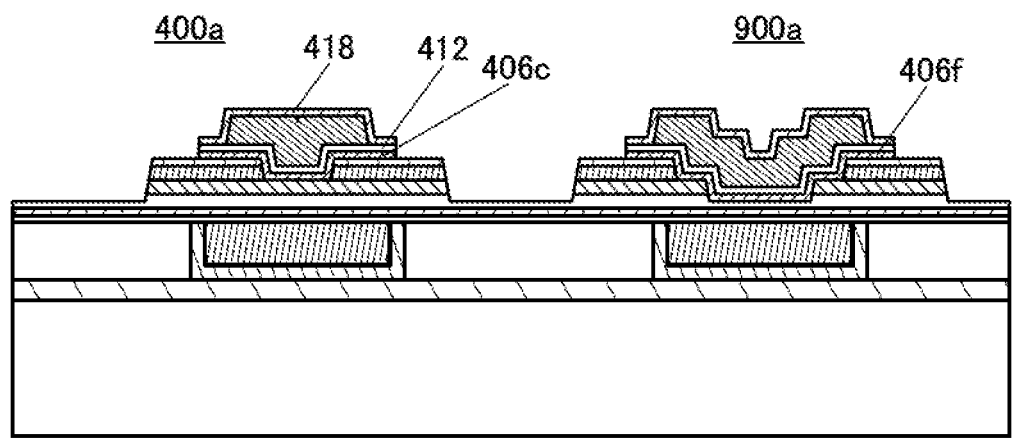

Etching of the insulator 412 and the oxide 406c illustrated in FIG. 13C is not necessarily performed. After the etching of the barrier film 418 illustrated in FIG. 14B, the insulator 412 and the oxide 406c may be etched. By this processing, a transistor 400a and a transistor 900a can be formed as shown in FIG. 14C. By preferably processing the barrier film 418, the insulator 412, and the oxide 406c using the mask 434, the formation of the mask 433 can be eliminated and the mask formation step and etching steps can be cut.

Figure 15A:
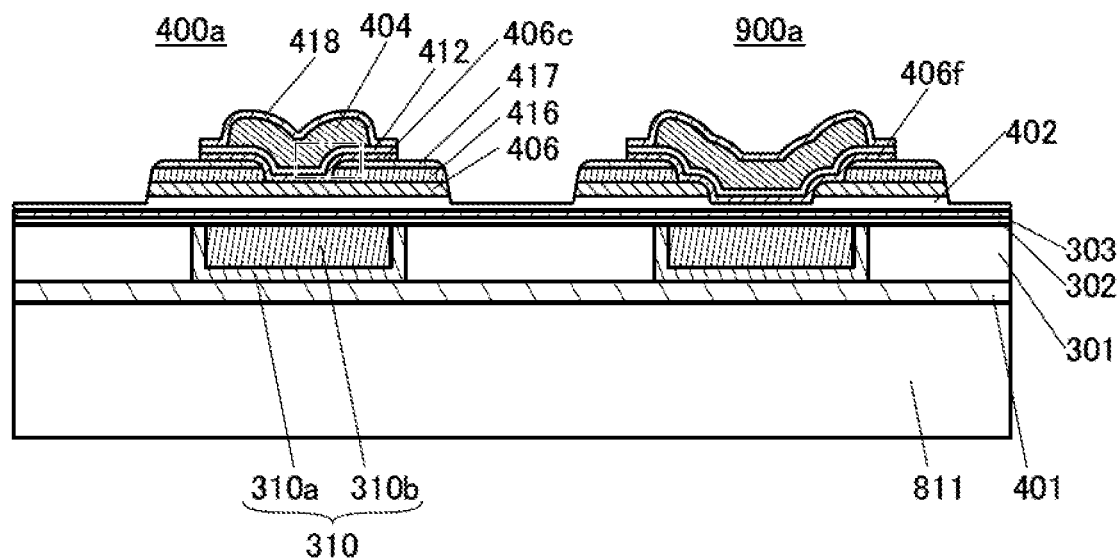
FIGS. 15A and 15B are diagrams illustrating a semiconductor device according to one embodiment of the present invention.
Figure 15B:
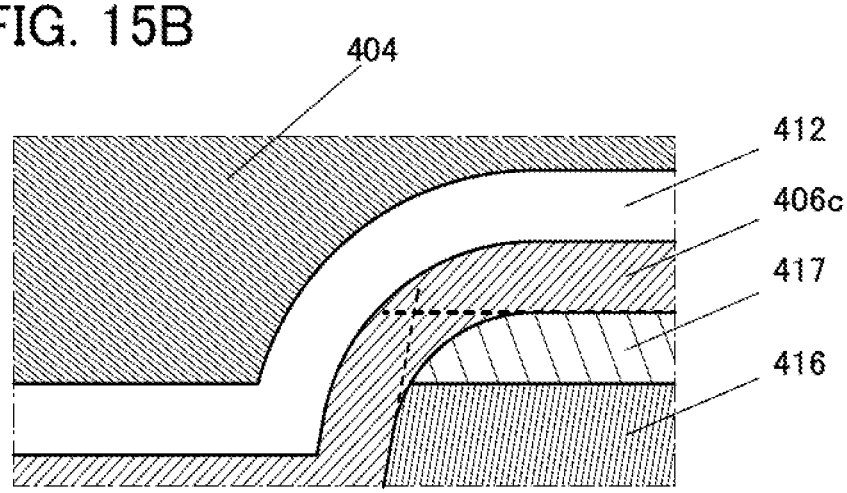

Note that depending on the mask used for the process of the conductor 416, the barrier film 417, and the conductor 404 and the process conditions such as etching conditions, the cross sections of the conductor 416, the barrier film 417, or the conductor 404 may have a curved surface between the side surfaces and the top surfaces thereof as illustrated in FIGS. 15A and 15B. In other words, the end portion of the side surface and the end portion of the top surface may be curved (hereinafter, also referred to as a rounded shape). An example in which a curved surface is included between the side surface and the top surface of the stack of the conductor 416 and the barrier film 417 is shown in FIGS. 15A and 15B; however, this embodiment is not limited thereto. For example, a curved surface may be included only between the side surface and the top surface of the barrier film 417.

FIG. 15B is an enlarged view of a portion surrounded by a dashed-dotted line in the cross-sectional view of the transistor shown in FIG. 15A. The extension line extending in a horizontal direction of the top surface of the barrier film 417 and the extension line of the side surface of the conductor 416 are indicated by dotted lines. The end portions of the side surface and the top surface of the conductor 416 and the barrier film 417 are arranged inside the region surrounded by the extension lines. Such a state in this specification is expressed as "the conductor 416 and the barrier film 417 including a curved surface", "the conductor 416 and the barrier film 417 are curved", and "the conductor 416 and the barrier film 417 are a rounded shape". Note that not only the conductor 416 and the barrier film 417 but also the conductor 404 can be defined as a curved surface in the same way.

In at least one of the conductor 416, the barrier film 417, and the conductor 404, by having a cross-sectional shape including a curved surface between the side surface and the top surface, coverage of the films formed later in the manufacturing process is improved.

Through the above process, a semiconductor device having stable electric characteristics can be manufactured. In particular, a semiconductor device including a transistor having low leakage current between the drain and the gate and between the source and the drain in an off state can be manufactured.

[Components]

The above components will be described below.

[Substrate]

As a substrate over which the transistor described in this embodiment is provided, for example, an insulator substrate, a semiconductor substrate, or a conductor substrate may be used. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, or a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate. As a method for providing the transistor over a flexible substrate, there is a method in which the transistor is formed over a non-flexible substrate and then the transistor is separated and transferred to the flexible substrate. In that case, a separation layer is preferably provided between the non-flexible substrate and the transistor. As the substrate, a sheet, a film, or a foil containing a fiber may be used. The substrate may have elasticity. The substrate may have a property of returning to its original shape when bending or pulling is stopped. Alternatively, the substrate may have a property of not returning to its original shape. The substrate has a region with a thickness of, for example, greater than or equal to 5 µm and less than or equal to 700 µm, preferably greater than or equal to 10 µm and less than or equal to 500 µm, more preferably greater than or equal to 15 µm and less than or equal to 300 µm. When the substrate has a small thickness, the weight of the semiconductor device including the transistor can be reduced. When the substrate has a small thickness, even in the case of using glass or the like, the substrate may have elasticity or a property of returning to its original shape when bending or pulling is stopped. Therefore, an impact applied to the semiconductor device over the substrate due to dropping or the like can be reduced. That is, a durable semiconductor device can be provided.

For the flexible substrate, metal, an alloy, a resin, glass, or fiber thereof can be used, for example. The flexible substrate preferably has a lower coefficient of linear expansion because deformation due to an environment is suppressed. The flexible substrate is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used as the material of the flexible substrate because of its low coefficient of linear expansion.

Furthermore, in the case where the transistor described in this embodiment is used in a display device, the substrate having a flat surface can be used. The substrate on the side from which light from the display element is extracted is formed using a material transmitting the light. For example, a material such as glass, quartz, ceramics, sapphire, or an organic resin can be used.

The weight and thickness of the display panel can be decreased by using a thin substrate. A flexible display panel can be obtained by using a substrate that is thin enough to have flexibility.

Since the substrate through which light emission is not extracted does not need to have a light-transmitting property, a metal substrate or the like can be used in addition to the above-mentioned substrates. A metal substrate, which has high thermal conductivity, is preferable because it can easily conduct heat to the whole substrate and accordingly can prevent a local temperature rise in the display panel. To obtain flexibility and bendability, the thickness of a metal substrate is preferably greater than or equal to 10 µm and less than or equal to 200 µm, further preferably greater than or equal to 20 µm and less than or equal to 50 µm.

Although there is no particular limitation on a material of a metal substrate, it is favorable to use, for example, a metal such as aluminum, copper, and nickel, an aluminum alloy, or an alloy such as stainless steel.

It is preferable to use a substrate subjected to insulation treatment, e.g., a metal substrate whose surface is oxidized or provided with an insulating film. The insulating film may be formed by, for example, a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

Examples of the material that has flexibility and transmits visible light include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. It is particularly preferable to use a material with a low thermal expansion coefficient, for example, a material with a thermal expansion coefficient lower than or equal to $30 \times 10^{-6}$/K, such as a polyamide imide resin, a polyimide resin, or PET. A substrate in which a glass fiber is impregnated with an organic resin or a substrate whose thermal expansion coefficient is reduced by mixing an inorganic filler with an organic resin can also be used. A substrate using such a material is lightweight, and thus a display panel using this substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, a glass fiber using E glass, S glass, D glass, Q glass, or the like can be used. These fibers may be used in a state of a woven or nonwoven fabric, and a structure body in which this fibrous body is impregnated with a resin and the resin is cured may be used as the flexible substrate. The structure body including the fibrous body and the resin is preferably used as the flexible substrate, in which case the reliability against breaking due to bending and local pressure can be increased.

Alternatively, glass, metal, or the like that is thin enough to have flexibility can be used as the substrate. Alternatively, a composite material where glass and a resin material are attached to each other with an adhesive layer may be used.

A hard coat layer (e.g., a silicon nitride layer and an aluminum oxide layer) by which a surface of a display panel is protected from damage, a layer (e.g., an aramid resin layer) that can disperse pressure, or the like may be stacked over the flexible substrate. Furthermore, to suppress a decrease in lifetime of the display element due to moisture and the like, an insulating film with low water permeability may be stacked over the flexible substrate. For example, an inorganic insulating material such as silicon nitride, silicon oxynitride, silicon nitride oxide, aluminum oxide, or aluminum nitride can be used.

The substrate may be formed by stacking a plurality of layers. When a glass layer is used, a barrier property against water and oxygen can be improved and thus a highly reliable display panel can be provided.

[Transistor]

The transistor includes a conductive layer serving as a gate electrode, a semiconductor layer, a conductive layer serving as a source electrode, a conductive layer serving as a drain electrode, and an insulating layer serving as a gate insulating film.

Note that there is no particular limitation on the structure of the transistor included in the display device of one embodiment of the present invention. For example, a planar transistor, a staggered transistor, or an inverted staggered transistor may be used. A top-gate transistor or a bottom-gate transistor may be used. Gate electrodes may be provided above and below a channel as in this embodiment.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

As a semiconductor material used for the transistors, a metal oxide whose energy gap is greater than or equal to 2 eV, preferably greater than or equal to 2.5 eV, further preferably greater than or equal to 3 eV can be used. A typical example thereof is an oxide semiconductor containing indium, and for example, a CAC-OS described later or the like can be used.

Since a transistor with an oxide semiconductor having a larger band gap and a lower carrier density than silicon has a low off-state current, charges in a capacitor that is series-connected to the transistor are retained for a long time.

The semiconductor layer can be, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium).

In the case where the oxide semiconductor contained in the semiconductor layer contains an In-M-Zn-based oxide, it is preferable that the atomic ratio of metal elements of a sputtering target used for forming a film of the In-M-Zn oxide satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio of the formed oxide semiconductor layer varies from the above atomic ratios of metal elements of the sputtering targets in a range of ±40%.

An oxide semiconductor film with low carrier density is used as the semiconductor layer. For example, the semiconductor layer is an oxide semiconductor whose carrier density is lower than or equal to $1 \times 10^{17}$/cm$^3$, preferably lower than or equal to $1 \times 10^{15}$/cm$^3$, further preferably lower than or equal to $1 \times 10^{13}$/cm$^3$, still further preferably lower than or equal to $1 \times 10^{11}$/cm$^3$, even further preferably lower than $1 \times 10^{10}$/cm$^3$, and higher than or equal to $1 \times 10^{-9}$/cm$^3$. Such an oxide semiconductor is referred to as a highly purified intrinsic or substantially highly purified intrinsic oxide semiconductor. The oxide semiconductor has a low impurity concentration and a low density of defect states and can thus be referred to as an oxide semiconductor having stable characteristics.

Note that, without limitation to those described above, a material with an appropriate composition may be used depending on required semiconductor characteristics and electrical characteristics (e.g., field-effect mobility and threshold voltage) of a transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon that is one of elements belonging to Group 14 is contained in the oxide semiconductor contained in the semiconductor layer, oxygen vacancies are increased in the semiconductor layer, and the semiconductor layer becomes n-type. Thus, the concentration of silicon or carbon (measured by secondary ion mass spectrometry) in the semiconductor layer is lower than or equal to $2\times10^{18}$ atoms/cm$^3$, preferably lower than or equal to $2\times10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal of the semiconductor layer, which is measured by secondary ion mass spectrometry, is lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. Thus, a transistor including an oxide semiconductor that contains nitrogen is likely to be normally on. Hence, the concentration of nitrogen that is measured by secondary ion mass spectrometry is preferably set to lower than or equal to $5\times10^{18}$ atoms/cm$^3$.

The semiconductor layer may have a non-single-crystal structure, for example. The non-single-crystal structure includes CAAC-OS (c-axis aligned crystalline oxide semiconductor, or c-axis aligned a-b-plane-anchored crystalline oxide semiconductor) including a c-axis aligned crystal, a polycrystalline structure, a microcrystalline structure, or an amorphous structure, for example. Among the non-single-crystal structures, an amorphous structure has the highest density of defect states, whereas CAAC-OS has the lowest density of defect states.

An oxide semiconductor film having an amorphous structure has disordered atomic arrangement and no crystalline component, for example. Alternatively, an oxide film having an amorphous structure has, for example, an absolutely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single-crystal structure. The mixed film has, for example, a single-layer structure or a stacked-layer structure including two or more of the above-described regions in some cases.

<Composition of CAC-OS>

Described below is the composition of a cloud-aligned composite oxide semiconductor (CAC-OS) applicable to a transistor disclosed in one embodiment of the present invention.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of, aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite oxide semiconductor with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including GaO$_{X3}$ as a main component and the region including In$_{X2}$Zn$_{Y2}$O$_{Z2}$ or InO$_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part of the CAC-OS, and these nanoparticle regions are randomly dispersed to form a mosaic pattern in the CAC-OS The CAC-OS can be formed by a sputtering method under a condition where a substrate is not heated intentionally. In the case where the CAC-OS is formed by a sputtering method, one or more of an inert gas (typically, argon), an oxygen gas, and a nitrogen gas is used as a deposition gas. Furthermore, the flow rate of the oxygen gas to the total flow rate of the deposition gas in deposition is preferably as low as possible, for example, the flow rate of the oxygen gas is higher than or equal to 0% and lower than 30%, preferably higher than or equal to 0% and lower than or equal to 10%.

The CAC-OS has a characteristic in that a clear peak is not observed when measurement is conducted using a θ/2θ scan by an out-of-plane method with an X-ray diffraction (XRD). That is, it is found that there are no alignment in the a-b plane direction and no alignment in the c-axis alignment in the measured areas by the XRD.

In the CAC-OS, an electron diffraction pattern that is obtained by irradiation with an electron beam with a probe diameter of 1 nm (also referred to as nanobeam electron beam) has regions with high luminance in a ring pattern and a plurality of bright spots appear in the ring-like pattern. Thus, it is found from the electron diffraction pattern that the crystal structure of the CAC-OS includes a nanocrystalline (nc) structure that does not show alignment in the plane direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the regions including $GaO_{X3}$ as a main component and the regions including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is generated. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Ion) and high field-effect mobility (μ) can be achieved.

A semiconductor element including a CAC-OS has high reliability. Thus, the CAC-OS is suitably used in a variety of semiconductor devices typified by a display.

Alternatively, silicon may be used as a semiconductor in which a channel of a transistor is formed. Although amorphous silicon may be used as silicon, silicon having crystallinity is particularly preferable. For example, microcrystalline silicon, polycrystalline silicon, single crystal silicon, or the like is preferably used. In particular, polycrystalline silicon can be formed at a lower temperature than single crystal silicon and has higher field effect mobility and higher reliability than amorphous silicon.

[Conductive Layer]

As materials for a gate, a source, and a drain of a transistor, and a conductive layer such as a wiring or an electrode, any of metals such as aluminum, titanium, chromium, nickel, copper, yttrium, zirconium, molybdenum, silver, tantalum, and tungsten, or an alloy containing any of these metals as its main component can be used. A single-layer structure or multi-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because the controllability of a shape by etching is increased.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. Alternatively, a stack of any of the above materials can be used as the conductive layer. For example, a stacked film of indium tin oxide and an alloy of silver and magnesium is preferably used because the conductivity can be increased. They can also be used for conductive layers such as a variety of wirings and electrodes included in a display device, and conductive layers (e.g., conductive layers serving as a pixel electrode or a common electrode) included in a display element when the transistor in this embodiment is used in the display device.

[Insulating Layer]

Examples of an insulating material that can be used for the insulating layers include a resin such as acrylic or epoxy resin, a resin having a siloxane bond such as silicone, and an inorganic insulating material such as silicon oxide, silicon oxynitride, silicon nitride oxide, silicon nitride, or aluminum oxide.

The light-emitting element is preferably provided between a pair of insulating films with low water permeability, in which case impurities such as water can be prevented from entering the light-emitting element, preventing a decrease in the reliability of the device.

Examples of the insulating film with low water permeability include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film with low water permeability is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

At least part of this embodiment can be implemented in combination with any of the other embodiments described in this specification as appropriate.

Embodiment 3

In this embodiment, an example of a memory device is described with reference to FIG. 16 as one embodiment of a semiconductor device which includes a transistor described in Embodiments 1 or 2. The memory device can be used not only as a memory device but also as part of an arithmetic device in a CPU and the like.

The memory device in FIG. 16 includes a transistor 900, a transistor 800, a transistor 400, and a capacitor 450.

The transistor 400 is a transistor in which a channel is formed in a semiconductor layer containing an oxide semiconductor. Since the off-state current of the transistor 400 is small, by using the transistor 400 in a memory device, stored data can be retained for a long time. In other words, such a memory device does not require refresh operation or has an extremely low frequency of refresh operation, which leads to a sufficient reduction in power consumption.

Moreover, supplying a negative potential to a back gate of the transistor 400 can further reduce the off-state current of the transistor 400. In that case, with a structure capable of maintaining the back gate voltage of the transistor 400, stored data can be retained for a long time without power supply.

<Structure of Transistor>

The transistor 400 includes a conductor 310 (a conductor 310*a* and a conductor 310*b*); an insulator 302, an insulator 303, and an insulator 402 over the conductor 310; an oxide 406*a* over the insulator 302, the insulator 303, and the insulator 402; an oxide 406*b* over the oxide 406*a*; a conductor 416*a*1 and a conductor 416*a*2 that are separate from each other over the oxide 406*b*; a barrier film 417*a*1 and a barrier film 417*a*2 over the conductor 416*a*1 and the conductor 416*a*2, respectively; an oxide 406*c* over the insulator 402, the oxide 406*b*, and the conductors 416*a*1 and 416*a*2; an insulator 412 over the oxide 406*c*; a conductor 404 (a conductor 404*a*, a conductor 404*b*, and a conductor 404*c*) at least part of which overlaps with the oxide 406*b* and which is over the insulator 412; a barrier film 418; an insulator 408*a* and an insulator 408*b* over the insulator 402, the insulator 412, and the conductor 404; an insulator 410; an insulator 420; and an insulator 422.

The conductor 310 is provided in an opening formed in an insulator 301. The conductor 310*a* is formed in contact with an inner wall of the opening in the insulator 301, and the conductor 310*b* is formed on the inner side. Here, the top surfaces of the conductors 310*a* and 310*b* can have substantially the same level as the top surface of the insulator 301. The conductor 310 functions as a gate electrode.

Here, a conductive material that is less likely to transmit impurities such as water and hydrogen is preferably used for the conductor 310*a*. Furthermore, the conductor 310*a* is preferably formed using tantalum, tantalum nitride, ruthenium, ruthenium oxide, or the like, and may be a single layer or a stack. This can suppress diffusion of impurities such as hydrogen and water from a layer below an insulator 401 to an upper layer through the conductor 310. Note that it is preferable that at least one of impurities such as a hydrogen atom, a hydrogen molecule, a water molecule, an oxygen atom, an oxygen molecule, a nitrogen atom, a nitrogen molecule, a nitrogen oxide molecule (e.g., $N_2O$, NO, and $NO_2$), and a copper atom and oxygen (e.g., an oxygen atom or an oxygen molecule) be less likely to penetrate the conductor 310*a*. Furthermore, hereinafter, the same applies to the description of a conductive material that is less likely to transmit impurities. When the conductor 310*a* has a function of inhibiting penetration of oxygen, the conductivity of the conductor 310*b* can be prevented from being lowered because of oxidation.

The insulator 301 is positioned over the insulator 401 that is over a substrate 811. The insulator 401 can function as a barrier insulating film for preventing impurities such as water and hydrogen from entering the transistor from a lower layer. The insulator 401 is preferably formed using an insulating material that is less likely to transmit impurities such as water and hydrogen, and for example, is preferably formed using aluminum oxide or the like. This can suppress diffusion of impurities such as hydrogen and water to a layer positioned over the insulator 401. Note that it is preferable that at least one of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom be less likely to penetrate the insulator 401. Furthermore, hereinafter, the same applies to the description of an insulating material that is less likely to transmit impurities.

Moreover, the insulator 401 is preferably formed using an insulating material that is less likely to transmit oxygen (e.g., an oxygen atom or an oxygen molecule). With this material, oxygen contained in the insulator 402 or the like can be prevented from being diffused to lower layers. Thus, oxygen can be supplied to the oxide 406*b* effectively.

The insulator 303 is preferably formed using an insulating material that is less likely to transmit oxygen and impurities such as water and hydrogen, and for example, is preferably formed using aluminum oxide or hafnium oxide. This can suppress diffusion of impurities such as hydrogen and water from a layer positioned below the insulator 303 to a layer positioned over the insulator 303. Furthermore, oxygen contained in the insulator 402 or the like can be prevented from being diffused to lower layers.

The insulator 402 is preferably formed using an insulator from which oxygen is released by heating. Specifically, it is preferable to use an insulator with the following characteristics: the amount of oxygen that is released from the insulator in thermal desorption spectroscopy (TDS) and converted into oxygen atoms is $1.0\times10^{18}$ atoms/cm$^3$ or more, preferably $3.0\times10^{20}$ atoms/cm$^3$ or more. In the TDS analysis, the film surface temperature is preferably higher than or equal to 100° C. and lower than or equal to 700° C., or higher than or equal to 100° C. and lower than or equal to 400° C. Note that oxygen released by heating is also referred to as excess oxygen. When the insulator 402 formed using such an insulator is formed in contact with the oxide 406a, oxygen can be supplied to the oxide 406b effectively.

Furthermore, the concentration of impurities such as water, hydrogen, and nitrogen oxide in the insulator 402 is preferably lowered. The amount of hydrogen released from the insulator 402 that is converted into hydrogen molecules per area of the insulator 402 is less than or equal to $2 \times 10^{15}$ molecules/cm$^2$, preferably less than or equal to $1 \times 10^{15}$ molecules/cm$^2$, further preferably less than or equal to $5 \times 10^{14}$ molecules/cm$^2$ in TDS analysis in a film-surface temperature range of higher than or equal to 50° C. and lower than or equal to 500° C., for example.

The insulators 302, 303, and 402 serve as a gate insulating film.

Next, metal oxides that can be used as the oxides 406a to 406c are described.

The metal oxides used as the oxides 406a to 406c preferably include at least indium. In particular, indium and zinc are preferably contained. In addition, the element M (M is one or more of gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) is preferably contained.

The metal oxide, for example, the oxide 406b may contain nitrogen. Specifically, the nitrogen concentration in the metal oxide measured by secondary ion mass spectrometry (SIMS) may be $1 \times 10^{16}$ atoms/cm$^3$ or higher, preferably $1 \times 10^{17}$ atoms/cm$^3$ or higher and $2 \times 10^{22}$ atoms/cm$^3$ or lower. Note that a metal oxide to which nitrogen is added tends to have a smaller energy gap and thus have improved conductivity. Thus, the metal oxide in this specification and the like includes a metal oxide to which nitrogen or the like is added. Moreover, a metal oxide containing nitrogen may be referred to as metal oxynitride.

The energy gap of the metal oxide is 2 eV or more, preferably 2.5 eV or more. In this manner, the off-state current of the transistor can be reduced by using a metal oxide having a wide energy gap.

The metal oxide preferably has a non-single-crystal structure. The non-single-crystal structure includes, for example, a c-axis aligned crystalline oxide semiconductor (CAAC-OS) that is described later, a polycrystalline structure, a microcrystalline structure, or an amorphous structure. Among the non-single-crystal structure, the amorphous structure has the highest density of defect states.

The metal oxides used as the oxides 406a and 406c are each an oxide containing the element M (the element M is one or more of Al, Ga, Si, B, Y, Ti, Fe, Ni, Ge, Zr, Mo, La, Ce, Nd, Hf, Ta, W, Mg, V, Be, and Cu). For the oxides 406a and 406c, for example, an In—Ga—Zn oxide, gallium oxide, barium oxide, or the like can be used.

Here, the atomic ratio of the element M to constituent elements in the metal oxide used as the oxides 406a and 406c is preferably greater than that in the metal oxide used as the oxide 406b. Moreover, the atomic ratio of the element M to In in the metal oxide used as the oxides 406a and 406c is preferably greater than that in the metal oxide used as the oxide 406b.

Furthermore, the metal oxide used as the oxides 406a and 406c preferably has a non-single-crystal structure. The non-single-crystal structure includes, for example, a CAAC-OS that is described later, a polycrystalline structure, a micro-crystalline structure, or an amorphous structure. The metal oxide used as the oxides 406a and 406c preferably has a CAAC structure. Thus, the metal oxide used as the oxides 406a and 406c has a layered crystal structure in which a plurality of IGZO nanocrystals have c-axis alignment and are connected in the a-b plane direction without alignment.

Furthermore, the metal oxide used as the oxides 406a and 406c preferably has higher crystallinity than the metal oxide used as the oxide 406b. Here, the metal oxide used as the oxides 406a and 406c is preferably formed using an oxide formed under an oxygen atmosphere, for example. With the oxide, the oxides 406a and 406c can have high crystallinity. In addition, the shapes of the oxides 406a and 406c can be more stable.

By using the above metal oxide as the oxide 406c, it is preferable that the energy of the conduction band minimum of the oxide 406c be higher than the energy of the conduction band minimum of the CAC-OS of the oxide 406b. In other words, the electron affinity of the oxide 406c is preferably smaller than the electron affinity of the CAC-OS of the oxide 406b. Here, the electron affinity means a difference between a vacuum level and an energy level of the conduction band minimum.

Similarly, by using the above metal oxide as the oxide 406a, it is preferable that the energy of the conduction band minimum of the oxide 406a be higher than the energy of the conduction band minimum of the CAC-OS of the oxide 406b. In other words, the electron affinity of the oxide 406a is preferably smaller than the electron affinity of the CAC-OS of the oxide 406b.

Here, the energy level of the conduction band minimum is gradually varied in the oxides 406a to 406c. In other words, the energy level of the conduction band minimum is continuously varied or continuously connected. To vary the energy level gradually, the density of defect states in a mixed layer formed at the interface between the oxides 406a and 406b or the interface between the oxides 406b and 406c is decreased.

Specifically, when the oxides 406a and 406b or the oxides 406b and 406c contain the same element (as a main component) in addition to oxygen, a mixed layer with a low density of defect states can be formed. For example, in the case where the oxide 406b is an In—Ga—Zn oxide, it is preferable to use an In—Ga—Zn oxide, a Ga—Zn oxide, gallium oxide, or the like as each of the oxides 406a and 406c.

At this time, a narrow-gap portion formed in the oxide 406b serves as a main carrier path. Since the density of defect states at the interface between the oxides 406a and 406b and the interface between the oxides 406b and 406c can be decreased, the influence of interface scattering on carrier conduction is small, and high on-state current can be obtained.

When an electron is trapped in a trap state of the insulator 402, the insulator 412, or the boundaries of the insulator 402 and the insulator 412, the trapped electron behaves like a fixed charge; thus, the threshold voltage of the transistor is shifted in a positive direction. The oxides 406a and 406c can make the trap state apart from the oxide 406b serving as a main carrier path. This structure can prevent the positive shift of the threshold voltage of the transistor.

Note that the metal oxide used for the transistor has the above-described three layer structure in this embodiment; however, one embodiment of the present invention is not limited thereto. For example, a two-layer structure without the oxide 406a or the oxide 406c may be employed. Alternatively, a four-layer structure in which any one of the above-described semiconductors is provided below or over or below the oxide 406a or over or below the oxide 406c may be employed. Alternatively, an n-layer structure (n is an integer of 5 or more) may be employed in which any one of the semiconductors described as examples of the oxides 406a to 406c is provided in two or more of the following positions: over the oxide 406a, under the oxide 406a, over the oxide 406c, and under the oxide 406c.

The transistor described in this embodiment includes the above-described oxides 406a to 406c.

The oxide 406a is preferably positioned in contact with the top surface of the insulator 402. The oxide 406b is preferably positioned in contact with the top surface of the oxide 406a.

The oxide 406b includes a first region, a second region, and a third region. The third region is positioned between the first region and the second region. The transistor described in this embodiment includes the conductor 416a1 over and in contact with the first region of the oxide 406b. The transistor described in this embodiment includes the conductor 416a2 over and in contact with the second region of the oxide 406b. One of the first and second regions of the oxide 406b can function as a source region, and the other can function as a drain region. The third region of the oxide 406b can function as a channel formation region.

The oxide 406c is preferably formed to be in contact with the third region of the oxide 406b and cover the oxides 406a and 406b, the conductors 416a1 and 416a2, and barrier films 417a1 and 417a2. In particular, the oxide 406c preferably covers side surfaces of the oxides 406a and 406b. In other words, side surfaces of the oxides 406a and 406b in the channel length direction are preferably in contact with the oxide 406c. Furthermore, side surfaces of the oxides 406a and 406b in the channel width direction are preferably in contact with the oxide 406c. The oxide 406c is preferably in contact with the top surface of the insulator 402 in a region outward from the oxides 406a and 406b.

With the structure in which the oxide 406b is formed in contact with the top surface of the oxide 406a and is covered with the oxide 406c, impurities such as water and hydrogen from the insulator 402, the insulator 412, or the like and metal elements from the conductor 404 can be prevented from entering the oxide 406b.

The conductors 416a1 and 416a2 are preferably provided to be separate from each other and in contact with the top surface of the oxide 406b. Here, the conductor 416a1 can function as one of source and drain electrodes, and the conductor 416a2 can function as the other.

As illustrated in FIG. 16, one side end portion of the conductor 416a1 is preferably substantially aligned with one side end portion of the oxide 406a and one side end portion of the oxide 406b. Similarly, one side end portion of the conductor 416a2 is preferably substantially aligned with the other side end portion of the oxide 406a and the other side end portion of the oxide 406b. With such a structure, the side surfaces of the oxides 406a and 406b are not in contact with the conductors 416a1 and 416a2; thus, extraction of oxygen, which causes oxygen vacancies to be formed in the side surfaces of the oxides 406a and 406b and penetration of impurities from the side surfaces of the oxides 406a and 406b can be prevented. In contrast, in the case where oxygen vacancies can be filled in the later process or in the case where the effect on the device characteristics due to oxygen vacancies and the impurities is small, such a structure is not necessarily employed and a structure in which the side surfaces of the oxide 406a and the oxide 406b are in contact with the conductor 416a1 and the conductor 416a2 may be employed.

Here, the distance between the side end portion of the conductor 416a1 and the side end portion of the conductor 416a2 that face each other, that is, the channel length of the transistor is 10 nm or greater and 300 nm or less, typically, 20 nm or greater and 180 nm or less.

The angle formed between the side surface on the side where the conductor 416a1 and the conductor 416a2 face each other preferably is less than 90°, which is a taper angle. The angle formed between the side surface and the bottom surface on the side where the conductor 416a1 and the conductor 416a2 face each other is preferably greater than or equal to 45° and less than 90°, further preferably greater than or equal to 45° and less than or equal to 75°. When the conductors 416a1 and 416a2 are formed to have such a structure, the oxide 406c can be formed with good coverage also in step portions formed by the conductors 416a1 and 416a2. Accordingly, for example, due to disconnection of the oxide 406c or the like, the oxide 406b can be prevented from being in contact with the insulator 412 or another component.

The barrier film 417a1 is preferably provided in contact with the top surface of the conductor 416a1, and the barrier film 417a2 is preferably provided in contact with the top surface of the conductor 416a2. The barrier films 417a1 and 417a2 have a function of inhibiting penetration of oxygen and impurities such as hydrogen and water. Aluminum oxide or the like can be used for the barrier films 417a1 and 417a2, for example. The barrier films 417a1 and 417a2 formed using aluminum oxide or the like can prevent surrounding excess oxygen from being consumed due to oxidation of the conductors 416a1 and 416a2. Furthermore, an increase in the electric resistance values of the conductors 416a1 and 416a2 due to the oxidation can be prevented. Note that the electric resistance values of the conductors can be measured by a two-terminal method or the like. Note that the barrier films 417a1 and 417a2 are not necessarily formed.

The conductors 416a1 and 416a2 and the barrier films 417a1 and 417a2 are formed with the mask described in Embodiment 1 and the manufacturing method described in Embodiment 2; thus, the corners of the conductors 416a1 and 416a2 and the barrier films 417a1 and 417a2 over the oxide 406b are rounded and favorable coverage of the oxide 406c and the insulator 412 are obtained. The oxide 406c and the insulator 412 formed over the corners of the conductors 416a1 and 416a2 and the barrier films 417a1 and 417a2 are prevented from being thinner than the other portions of the oxide 406c and the insulator 412. Thus, a transistor with an extremely low leakage current between the conductor 416a1 or the conductor 416a2 and the conductor 404 can be obtained.

Moreover, since the barrier film 417a1 as well as the insulator 412 and the oxide 406c is positioned between the conductor 404 and the conductor 416a1, the parasitic capacitance between the conductor 404 and the conductor 416a1 can be small. Similarly, since the barrier film 417a2 as well as the insulator 412 and the oxide 406c is positioned between the conductor 404 and the conductor 416a2, the parasitic capacitance between the conductor 404 and the conductor 416a2 can be small. Thus, the transistor described in this embodiment has excellent frequency characteristics.

The insulator 412 can function as a gate insulating film and is preferably in contact with the top surface of the oxide 406c. Like the insulator 402, the insulator 412 is preferably formed using an insulator from which oxygen is released by heating. When the insulator 412 formed using the insulator is formed in contact with the top surface of the oxide 406c, oxygen can be supplied to the oxide 406b effectively. Furthermore, the concentration of impurities such as water and hydrogen in the insulator 412 is preferably lowered as in the insulator 402.

The conductor 404 preferably has a stack of the conductor 404a, the conductor 404b, and the conductor 404c. The conductor 404a is provided over the insulator 412, the conductor 404b is provided over the conductor 404a, and the conductor 404c is provided over the conductor 404b. The insulator 412 and the conductor 404 include regions overlapping with the oxide 406b. End portions of the conductors 404a to 404c are substantially aligned. Here, the conductor 404 functions as the gate electrode. The width in the channel length direction of the conductor 404 functioning as the gate electrode is 10 nm or greater and 300 nm or less, preferably 20 nm or greater and 180 nm or less.

In other words, one of the conductors 310 and 404 can function as a gate electrode, and the other can function as a back gate electrode. The gate electrode and the back gate electrode are provided with the channel formation region in the oxide positioned therebetween. The potential of the back gate electrode may be the same as that of the gate electrode or may be a ground potential or an arbitrary potential. By changing a potential of the back gate electrode independently of the potential of the gate electrode, the threshold voltage of the transistor can be changed.

The conductor 404a is preferably formed using an oxide having conductivity. Among the In—Ga—Zn-based oxides that can be used as the oxides 406a, 406b, or 406c, highly conductive In—Ga—Zn-based oxide with a metal atomic ratio of [In]:[Ga]:[Zn]=4:2:3 to 4:1 or in the neighborhood thereof is preferably used. When the conductor 404a is formed using such an oxide, oxygen can be prevented from entering the conductors 404b and 404c, and an increase in electric resistance value of the conductors 404b and 404c due to oxidation can be prevented.

The conductor 404b is preferably a conductor that can add impurities such as nitrogen to the conductor 404a to improve the conductivity of the conductor 404a. For example, titanium nitride or the like is preferably used for the conductor 404b.

Here, the conductor 404 functioning as a gate electrode is provided to cover the top surface of the third region and its periphery and the side surface, which is in the channel width direction, of the oxide 406b with the insulator 412 and the oxide 406c interposed therebetween. Thus, the electric field of the conductor 404 functioning as a gate electrode can electrically surround the top surface of the third region and its periphery and the side surface, which is in the channel width direction, of the oxide 406b. The structure of the transistor in which the channel formation region is electrically surrounded by the electric field of the conductor 404 is referred to as a surrounded channel (s-channel) structure. Thus, a channel can be formed in the top surface of the third region and its periphery and the side surface, which is in the channel width direction, of the oxide 406b; therefore, a large amount of current can flow between the source and the drain, and a current in an on state (on-state current) can be large. Moreover, since the top surface of the third region and its periphery and the side surface, which is in the channel width direction, of the oxide 406b are surrounded by the electric field of the conductor 404, a current in an off state (off-state current) can be small.

A barrier film 418 is preferably provided over the conductor 404. Here, for the barrier film 418, a material that is less likely to transmit oxygen is preferably used, and aluminum oxide or the like can be used, for example. The barrier film 418 formed using such a material can prevent surrounding excess oxygen from being consumed due to oxidation of the conductor 404. Thus, the barrier film 418 functions as a gate cap for protecting a gate. Note that the barrier film 418 is not necessarily formed.

The insulator 408a is provided to cover the oxides 406a to 406c, the conductors 416a1 and 416a2, the barrier films 417a1 and 417a2, the insulator 412, the conductor 404, and the barrier film 418. Part of the insulator 408a is preferably in contact with the top surface of the insulator 402. For example, part of the insulator 408a is preferably in contact with the top surface of the insulator 402 in a region outward from a region of the insulator 402 overlapping with the insulator 412. Furthermore, part of the insulator 408a is preferably in contact with the top surface of the insulator 412. For example, part of the insulator 408a is preferably in contact with the top surface of the insulator 412 in a region of the insulator 412 not overlapping with the conductor 404 or the barrier film 418. In addition, the insulator 408b is provided over the insulator 408a. Each of the insulators 408a and 408b can function as a barrier insulating film for preventing impurities such as water and hydrogen from entering the transistor and the like from an upper layer.

Here, for the insulator 408a, an oxide insulator that is formed by a sputtering method is preferably used, and for example, aluminum oxide is preferably used. With the insulator 408a formed using such an oxide insulator by a sputtering method, oxygen can be added to surfaces of the insulators 402 and 412 that are in contact with the insulator 408a, so that the insulators 402 and 412 can be in an oxygen excess state. As described above, when the insulator 408a is in contact with the top surface of the insulator 412 in a region of the insulator 412 not overlapping with the conductor 404 or the barrier film 418, oxygen can be added to a large area of the insulator 412 covering the oxides 406a to 406c. Accordingly, oxygen can be supplied to the oxides 406a to 406c effectively.

Furthermore, when an insulating material that is less likely to transmit oxygen such as aluminum oxide is used for the insulator 408a, oxygen added to the insulators 402 and 412 can be prevented from being diffused upward during the deposition. Accordingly, oxygen can be added to the insulators 402 and 412 efficiently.

Here, the insulator 412 and the oxide 406c are provided between the insulator 408a and the side surfaces of the oxides 406a and 406b. Accordingly, damage to the side surfaces of the oxide 406a and the oxide 406b can be reduced at the time of deposition of the insulator 408a by a sputtering method.

For the insulators 408a and 408b, an insulating material that is less likely to transmit impurities such as water and hydrogen is preferably used, and for example, aluminum oxide or the like is preferably used. With the insulator 408a, impurities such as hydrogen and water can be prevented from being diffused from a layer that is over the insulator 408b to a layer that is below the insulator 408a.

Moreover, for the insulator 408b, an atomic layer deposition (ALD) method is preferably used, and for example, an aluminum oxide is preferably used. The insulator 408b formed by an ALD method has good coverage, and is a film in which formation of cracks, pinholes, or the like are suppressed. Although the insulators 408a and 408b are provided over an uneven structure, the insulator 408b formed by an ALD method can cover the transistor without occurrence of disconnection, formation of cracks and pinholes, or the like. Thus, even when disconnection, pinholes, or the like occurs in the insulator 408a, it can be covered with the insulator 408b; therefore, the barrier property against impurities such as hydrogen and water of a stacked film of the insulators 408a and 408b can be improved noticeably.

In the case where the insulator 408a is formed by a sputtering method and the insulator 408b is formed by an ALD method, when the film thickness of a portion over the top surface of the conductor 404c is referred to as a first film thickness and the film thickness of a portion over the side surfaces of the oxides 406a and 406b and the conductors 416a1 and 416a2 is referred to as a second film thickness, the ratio of the first film thickness to the second film thickness of the insulator 408a might be different from that of the insulator 408b. In the insulator 408b, the first film thickness and the second film thickness can be approximately the same thickness. In contrast, in the insulator 408a, the first film thickness tends to be greater than the second film thickness; for example, the first film thickness is approximately twice as large as the second film thickness in some cases.

Furthermore, for the insulators 408a and 408b, an insulating material that is less likely to transmit oxygen is preferably used. The insulators 408a and 408b including the insulating material can prevent oxygen contained in the insulator 402, the insulator 412, or the like from being diffused upward.

As described above, the transistor is positioned between the insulator 401 and the insulators 408a and 408b; thus, outward diffusion of oxygen can be prevented, and a large amount of oxygen can be contained in the insulator 402, the oxides 406a to 406c, and the insulator 412. Furthermore, impurities such as hydrogen and water can be prevented from entering from an upper layer that is over the insulator 408b and a lower layer that is below the insulator 401, and thus the concentration of impurities in the insulator 402, the oxides 406a to 406c, and the insulator 412 can be lowered.

In this manner, oxygen vacancies in the oxide 406b formed in the channel of the transistor is reduced, and impurities such as hydrogen and water are reduced; accordingly, the electrical characteristics of the transistor are made stable, and the reliability can be improved.

An insulator 410 is preferably provided over the insulator 408b. The concentration of impurities such as water and hydrogen in the insulator 410 is preferably lowered as in the insulator 402 and the like.

Moreover, an insulator 420 is preferably provided over the insulator 410. The insulator 420 preferably functions as a barrier insulating film for preventing impurities such as water and hydrogen from entering the transistor and the like from an upper layer. For the insulator 420, as well as the insulator 408a, an insulating material that is less likely to transmit oxygen and impurities such as water and hydrogen, e.g., an aluminum oxide, is preferably used.

An oxide insulator may be formed over the insulator 420 by an ALD method, which is the same method as that for the insulator 408b.

An insulator 422 is preferably provided over the insulator 420. The insulator 422 is preferably formed using an insulator similar to the insulator 410, for example.

The transistor 900 and the transistor 400 are formed over the same layer, and thus, the transistor 900 can be fabricated in parallel with the transistor 400. The transistor 900 is provided with the insulator 301 including an opening portion, a conductor 310dc inside the opening portion of the insulator 301 and includes the insulators 302, 303, and 402 over the conductor 310dc and the insulator 301; an oxide 406d1, an oxide 406d2, an oxide 406e1, an oxide 406e2, a conductor 416b1, a conductor 416b2, a barrier film 417b1, a barrier film 417b2, and the oxide 406f over the insulator 402, an insulator 412a over the oxide 406f, and a conductor 404k over the insulator 412a, and a barrier film 418a. Here, the conductor 310dc is a stacked layer of a conductor 310da and a conductor 310db. The conductors 310da and 310a are in the same layer and the conductors 310db and 310b are in the same layer. The conductor 404k includes stacked layers of a conductor 404d, a conductor 404e, and a conductor 404f. The conductors 404d and 404a are in the same layer, the conductors 404e and 404b are in the same layer, and the conductors 404f and 404c are in the same layer.

The conductors 416b1 and 416b2 are in contact with the oxide 406f. Furthermore, the oxide 406e1 in contact with the conductor 416b1 and the oxide 406e2 in contact with the conductor 416b2 are in contact with the oxide 406f. Thus, one of the conductors 416b1 and 416b2 serves as the source electrode and the other serves as the drain electrode. Furthermore, the oxide 406e1 or the oxide 406e2 can be regarded as part of the source electrode or the drain electrode and as a source region or a drain region. One of the conductors 404k and 310dc can function as a gate electrode, and the other can function as a back gate electrode.

Oxygen vacancies and impurities such as hydrogen and water of the oxide 406f included in the transistor 900 are reduced in a manner similar to that of oxygen vacancies and impurities of the oxides 406a, 406b, and 406c. Thus, the threshold voltage of the transistor 900 can be higher than 0 V, the off-state current can be reduced, and $I_{cut}$ can be noticeably reduced. Note that $I_{cut}$ refers to a drain current when the back gate voltage and the top gate voltage are each 0 V.

The back gate voltage of the transistor 400 is controlled by the transistor 900. For example, a top gate and a back gate of the transistor 900 are diode-connected to a source thereof, and the source of the transistor 900 and the back gate of the transistor 400 are connected to each other. When the negative potential of the back gate of the transistor 400 is held in the structure, the top gate-source voltage and the back gate-source voltage of the transistor 900 are each 0 V. Since the $I_{cut}$ of the transistor 900 is extremely small, the structure allows the negative potential of the back gate of the transistor 400 to be held for a long time without power supply to the transistor 400 and the transistor 900. Accordingly, the memory device including the transistor 400 and the transistor 900 can retain stored data for a long time.

In FIG. 16, a wiring 3001 is electrically connected to a source of the transistor 800, and a wiring 3002 is electrically connected to a drain of the transistor 800. A wiring 3003 is electrically connected to one of a source and a drain of the transistor 400, a wiring 3004 is electrically connected to a gate of the transistor 400, and a wiring 3006 is electrically connected to the back gate of transistor 400. A gate of the transistor 800 and the other of the source and the drain of the transistor 400 are electrically connected to one electrode of the capacitor 450. A wiring 3005 is electrically connected to the other electrode of the capacitor 450. A wiring 3007 is electrically connected to the source of the transistor 900, a wiring 3008 is electrically connected to the gate of the transistor 900, a wiring 3009 is electrically connected to the back gate of the transistor 900, and a wiring 3010 is electrically connected to the drain of the transistor 900. The wiring 3006, the wiring 3007, the wiring 3008, and the wiring 3009 are electrically connected to each other.

<Memory Device Configuration 1>

The memory device in FIG. 16 has a feature that the potential of the gate of the transistor 800 can be held, and thus enables writing, retaining, and reading of data as follows.

Writing and retaining of data are described. First, the potential of the wiring 3004 is set to a potential at which the transistor 400 is on, so that the transistor 400 is turned on. Accordingly, the potential of the wiring 3003 is supplied to a node FG where the gate of the transistor 800 and the one electrode of the capacitor 450 are electrically connected to each other. That is, predetermined charge is supplied to the gate of the transistor 800 (writing). Here, one of two kinds of charge that provide different potential levels (hereinafter referred to as low-level charge and high-level charge) is supplied. After that, the potential of the wiring 3004 is set to a potential at which the transistor 400 is off, so that the transistor 400 is turned off. Thus, the charge is retained in the node FG (retaining).

Since the off-state current of the transistor 400 is small, the charge of the node FG is retained for a long time.

Next, reading of data is described. An appropriate potential (reading potential) is supplied to the wiring 3005 while a predetermined potential (constant potential) is supplied to the wiring 3001, whereby the potential of the wiring 3002 varies depending on the amount of charge retained in the node FG. This is because in the case of using an n-channel transistor as the transistor 800, an apparent threshold voltage $V_{th\_H}$ at the time when the high-level charge is given to the gate of the transistor 800 is lower than an apparent threshold voltage $V_{th\_L}$ at the time when the low-level charge is given to the gate of the transistor 800. Here, an apparent threshold voltage refers to the potential of the wiring 3005 that is needed to turn on the transistor 800. Thus, the potential of the wiring 3005 is set to a potential $V_0$ that is between $V_{th\_H}$ and $V_{th\_L}$, whereby charge supplied to the node FG can be determined. For example, in the case where the high-level charge is supplied to the node FG, the transistor 800 is turned on when the potential of the wiring 3005 becomes $V_0$ ($>V_{th\_H}$). In the case where the low-level charge is supplied to the node FG in writing, the transistor 800 still remains off even when the potential of the wiring 3005 becomes $V_0$ ($<V_{th\_L}$). Thus, the data retained in the node FG can be read by determining the potential of the wiring 3002.

By arranging the memory devices illustrated in FIG. 16 in a matrix, a memory cell array can be formed.

Note that in the case where memory cells are arrayed, it is necessary that data of a desired memory cell be read in read operation. For example, in the case of a NOR-type memory cell array, only data of a desired memory cell can be read by turning off the transistors 800 of memory cells from which data is not read. In this case, a configuration may be employed in which only data of a desired memory cell can be read by supplying a potential at which the transistor 800 is brought into an "off state" regardless of the charge supplied to the node FG, that is, a potential lower than $V_{th\_H}$ to the wiring 3005 connected to memory cells from which data is not read. Alternatively, in the case of a NAND-type memory cell array, for example, only data of a desired memory cell can be read by turning on the transistors 800 of memory cells from which data is not read. In this case, a configuration may be employed in which only data of a desired memory cell can be read by supplying a potential at which the transistor 800 is brought into an "on state" regardless of the charge supplied to the node FG, that is, a potential higher than $V_{th\_L}$ to the wiring 3005 connected to memory cells from which data is not read.

<Memory Device Configuration 2>

The memory device illustrated in FIG. 16 does not necessarily include the transistor 800. Also in that case, data can be written and retained in a manner similar to that of the memory device described above.

For example, data reading in the memory device without the transistor 800 is described. When the transistor 400 is turned on, the wiring 3003 that is in a floating state and the capacitor 450 are brought into conduction, and the charge is redistributed between the wiring 3003 and the capacitor 450. As a result, the potential of the wiring 3003 is changed. The amount of change in the potential of the wiring 3003 varies depending on the potential of the one electrode of the capacitor 450 (or the charge accumulated in the capacitor 450).

For example, the potential of the wiring 3003 after the charge redistribution is $(C_B \times V_{B0} + C \times V)/(C_B + C)$, where V is the potential of the one electrode of the capacitor 450, C is the capacitance of the capacitor 450, $C_B$ is the capacitance component of the wiring 3003, and $V_{B0}$ is the potential of the wiring 3003 before the charge redistribution. Thus, it can be found that, assuming that the memory cell is in either of two states in which the potential of the one electrode of the capacitor 450 is $V_1$ and $V_0$ ($V_1 > V_0$), the potential of the wiring 3003 when the potential $V_1$ is retained (=$(C_B \times V_{B0} + C \times V_1)/(C_B + C)$) is higher than the potential of the wiring 3003 when the potential $V_0$ is retained (=$(C_B \times V_{B0} + C \times V_0)/(C_B + C)$).

Then, by comparing the potential of the wiring 3003 with a predetermined potential, data can be read.

In the case of employing the configuration, a transistor using silicon may be used for a driver circuit for driving a memory cell, and a transistor using an oxide semiconductor may be stacked as the transistor 400 over the driver circuit.

When including a transistor using an oxide semiconductor and having a small off-state current, the memory device described above can retain stored data for a long time. In other words, power consumption of the memory device can be reduced because refresh operation becomes unnecessary or the frequency of refresh operation can be extremely low. Moreover, stored data can be retained for a long time even when power is not supplied (note that a potential is preferably fixed).

In the memory device, a high voltage is not needed for data writing and deterioration of elements is unlikely to occur. Unlike in a conventional nonvolatile memory, for example, it is not necessary to inject and extract electrons into and from a floating gate; thus, a problem such as deterioration of an insulator is not caused. That is, unlike a conventional nonvolatile memory, the memory device of one embodiment of the present invention does not have a limit on the number of times data can be rewritten and the reliability thereof is drastically improved. Furthermore, data is written depending on the on/off state of the transistor, whereby high-speed operation can be achieved.

Furthermore, the transistor 400 can have a high on-state current by including a channel in part of an oxide in a multilayer structure as described in the above embodiment. This contributes to enhancement of data writing speed and operation speed.

<Memory Device Structure>

FIG. 16 illustrates an example of the memory device of one embodiment of the present invention. The memory device includes the transistor 900, the transistor 800, the transistor 400, and the capacitor 450. The transistor 400 is provided over the transistor 800, and the capacitor 450 is provided over the transistor 800 and the transistor 400.

The transistor 800 is provided over a substrate 811 and includes a conductor 816, an insulator 814, a semiconductor region 812 that is a part of the substrate 811, and low-resistance regions 818a and 818b functioning as source and drain regions.

The transistor 800 is either a p-channel transistor or an n-channel transistor.

It is preferable that a region of the semiconductor region 812 where a channel is formed, a region in the vicinity thereof, the low-resistance regions 818a and 818b functioning as source and drain regions, and the like include a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be included. Silicon whose effective mass is controlled by applying stress to the crystal lattice and thereby changing the lattice spacing may be included. Alternatively, the transistor 800 may be a high-electron-mobility transistor (HEMT) with GaAs and GaAlAs or the like.

The low-resistance regions 818a and 818b include an element that imparts n-type conductivity, such as arsenic or phosphorus, or an element that imparts p-type conductivity, such as boron, in addition to a semiconductor material used for the semiconductor region 812.

The conductor 816 functioning as a gate electrode can be formed using a semiconductor material such as silicon including an element that imparts n-type conductivity, such as arsenic or phosphorus, or an element that imparts p-type conductivity, such as boron, or a conductive material such as a metal material, an alloy material, or a metal oxide material.

Note that the work function of a conductor is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

Note that the transistor 800 shown in FIG. 16 is just an example and is not limited to the structure shown therein; an appropriate transistor may be used in accordance with a circuit configuration or a driving method. When the memory device has the structure described in <Structure 2 of memory device>, the transistor 800 is not necessarily provided.

An insulator 820, an insulator 822, an insulator 824, and an insulator 826 are stacked in this order so as to cover the transistor 800.

The insulator 820, the insulator 822, the insulator 824, and the insulator 826 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 822 functions as a planarization film for eliminating a level difference caused by the transistor 800 or the like underlying the insulator 822. The top surface of the insulator 822 may be planarized by planarization treatment using a CMP method or the like to increase the level of planarity.

The insulator 824 is preferably formed using a film with a barrier property that prevents hydrogen and impurities from diffusing from the substrate 811, the transistor 800, or the like into regions where the transistors 400 and 900 are provided. A barrier property refers to a function of inhibiting the diffusion of impurities typified by hydrogen and water.

For example, the diffusion length of hydrogen in the film with a barrier property at 350° C. or at 400° C. is less than or equal to 50 nm per hour, preferably less than or equal to 30 nm per hour, more preferably less than or equal to 20 nm per hour.

As an example of the film having a barrier property with respect to hydrogen, silicon nitride formed by a CVD method can be given. The diffusion of hydrogen into a semiconductor element including an oxide semiconductor, such as the transistor 400, degrades the characteristics of the semiconductor element in some cases. Therefore, a film that inhibits the diffusion of hydrogen is preferably provided between the transistors 400 and 900 and the transistor 800. Specifically, the film that inhibits the diffusion of hydrogen is a film from which hydrogen is unlikely to be released.

The released amount of hydrogen can be measured by TDS, for example. The amount of hydrogen released from the insulator 824 that is converted into hydrogen molecules per area of the insulator 824 is less than or equal to $2\times10^{15}$ molecules/cm$^2$, preferably less than or equal to $1\times10^{15}$ molecules/cm$^2$, further preferably less than or equal to $5\times10^{14}$ molecules/cm$^2$ in TDS analysis in a film-surface temperature range of higher than or equal to 50° C. and lower than or equal to 500° C., for example.

Note that the dielectric constant of the insulator 826 is preferably lower than that of the insulator 824. For example, the relative dielectric constant of the insulator 826 is preferably lower than 4, more preferably lower than 3. For example, the relative dielectric constant of the insulator 824 is preferably 0.7 times or less that of the insulator 826, more preferably 0.6 times or less that of the insulator 826. In the case where a material with a low dielectric constant is used for an interlayer film, the parasitic capacitance between wirings can be reduced.

A conductor 828, a conductor 830, and the like that are electrically connected to the capacitor 450 or the transistor 400 are embedded in the insulators 820, 822, 824, and 826. Note that the conductors 828 and 830 each function as a plug or a wiring. Note that a plurality of structures of conductors functioning as plugs or wirings are collectively denoted by the same reference numeral in some cases, as described later. Furthermore, in this specification and the like, a wiring and a plug electrically connected to the wiring may be a single component. That is, there are cases where a part of a conductor functions as a wiring and a part of a conductor functions as a plug.

As a material of each of plugs and wirings (e.g., the conductors 828 and 830), a conductive material such as a metal material, an alloy material, a metal nitride material, or a metal oxide material can be used in a single-layer structure or a layered structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 826 and the conductor 830. For example, in FIG. 16, an insulator 850, an insulator 852, and an insulator 854 are stacked in this order over the insulator 826 and the conductor 830. Furthermore, a conductor 856 is formed in the insulator 850, the insulator 852, and the insulator 854. The conductor 856 functions as a plug or a wiring. Note that the conductor 856 can be formed using a material similar to that for the conductors 828 and 830.

Note that for example, the insulator 850 is preferably formed using an insulator having a barrier property with respect to hydrogen, like the insulator 824. Furthermore, the conductor 856 preferably includes a conductor having a barrier property with respect to hydrogen. The conductor having a barrier property with respect to hydrogen is formed particularly in an opening portion of the insulator 850 having a barrier property with respect to hydrogen. In such a structure, the transistor 800 can be separated from the transistors 400 and 900 by a barrier layer, so that the diffusion of hydrogen from the transistor 800 to the transistors 400 and 900 can be inhibited.

Note that as the conductor having a barrier property with respect to hydrogen, tantalum nitride is preferably used, for example. By stacking tantalum nitride and tungsten, which has high conductivity, diffusion of hydrogen from the transistor 800 can be inhibited while the conductivity of a wiring is ensured. In this case, a tantalum nitride layer having a barrier property with respect to hydrogen is preferably in contact with the insulator 850 having a barrier property with respect to hydrogen.

An insulator 858, an insulator 451, the insulator 401, and the insulator 301 are stacked in this order over the insulator 854 and the conductor 856. A material having a barrier property with respect to oxygen or hydrogen is preferably used for any of the insulator 858, the insulator 451, the insulator 401, and the insulator 301.

The insulator 858 and the insulator 401 are each preferably formed using, for example, a film having a barrier property that prevents hydrogen or impurities from diffusing from the substrate 811, a region where the transistor 800 is provided, or the like into the regions where the transistors 400 and 900 are provided. Therefore, the insulator 858 and the insulator 401 can be formed using a material similar to that for the insulator 824.

As an example of the film having a barrier property with respect to hydrogen, silicon nitride deposited by a CVD method can be given. The diffusion of hydrogen into a semiconductor element including an oxide semiconductor, such as the transistor 400, degrades the characteristics of the semiconductor element in some cases. Therefore, a film that inhibits the diffusion of hydrogen is preferably provided between the transistors 400 and 900 and the transistor 800. Specifically, the film that inhibits the diffusion of hydrogen is a film from which hydrogen is unlikely to be released.

As the film having a barrier property with respect to hydrogen, for example, as the insulator 401, a metal oxide such as aluminum oxide, hafnium oxide, or tantalum oxide is preferably used.

In particular, aluminum oxide has an excellent blocking effect that prevents the passage of oxygen and impurities such as hydrogen and moisture which cause a change in electrical characteristics of the transistor. Accordingly, the use of aluminum oxide can prevent entry of impurities such as hydrogen and moisture into the transistors 400 and 900 in and after a manufacturing process of the transistor. In addition, release of oxygen from the oxide in the transistor 400 can be prevented. Therefore, aluminum oxide is suitably used as a protective film for the transistors 400 and 900.

In addition, the insulator 451 and the insulator 301 can be formed using a material similar to that for the insulator 820. In the case where an interlayer film formed of a material with a relatively low dielectric constant is used for the insulator, the parasitic capacitance between wirings can be reduced. For example, a silicon oxide film, a silicon oxynitride film, or the like can be used as the insulator 301.

Conductors (the conductor 310 and the conductor 310dc) included in the conductor 452 and the transistors 400 and 900, and the like are embedded in the insulator 858, the insulator 451, the insulator 401 and the insulator 301. Note that the conductor 452 functions as a plug or a wiring that is electrically connected to the capacitor 450 or the transistor 800. The conductor 452 can be formed using a material similar to that for the conductors 828 and 830.

In particular, the conductor 452 in a region in contact with the insulator 858 and the insulator 401 is preferably a conductor having a barrier property with respect to oxygen, hydrogen, and water. In such a structure, the transistor 400 and the transistor 900 can be separated from the transistor 800 by a layer having a barrier property with respect to oxygen, hydrogen, and water, so that diffusion of hydrogen from the transistor 800 into the transistors 400 and 900 can be prevented.

The transistors 400 and 900 are provided over the insulator 301. The insulator 420 is provided over the transistors 400 and 900. The insulator 420 can be formed using a material similar to that for the insulator 401, the insulator 408a, and the insulator 408b. Thus, the insulator 420 functions as protective films for the transistors 400 and 900. Furthermore, as illustrated in FIG. 16, it is preferable that openings be formed in the insulators 301, 302, 303, 402, 408a, 408b, and 410 and the insulators 401 and 420 be in contact with each other. In such a structure, the transistors 400 and 900 can be sealed with the insulators 401 and 420, preventing entry of impurities such as hydrogen and water.

The insulator 422 is provided over the insulator 420. The insulator 422 can be formed using a material similar to that for the insulator 820. In the case where an interlayer film formed of a material with a relatively low dielectric constant is used for the insulator, the parasitic capacitance between wirings can be reduced. For example, a silicon oxide film, a silicon oxynitride film, or the like can be used as the insulator 422.

A conductor 453 and the like are embedded in the insulators 302, 303, 402, 408a, 408b, and 422.

Note that the conductor 453 functions as a plug or a wiring that is electrically connected to the capacitor 450, the transistor 400, or the transistor 800. The conductor 453 can be formed using a material similar to that for the conductor 828 and the conductor 830.

For example, in the case where the conductor 453 is formed to have a stacked-layer structure, the conductor 453 preferably includes a conductor that is unlikely to be oxidized (that has high oxidation resistance). It is particularly preferable that a conductor having high oxidation resistance be provided so as to be in contact with the insulator 402 including an excess oxygen region. Such a structure permits inhibition of absorption of excess oxygen from the insulator 402 by the conductor 453. Furthermore, the conductor 453 preferably includes a conductor having a barrier property with respect to hydrogen. In particular, when a conductor having a barrier property with respect to impurities such as hydrogen is provided in contact with the insulator 402 including an excess oxygen region, the diffusion of impurities in the conductor 453 and part of the conductor 453 and the diffusion of impurities from the outside through the conductor 453 can be inhibited.

A conductor 454, the capacitor 450, and the like are provided over the insulator 422 and the conductor 453. Note that the capacitor 450 includes a conductor 455, an insulator 456, an insulator 457, an insulator 458, and a conductor 459. The conductor 455 and the conductor 459 serve as the electrodes of the capacitor 450, and the insulator 456, the insulator 457, and the insulator 458 serve as the dielectrics of the capacitor 450.

Note that the conductor 454 serves as a plug or a wiring that is electrically connected to the capacitor 450, the transistor 400, or the transistor 800. Furthermore, the conductor 455 serves as one electrode of the capacitor 450. The conductor 454 and the conductor 455 can be formed at the same time.

For the conductor 454 and the conductor 455, a metal film containing an element selected from molybdenum, titanium, tantalum, tungsten, aluminum, copper, chromium, neodymium, and scandium; a metal nitride film containing any of the above elements as its component (e.g., a tantalum nitride film, a titanium nitride film, a molybdenum nitride film, or a tungsten nitride film); or the like can be used. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added may be used.

The insulator 456, the insulator 457, and the insulator 458 can each be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, and the like.

For example, the use of a high dielectric constant (high-k) material, such as aluminum oxide, for the insulator 457 can increase the capacitance per unit area of the capacitor 450. Furthermore, a material having high dielectric strength, such as silicon oxynitride, is preferably used for the insulator 456 and the insulator 458. When a ferroelectric is located between insulators with high dielectric strength, electrostatic breakdown of the capacitor 450 can be suppressed and the capacitor can have large capacitance.

Furthermore, the conductor 459 is provided to cover the side surface and the top surface of the conductor 455 with the insulator 456, the insulator 457, and the insulator 458 provided therebetween. The side surface of the conductor 455 is covered with the conductor 459 with the insulator provided therebetween; thus, the capacitance is formed not only between the top surface of the conductor 455 and the conductor 459 but also between the side surface of the conductor 455 and the conductor 459. Accordingly, the capacitance of the capacitor 450 per projected area can be increased. Thus, the memory device can be reduced in area, highly integrated, and miniaturized.

Note that the conductor 459 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor is formed concurrently with another component such as a conductor, Cu (copper), Al (aluminum), or the like which is a low-resistance metal material may be used.

An insulator 460 is provided over the conductor 459 and the insulator 458. The insulator 460 can be formed using a material similar to that used for forming the insulator 820. The insulator 460 may serve as a planarization film that covers a roughness due to underlying layers.

The above is the description of the structure example. By employing the structure of this embodiment, a change in electrical characteristics can be prevented and the reliability can be improved in the memory device. A semiconductor device including a transistor having low leakage current between the drain and the gate in an off state can be provided. Furthermore, a semiconductor device including a transistor having low leakage current between the source and the drain in an off state can be provided. A semiconductor device including a transistor with normally-off electrical characteristics can be provided. A semiconductor device having a highly reliable transistor can be provided.

At least part of this embodiment can be implemented in combination with any of the other embodiments described in this specification as appropriate.

Embodiment 4

In this embodiment, an example of a display device that includes any of the transistors described in the embodiment above is described below with reference to FIG. 17, FIG. 18, and FIG. 19. Note that the transistor described in the above embodiments can be used not only as the transistor in the display region but also as part of the driver circuit such as a source driver or a gate driver. Furthermore, the transistor described in the above embodiments can also be used in an integrated circuit performing signal processing such as image processing and programming. Furthermore, the transistor described in the above embodiments can also be used in an integrated circuit serving as the above mentioned driver circuit.

Figure 17:
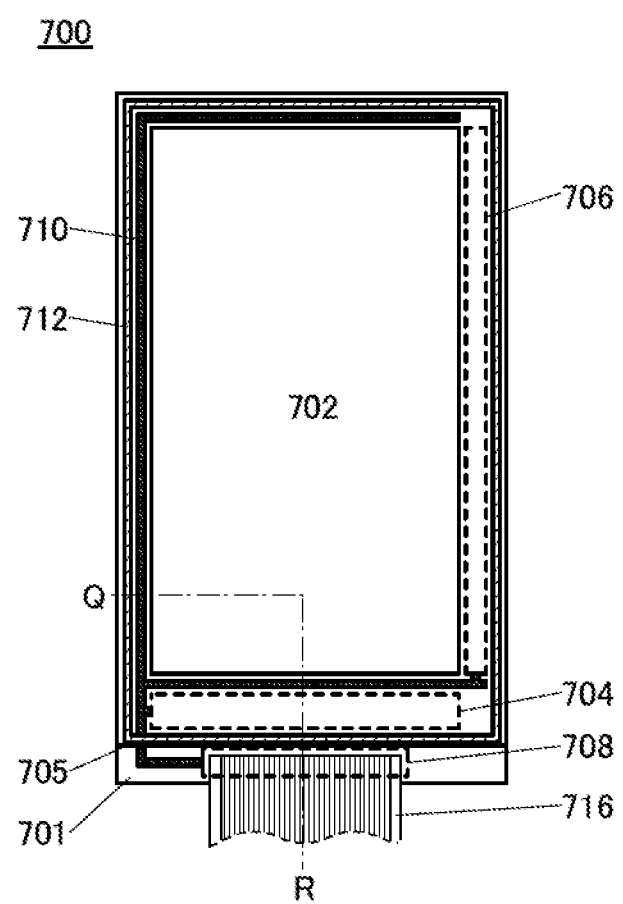
FIG. 17 is a diagram illustrating a display device according to one embodiment of the present invention.

FIG. 17 is a top view of an example of a display device. A display device 700 illustrated in FIG. 17 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 17, a display element is provided between the first substrate 701 and the second substrate 705.

In the display device 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. The variety of signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701, or only the source driver circuit portion 704 may be formed over the first substrate 701. In this case, a substrate where a source driver circuit, a gate driver circuit, or the like is formed (e.g., a driver circuit substrate formed using a single crystal semiconductor film or a polycrystalline semiconductor film) may be formed on the first substrate 701. Note that there is no particular limitation on the method of connecting a separately prepared driver circuit substrate, and a chip on glass (COG) method, a wire bonding method, or the like can be used.

The pixel portion 702, the source driver circuit portion 704, the gate driver circuit portion 706, and the FPC 716 included in the display device 700 include a plurality of transistors. As the plurality of transistors, any of the transistors that are the semiconductor devices of embodiments of the present invention can be used.

The display device 700 can include any of a variety of elements. As examples of the elements, electroluminescent (EL) element (e.g., an EL element containing organic and inorganic materials, an organic EL element, an inorganic EL element, or an LED), a light-emitting transistor element (a transistor which emits light depending on current), an electron emitter, a liquid crystal element, an electronic ink display, an electrophoretic element, an electrowetting element, a plasma display panel (PDP), a micro electro mechanical systems (MEMS) display (e.g., a grating light valve (GLV), a digital micromirror device (DMD), a digital micro shutter (DMS) element, or an interferometric modulator display (IMOD) element), and a piezoelectric ceramic display can be given.

An example of a display device including an EL element is an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Display devices having electronic ink or electrophoretic elements include electronic paper and the like. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

As a display method in the display device 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Furthermore, the size of a display region may be different depending on respective dots of the color components. Embodiments of the disclosed invention are not limited to a display device for color display; the disclosed invention can also be applied to a display device for monochrome display.

A coloring layer (also referred to as a color filter) may be used to obtain a full-color display device in which white light (W) is used for a backlight (e.g., an organic EL element, an inorganic EL element, an LED, or a fluorescent lamp). As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the coloring layer in some cases.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

In this embodiment, a structure including a liquid crystal element or an EL element as a display element is described with reference to FIG. 18 and FIG. 19. Note that FIG. 18 is a cross-sectional view taken along the dashed line Q-R in FIG. 17, and shows a structure including a liquid crystal element as a display element. FIG. 19 is a cross-sectional view taken along the dashed line Q-R in FIG. 17, and shows a structure including an EL element as a display element.

Figure 18:
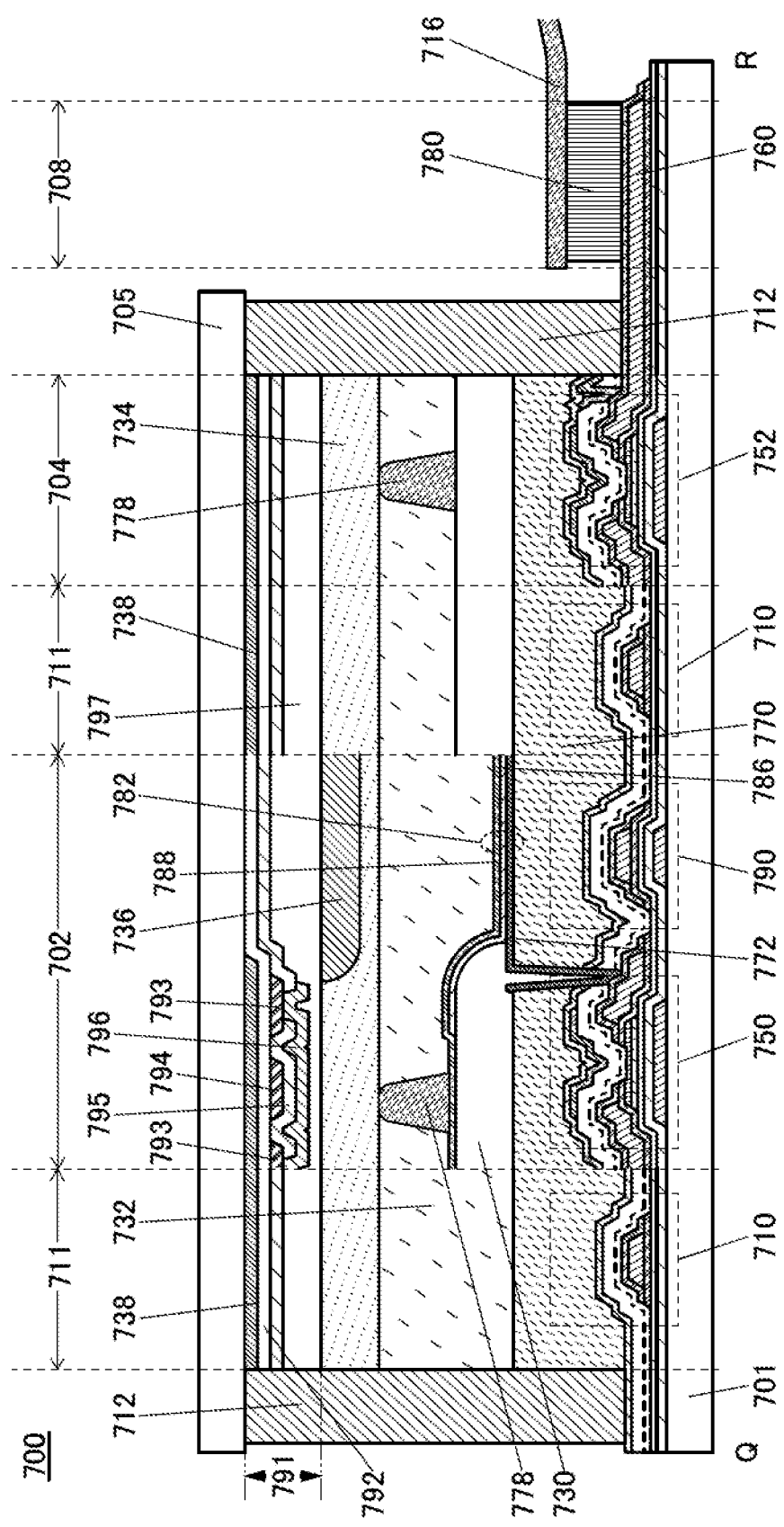
FIG. 18 is a cross-sectional view illustrating a display device according to one embodiment of the present invention.
Figure 19:
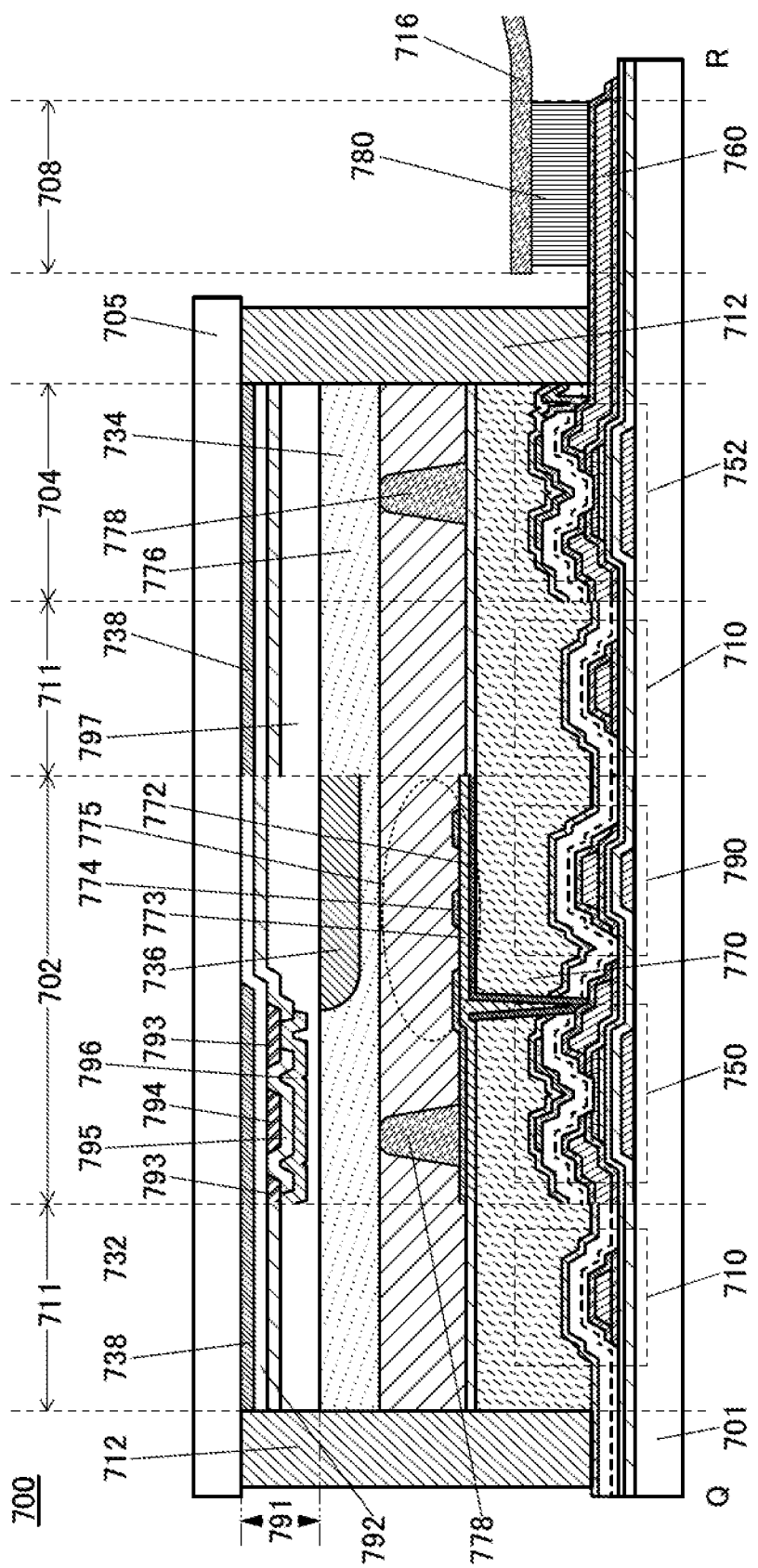
FIG. 19 is a cross-sectional view illustrating a display device according to one embodiment of the present invention.

Common portions between FIG. 18 and FIG. 19 are described first, and then different portions are described.

<5-1. Portions Common to Display Devices>

The display device 700 illustrated in FIG. 18 and FIG. 19 include a lead wiring portion 711, the pixel portion 702, the source driver circuit portion 704, and the FPC terminal portion 708. Note that the lead wiring portion 711 includes the signal line 710. The pixel portion 702 includes a transistor 750 and a capacitor 790. The source driver circuit portion 704 includes a transistor 752.

In the transistor 750 and the transistor 752, the source electrode and the drain electrode are in contact with the semiconductor layer, the first gate electrode is provided under the channel region in the semiconductor layer with the first gate insulating film provided therebetween, and the second gate electrode is provided over the channel region in the semiconductor layer with the second gate insulating film provided therebetween. Furthermore, in the display device of this embodiment, one of the source electrode and the drain electrode is connected to the pixel electrode. The details of each component are the same as those of the transistor described in the above embodiments.

The insulating film formed over the corner of the conductive film used as the source electrode or the drain electrode is not thinner than the other portions of the insulating film in the transistor used in this embodiment. Thus, a transistor having an extremely low leakage current between the conductive film used as the source electrode or the drain electrode and the conductive film used as the gate electrode provided over the conductive film used as the source electrode or the drain electrode with an insulating film provided therebetween can be obtained. Thus, a semiconductor device having stable electrical characteristics can be provided. A semiconductor device having high reliability can be provided.

The transistors used in this embodiment each include an oxide semiconductor film which is highly purified and in which formation of oxygen vacancy is suppressed. The transistor can have low off-state current. Accordingly, an electrical signal such as an image signal can be held for a longer period, and a writing interval can be set longer in an on state. Accordingly, frequency of refresh operation can be reduced, which leads to an effect of suppressing power consumption.

In addition, the transistor used in this embodiment can have relatively high field-effect mobility and thus is capable of high speed operation. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

A capacitor 790 includes a lower electrode that is formed through a step of processing the same conductive film as a conductive film functioning as a first gate electrode of the transistor 750 and an upper electrode that is formed through a step of processing the same conductive film as a conductive film functioning as a source electrode or a drain electrode of the transistor 750. Between the lower electrode and the upper electrode, an insulating film formed through a step of forming the insulating film to be the insulating film functioning as a first gate insulating film of the transistor 750 is provided. That is, the capacitor 790 has a stacked-layer structure in which the insulating films functioning as a dielectric film are positioned between a pair of electrodes.

In FIGS. 18 and 19, a planarization insulating film 770 is provided over the transistor 750, the transistor 752, and the capacitor 790.

The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

Although FIGS. 18 and 19 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors. Specifically, a structure in which a staggered transistor is used in the pixel portion 702 and an inverted staggered transistor is used in the source driver circuit portion 704, or a structure in which an inverted staggered transistor is used in the pixel portion 702 and a staggered transistor is used in the source driver circuit portion 704 may be employed. Note that the term "source driver circuit portion 704" can be replaced by the term "gate driver circuit portion".

The signal line 710 is formed in the same steps as conductive films which function as source and drain electrodes of the transistor 750 or 752. In the case where the signal line 710 is formed using a material including a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed in the same steps as conductive films which function as source and drain electrodes of the transistor 750 or 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure body 778 is provided between the first substrate 701 and the second substrate 705. The structure body 778 is a columnar spacer obtained by selective etching of an insulating film and provided to control the distance (cell gap) between the first substrate 701 and the second substrate 705. Note that a spherical spacer may be used as the structure body 778.

Furthermore, a light-blocking layer 738 functioning as a black matrix, a coloring film 736 functioning as a color filter, and an insulating film 734 in contact with the coloring film 736 are provided on the second substrate 705 side.

<5-2. Structure Example of Input/Output Device of Display Device>

In the display device 700 illustrated in FIG. 18 and FIG. 19, a touch panel 791 is provided as an input/output device. Note that the display device 700 that does not include the touch panel 791 may be used.

The touch panel 791 illustrated in FIG. 18 and FIG. 19 is what is called an in-cell touch panel provided between the substrate 705 and the coloring film 736. The touch panel 791 is formed on the substrate 705 side before the light-blocking layer 738 and the coloring film 736 are formed.

Note that the touch panel 791 includes the light-blocking layer 738, an insulating film 792, an electrode 793, an electrode 794, an insulating film 795, an electrode 796, and an insulating film 797. Changes in the mutual capacitance in the electrodes 793 and 794 can be detected when an object such as a finger or a stylus approaches, for example.

A portion in which the electrode 793 intersects with the electrode 794 is illustrated in the upper portion of the transistor 750 illustrated in FIG. 18 and FIG. 19. The electrode 796 is electrically connected to the two electrodes 793 between which the electrode 794 is sandwiched through openings provided in the insulating film 795. Note that a structure in which a region where the electrode 796 is provided is provided in the pixel portion 702 is illustrated in FIG. 18 and FIG. 19 as an example; however, one embodiment of the present invention is not limited thereto. For example, the region where the electrode 796 is provided may be provided in the source driver circuit portion 704.

The electrode 793 and the electrode 794 are provided in a region overlapping with the light-blocking layer 738. As illustrated in FIG. 18, it is preferable that the electrode 793 not overlap with the light-emitting element 782. As illustrated in FIG. 19, it is preferable that the electrode 793 not overlap with the liquid crystal element 775. In other words, the electrode 793 has an opening in a region overlapping with the light-emitting element 782 and the liquid crystal element 775. That is, the electrode 793 has a mesh shape. With such a structure, the electrode 793 does not block light emitted from the light-emitting element 782, or alternatively the electrode 793 does not block light transmitted through the liquid crystal element 775. Thus, since luminance is hardly reduced even when the touch panel 791 is provided, a display device with high visibility and low power consumption can be achieved. Note that the electrode 794 can have a structure similar to that of the electrode 793.

Since the electrode 793 and the electrode 794 do not overlap with the light-emitting element 782, a metal material having low transmittance with respect to visible light can be used for the electrode 793 and the electrode 794. Furthermore, since the electrode 793 and the electrode 794 do not overlap with the liquid crystal element 775, a metal material having low transmittance with respect to visible light can be used for the electrode 793 and the electrode 794.

Thus, as compared with the case of using an oxide material whose transmittance with respect to visible light is high, resistance of the electrodes 793 and 794 can be reduced, whereby sensitivity of the sensor of the touch panel can be increased.

A conductive nanowire may be used for the electrodes 793, 794, and 796, for example. The nanowire may have a mean diameter of greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case where an Ag nanowire is used for any one of or all of the electrodes 793, 794, and 796, the transmittance with respect to visible light can be greater than or equal to 89% and sheet resistance can be greater than or equal to 40 $\Omega$/sq. and less than or equal to 100 $\Omega$/sq.

Although the structure of the in-cell touch panel is illustrated in FIGS. 18 and 19, one embodiment of the present invention is not limited thereto. For example, a touch panel formed over the display device 700, what is called an on-cell touch panel, or a touch panel attached to the display device 700, what is called an out-cell touch panel may be used. In this manner, the display device 700 of one embodiment of the present invention can be combined with various types of touch panels.

<5-3. Display Device Including Light-Emitting Element>

The display device 700 illustrated in FIG. 18 includes a light-emitting element 782. The light-emitting element 782 includes a conductive film 772, an EL layer 786, and a conductive film 788. The display device 700 illustrated in FIG. 18 can display an image by utilizing light emission from the EL layer 786 of the light-emitting element 782. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. A material containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

In the display device 700 in FIG. 18, the insulating film 730 is provided over the planarization insulating film 770 and the conductive film 772. The insulating film 730 covers part of the conductive film 772. Note that the light-emitting element 782 has a top emission structure. Therefore, the conductive film 788 has a light-transmitting property and transmits light emitted from the EL layer 786. Although the top-emission structure is described as an example in this embodiment, the structure is not limited thereto. A bottom-emission structure in which light is emitted to the conductive film 772 side, or a dual-emission structure in which light is emitted to both the conductive film 772 side and the conductive film 788 side may be employed.

The coloring film 736 is provided to overlap with the light-emitting element 782, and the light-shielding layer 738 is provided in the lead wiring portion 711 and the source driver circuit portion 704 to overlap with the insulating film 730. The coloring film 736 and the light-shielding layer 738 are covered with the insulating film 734. A space between the light-emitting element 782 and the insulating film 734 is filled with a sealing film 732. The structure of the display device 700 is not limited to the example in FIG. 18, in which the coloring film 736 is provided. For example, a structure without the coloring film 736 may also be employed in the case where the EL layer 786 is formed by separate coloring.

<5-4. Structure Example of Display Device Including Liquid Crystal Element>

The display device 700 illustrated in FIG. 19 includes a liquid crystal element 775. The liquid crystal element 775 includes a conductive film 772, an insulating film 773, a conductive film 774, and a liquid crystal layer 776. In such a structure, the conductive film 774 functions as a common electrode, and an electric field generated between the conductive film 772 and the conductive film 774 through the insulating film 773 can control the alignment state in the liquid crystal layer 776. The display device 700 in FIG. 19 is capable of displaying an image in such a manner that transmission or non-transmission is controlled by change in the alignment state of the liquid crystal layer 776 depending on a voltage applied to the conductive film 772 and the conductive film 774.

The conductive film 772 is electrically connected to the conductive film functioning as the source electrode or the drain electrode of the transistor 750. The conductive film 772 is formed over the planarization insulating film 770 to function as a pixel electrode, i.e., one electrode of the display element.

A conductive film that transmits visible light or a conductive film that reflects visible light can be used as the conductive film 772. For example, a material containing an element selected from indium (In), zinc (Zn), and tin (Sn) is preferably used for the conductive film that transmits visible light. For example, a material containing aluminum or silver is preferably used for the conductive film that reflects visible light. In this embodiment, the conductive film that reflects visible light is used for the conductive film 772.

Although FIG. 19 illustrates an example in which the conductive film 772 is connected to the conductive film functioning as the drain electrode of the transistor 750, one embodiment of the present invention is not limited to this example. For example, the conductive film 772 may be electrically connected to the conductive film functioning as the drain electrode of the transistor 750 through a conductive film functioning as a connection electrode.

Although not shown in FIG. 19, an alignment film may be provided in contact with the liquid crystal layer 776. Although not illustrated in FIG. 19, an optical member (an optical substrate) and the like such as a polarizing member, a retardation member, or an anti-reflection member may be provided as appropriate. For example, circular polarization may be employed by using a polarizing substrate and a retardation substrate. In addition, a backlight, a side light, or the like may be used as a light source.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase when the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal exhibiting a blue phase and a chiral material has a short response time and optical isotropy, which eliminates the need for an alignment process. An alignment film does not need to be provided, and thus, rubbing treatment is not necessary; accordingly, electrostatic discharge damage caused by the rubbing treatment can be prevented, and defects and damage of a liquid crystal display device in the manufacturing process can be reduced. Moreover, the liquid crystal material that exhibits a blue phase has small viewing angle dependence.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Furthermore, a normally black liquid crystal display device such as a vertical alignment (VA) mode transmissive liquid crystal display device may also be used. There are some examples of a vertical alignment mode; for example, a multi-domain vertical alignment (MVA) mode, a patterned vertical alignment (PVA) mode, and an ASV mode, or the like can be employed.

<6-3. Components>

The above components will be described below. Note that descriptions of structures having functions similar to those in the above embodiments are omitted.

[Coloring Layer]

As examples of a material that can be used for the coloring layers, a metal material, a resin material, and a resin material containing a pigment or dye can be given.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

The above is the description of each of the components. By employing the structure of this embodiment, a change in electrical characteristics can be prevented and the reliability can be improved in the display device. A semiconductor device including a transistor having low leakage current between the drain and the gate in an off-state can be provided. Furthermore, a semiconductor device including a transistor having low leakage current between the source and the drain in an off-state can be provided. Thus, a semiconductor device having stable electrical characteristics can be provided. A semiconductor device having high reliability can be provided.

At least part of this embodiment can be implemented in combination with any of the other embodiments described in this specification as appropriate.

Embodiment 5

In this embodiment, an example of a display panel which can be used for a display portion or the like in a display device including the semiconductor device of one embodiment of the present invention is described with reference to FIG. 20 and FIG. 21. The display panel described below as an example includes both a reflective liquid crystal element and a light-emitting element and can display an image in both the transmissive mode and the reflective mode.

<6-1. Structure Example of Display Panel>

Figure 20:
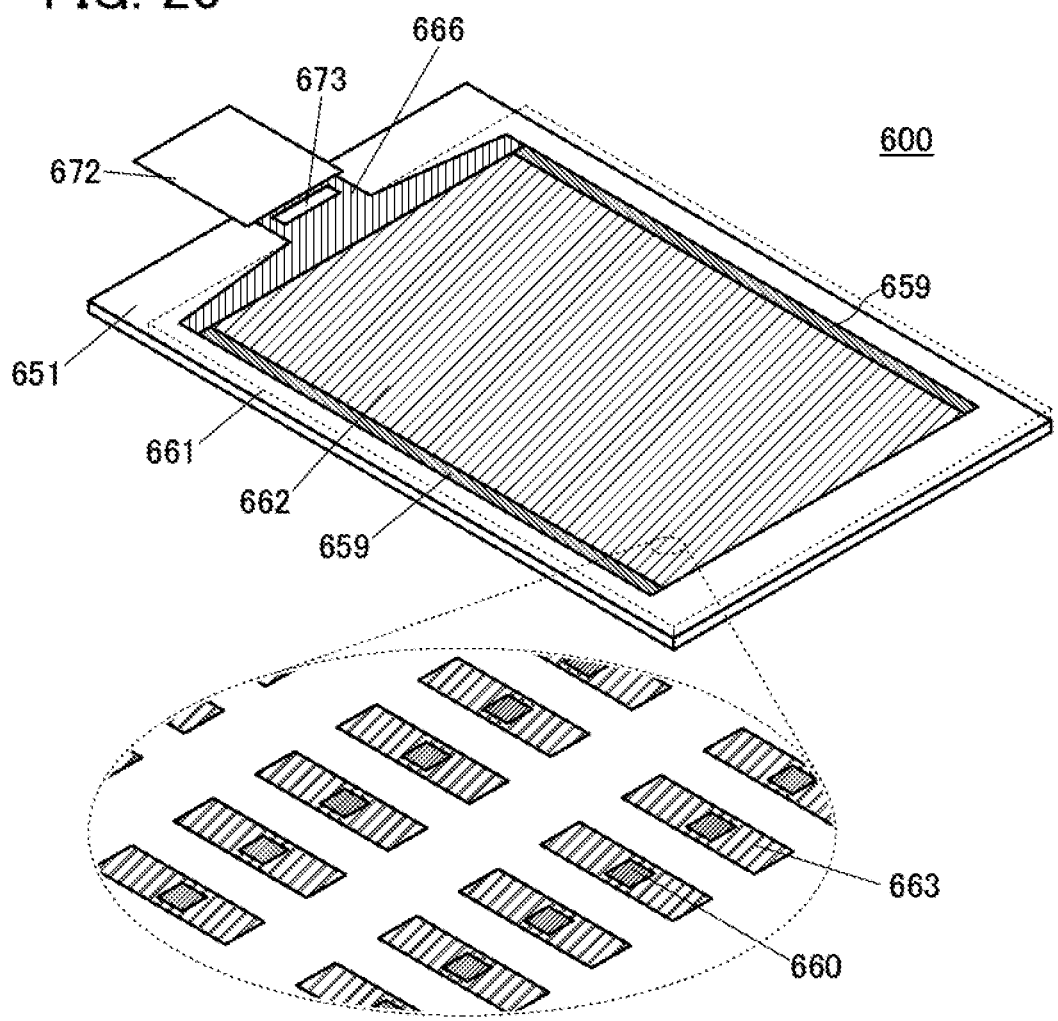
FIG. 20 is a perspective view illustrating a display device according to one embodiment of the present invention.

FIG. 20 is a schematic perspective view illustrating a display panel 600 of one embodiment of the present invention. In the display panel 600, a substrate 651 and a substrate 661 are attached to each other. In FIG. 20, the substrate 661 is denoted by a dashed line.

The display panel 600 includes a display portion 662, a circuit 659, a wiring 666, and the like. The substrate 651 is provided with the circuit 659, the wiring 666, a conductive film 663 which serves as a pixel electrode, and the like. In FIG. 20, an IC 673 and an FPC 672 are mounted on the substrate 651. Thus, the structure illustrated in FIG. 20 can be referred to as a display module including the display panel 600, the FPC 672, and the IC 673.

As the circuit 659, for example, a circuit functioning as a scan line driver circuit can be used.

The wiring 666 has a function of supplying a signal or electric power to the display portion or the circuit 659. The signal or electric power is input to the wiring 666 from the outside through the FPC 672 or from the IC 673.

FIG. 20 illustrates an example in which the IC 673 is provided on the substrate 651 by a chip on glass (COG) method or the like. As the IC 673, an IC functioning as a scan line driver circuit, a signal line driver circuit, or the like can be used. Note that it is possible that the IC 673 is not provided when, for example, the display panel 600 includes circuits serving as a scan line driver circuit and a signal line driver circuit and when the circuits serving as a scan line driver circuit and a signal line driver circuit are provided outside and a signal for driving the display panel 600 is input through the FPC 672. Alternatively, the IC 673 may be mounted on the FPC 672 by a chip on film (COF) method or the like.

FIG. 20 also shows an enlarged view of part of the display portion 662. The conductive films 663 included in a plurality of display elements are arranged in a matrix in the display portion 662. The conductive film 663 has a function of reflecting visible light and serves as a reflective electrode of a liquid crystal element 640 described later.

As illustrated in FIG. 20, the conductive film 663 has an opening. A light-emitting element 660 is positioned closer to the substrate 651 than the conductive film 663 is. Light is emitted from the light-emitting element 660 to the substrate 661 side through the opening in the conductive film 663.

<6-2. Cross-Sectional Structure Example>

Figure 21:
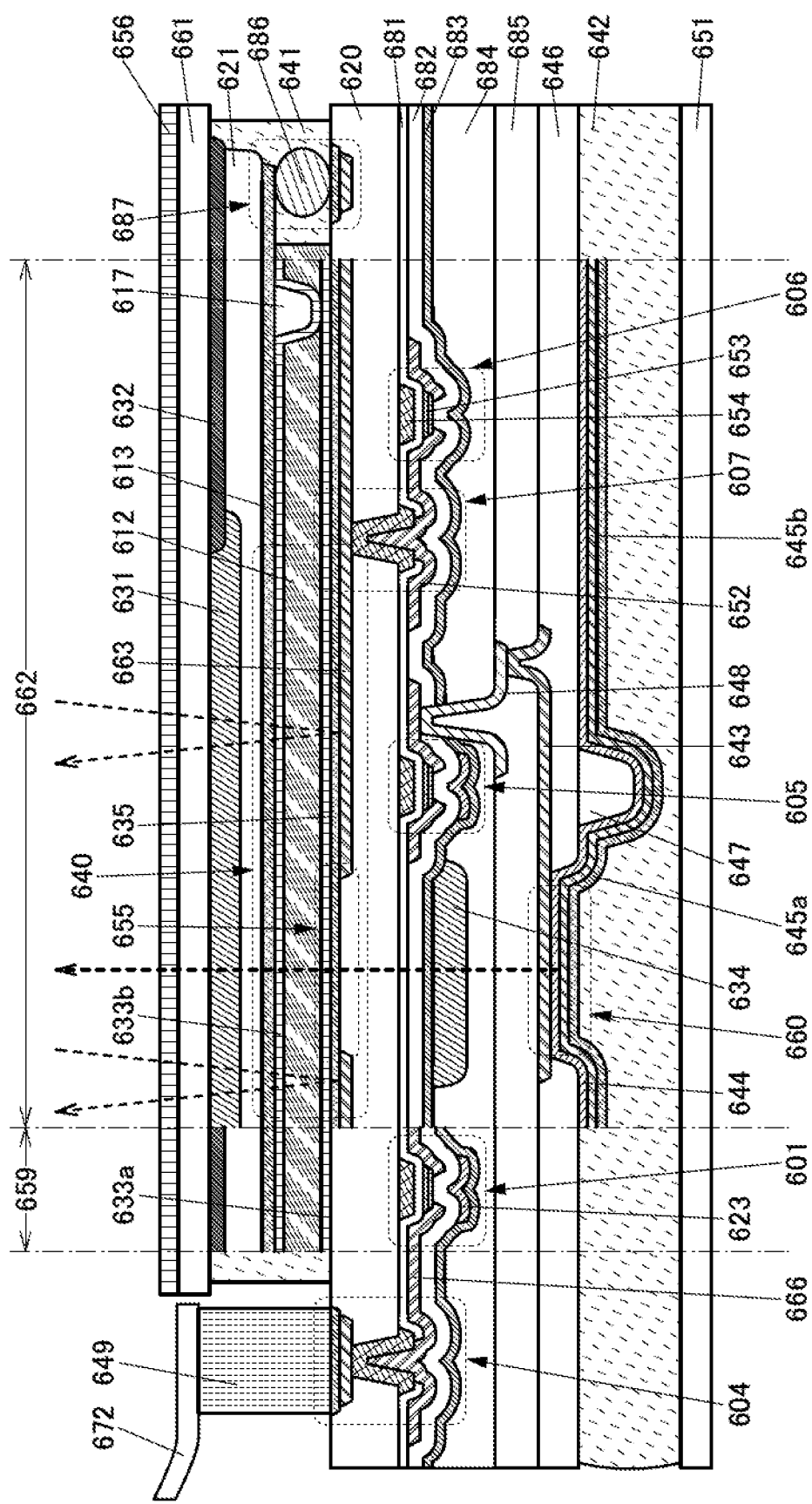
FIG. 21 is a cross-sectional view illustrating a display device according to one embodiment of the present invention.

FIG. 21 illustrates an example of cross sections of part of a region including the FPC 672, part of a region including the circuit 659, and part of a region including the display portion 662 of the display panel illustrated in FIG. 20.

The display panel includes an insulating film 620 between the substrates 651 and 661. The display panel also includes the light-emitting element 660, a transistor 601, a transistor 605, a transistor 606, a coloring layer 634, and the like between the substrate 651 and the insulating film 620. Furthermore, the display panel includes the liquid crystal element 640, a coloring layer 631, and the like between the insulating film 620 and the substrate 661. The substrate 661 and the insulating film 620 are bonded with an adhesive layer 641. The substrate 651 and the insulating film 620 are bonded with an adhesive layer 642.

The transistor of the present invention can be used as the transistor 605 and the transistor 606 provided in the display portion 662, the transistor 601 provided in the circuit 659, or the transistor provided in the IC 673.

The insulating film formed over the corner of the conductive film used as the source electrode or the drain electrode is not thinner than the other portions of the insulating film in the transistor used in this embodiment. Thus, a transistor having an extremely low leakage current between the conductive film used as the source electrode or the drain electrode and the conductive film used as the gate electrode provided over the conductive film used as the source electrode or the drain electrode with an insulating film provided therebetween can be obtained. Thus, a semiconductor device having stable electrical characteristics can be provided. A semiconductor device having high reliability can be provided.

The transistor 606 is electrically connected to the liquid crystal element 640 and the transistor 605 is electrically connected to the light-emitting element 660. Since the transistors 605 and 606 are formed on a surface of the insulating film 620 which is on the substrate 651 side, the transistors 605 and 606 can be formed through the same process.

The substrate 661 is provided with the coloring layer 631, a light-blocking layer 632, an insulating film 621, a conductive film 613 serving as a common electrode of the liquid crystal element 640, an alignment film 633b, an insulating film 617, and the like. The insulating film 617 serves as a spacer for holding a cell gap of the liquid crystal element 640.

Insulating layers such as an insulating film 681, an insulating film 682, an insulating film 683, an insulating film 684, and an insulating film 685 are provided on the substrate 651 side of the insulating film 620. Part of the insulating film 681 functions as a gate insulating film of each transistor. The insulating films 682, 683, and 684 are provided to cover each transistor. The insulating film 685 is provided to cover the insulating film 684. The insulating films 684 and 685 each function as a planarization layer. Note that an example where the three insulating layers, the insulating films 682, 683, and 684, are provided to cover the transistors and the like is described here; however, one embodiment of the present invention is not limited to this example, and four or more insulating layers, a single insulating layer, or two insulating layers may be provided. The insulating film 684 functioning as a planarization layer is not necessarily provided when not needed.

The transistors 601, 605, and 606 each include a conductive film 654 part of which functions as a gate, a conductive film 652 part of which functions as a source or a drain, and a semiconductor film 653. Here, a plurality of layers obtained by processing the same conductive film are shown with the same hatching pattern.

The liquid crystal element 640 is a reflective liquid crystal element. The liquid crystal element 640 has a stacked-layer structure of a conductive film 635, a liquid crystal layer 612, and the conductive film 613. In addition, the conductive film 663 which reflects visible light is provided in contact with the surface of the conductive film 635 that faces the substrate 651. The conductive film 663 includes an opening 655. The conductive films 635 and 613 contain a material transmitting visible light. In addition, an alignment film 633a is provided between the liquid crystal layer 612 and the conductive film 635 and the alignment film 633b is provided between the liquid crystal layer 612 and the conductive film 613. A polarizing plate 656 is provided on an outer surface of the substrate 661.

In the liquid crystal element 640, the conductive film 663 has a function of reflecting visible light and the conductive film 613 has a function of transmitting visible light. Light entering from the substrate 661 side is polarized by the polarizing plate 656, passes through the conductive film 613 and the liquid crystal layer 612, and is reflected by the conductive film 663. Then, the light passes through the liquid crystal layer 612 and the conductive film 613 again and reaches the polarizing plate 656. In this case, alignment of the liquid crystal is controlled with a voltage that is applied between the conductive film 613 and the conductive film 663, and thus optical modulation of light can be controlled. That is, the intensity of light emitted through the polarizing plate 656 can be controlled. Light excluding light in a particular wavelength region is absorbed by the coloring layer 631, and thus, emitted light is red light, for example.

The light-emitting element 660 is a bottom-emission light-emitting element. The light-emitting element 660 has a structure in which a conductive film 643, an EL layer 644, and a conductive film 645b are stacked in this order from the insulating film 620 side. In addition, a conductive film 645a is provided to cover the conductive film 645b. The conductive film 645b contains a material reflecting visible light, and the conductive films 643 and 645a contain a material transmitting visible light. Light is emitted from the light-emitting element 660 to the substrate 661 side through the coloring layer 634, the insulating film 620, the opening 655, the conductive film 613, and the like.

Here, as illustrated in FIG. 21, the conductive film 635 transmitting visible light is preferably provided for the opening 655. Accordingly, the liquid crystal layer 612 is aligned in a region overlapping with the opening 655 as well as in the other regions, in which case an alignment defect of the liquid crystal is prevented from being generated in the boundary portion of these regions and undesired light leakage can be suppressed.

As the polarizing plate 656 provided on an outer surface of the substrate 661, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 640 are controlled depending on the kind of the polarizing plate so that desirable contrast is obtained.

In addition, an insulating film 647 is provided on the insulating film 646 covering an end portion of the conductive film 643. The insulating film 647 has a function as a spacer for preventing the insulating film 620 and the substrate 651 from being unnecessarily close to each other. In the case where the EL layer 644 or the conductive film 645a is formed using a blocking mask (metal mask), the insulating film 647 may have a function of preventing the blocking mask from being in contact with a surface on which the EL layer 644 or the conductive film 645a is formed. Note that the insulating film 647 is not necessarily provided when not needed.

One of a source and a drain of the transistor 605 is electrically connected to the conductive film 643 of the light-emitting element 660 through a conductive film 648.

One of a source and a drain of the transistor 606 is electrically connected to the conductive film 663 through a connection portion 607. The conductive films 663 and 635 are in contact with and electrically connected to each other. Here, in the connection portion 607, the conductive layers provided on both surfaces of the insulating film 620 are connected to each other through an opening in the insulating film 620.

A connection portion 604 is provided in a region where the substrates 651 and 661 do not overlap with each other. The connection portion 604 is electrically connected to the FPC 672 through a connection layer 649. The connection portion 604 has a structure similar to that of the connection portion 607. On the top surface of the connection portion 604, a conductive layer obtained by processing the same conductive film as the conductive film 635 is exposed. Thus, the connection portion 604 and the FPC 672 can be electrically connected to each other through the connection layer 649.

A connection portion 687 is provided in part of a region where the adhesive layer 641 is provided. In the connection portion 687, the conductive layer obtained by processing the same conductive film as the conductive film 635 is electrically connected to part of the conductive film 613 with a connector 686. Accordingly, a signal or a potential input from the FPC 672 connected to the substrate 651 side can be supplied to the conductive film 613 formed on the substrate 661 side through the connection portion 687.

As the connector 686, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 686, a material capable of elastic deformation or plastic deformation is preferably used. As illustrated in FIG. 21, the connector 686 which is the conductive particle has a shape that is vertically crushed in some cases. With the crushed shape, the contact area between the connector 686 and a conductive layer electrically connected to the connector 686 can be increased, thereby reducing contact resistance and suppressing the generation of problems such as disconnection.

The connector 686 is preferably provided so as to be covered with the adhesive layer 641. For example, the connectors 686 are dispersed in the adhesive layer 641 before curing of the adhesive layer 641.

FIG. 21 illustrates an example of the circuit 659 in which the transistor 601 is provided.

The structure in which the semiconductor film 653 where a channel is formed is provided between two gates is used as an example of the transistors 601 and 605 in FIG. 21. One gate is formed using the conductive film 654 and the other gate is formed using a conductive film 623 overlapping with the semiconductor film 653 with the insulating film 682 provided therebetween. Such a structure enables control of threshold voltages of a transistor. In that case, the two gates may be connected to each other and supplied with the same signal to operate the transistor. Such a transistor can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display panel in which the number of wirings is increased because of increase in size or resolution.

Note that the transistor included in the circuit 659 and the transistor included in the display portion 662 may have the same structure. A plurality of transistors included in the circuit 659 may have the same structure or different structures. A plurality of transistors included in the display portion 662 may have the same structure or different structures.

A material through which impurities such as water and hydrogen do not easily diffuse is preferably used for at least one of the insulating films 682 and 683 which cover the transistors. That is, the insulating film 682 or the insulating film 683 can function as a barrier film. Such a structure can effectively suppress diffusion of the impurities into the transistors from the outside, and a highly reliable display panel can be provided.

The insulating film 621 is provided on the substrate 661 side to cover the coloring layer 631 and the light-blocking layer 632. The insulating film 621 may have a function as a planarization layer. The insulating film 621 enables the conductive film 613 to have an almost flat surface, resulting in a uniform alignment state of the liquid crystal layer 612.

An example of the method for manufacturing the display panel 600 is described. For example, the conductive film 635, the conductive film 663, and the insulating film 620 are formed in order over a support substrate provided with a separation layer, and the transistor 605, the transistor 606, the light-emitting element 660, and the like are formed. Then, the substrate 651 and the support substrate are bonded with the adhesive layer 642. After that, separation is performed at the interface between the separation layer and each of the insulating film 620 and the conductive film 635, whereby the support substrate and the separation layer are removed. Separately, the coloring layer 631, the light-blocking layer 632, the conductive film 613, and the like are formed over the substrate 661 in advance. Then, the liquid crystal which is the liquid crystal layer 612 is dropped onto the substrate 651 or 661 and the substrates 651 and 661 are bonded with the adhesive layer 641, whereby the display panel 600 can be manufactured.

A material for the separation layer can be selected such that separation at the interface with the insulating film 620 and the conductive film 635 occurs. In particular, it is preferable that a stacked layer of a layer including a highmelting-point metal material, such as tungsten, and a layer including an oxide of the metal material be used as the separation layer, and a stacked layer of a plurality of layers, such as a silicon nitride layer, a silicon oxynitride layer, and a silicon nitride oxide layer be used as the insulating film 620 over the separation layer. The use of the high-melting-point metal material for the separation layer can increase the formation temperature of a layer formed in a later step, which reduces impurity concentration and achieves a highly reliable display panel.

As the conductive film 635, an oxide or a nitride such as a metal oxide, a metal nitride, or an oxide semiconductor whose resistance is reduced is preferably used. In the case of using an oxide semiconductor, a material in which at least one of the concentrations of hydrogen, boron, phosphorus, nitrogen, and other impurities and the number of oxygen vacancies is made to be higher than those in a semiconductor layer of a transistor is used for the conductive film 635.

<6-3. Components>

The above components will be described below. Note that descriptions of structures having functions similar to those in the above embodiments are omitted.

[Adhesive Layer]

For the adhesive layers, any of a variety of types of curable adhesives, e.g., a light curable adhesive such as a UV curable adhesive, a reactive curable adhesive, a heat curable adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, and the like. In particular, a material with low moisture permeability, such as an epoxy resin, is preferred. Alternatively, a two-component type resin may be used. Still alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent an impurity such as moisture from entering an element, thereby improving the reliability of the display panel.

In addition, it is preferable to mix a filler with a high refractive index or light-scattering member into the resin, in which case light extraction efficiency can be enhanced. For example, titanium oxide, barium oxide, zeolite, zirconium, or the like can be used.

[Connection Layer]

As the connection layers, an anisotropic conductive film (ACF), an anisotropic conductive paste (ACP), or the like can be used.

The above is the description of each of the components. By employing the structure of this embodiment, a change in electrical characteristics can be prevented and the reliability can be improved in the display device. A semiconductor device including a transistor having low leakage current between the drain and the gate in an off-state can be provided. Furthermore, a semiconductor device including a transistor having low leakage current between the source and the drain in an off-state can be provided. Thus, a semiconductor device having stable electrical characteristics can be provided. A semiconductor device having high reliability can be provided.

At least part of this embodiment can be implemented in combination with any of the other embodiments described in this specification as appropriate.

This application is based on Japanese Patent Application Serial No. 2016-163218 filed with Japan Patent Office on Aug. 24, 2016, the entire contents of which are hereby incorporated by reference.

What is claimed is:

1. A semiconductor device comprising:
   a transistor comprising:
      a semiconductor layer;
      a first conductor over the semiconductor layer;
      a second conductor over the semiconductor layer;
      a gate insulating film over the semiconductor layer, the first conductor, and the second conductor; and
      a gate electrode over the gate insulating film,
   wherein, in a plan view of the semiconductor device, each of the first conductor and the second conductor comprises a first side surface, a second side surface, a first curved corner between the first side surface and the second side surface, a third side surface, a second curved corner between the first side surface and the third side surface, a fourth side surface, a third curved corner between the second side surface and the fourth side surface, a fifth side surface, and a fourth curved corner between the third side surface and the fifth side surface,
   wherein, in the plan view of the semiconductor device, the first side surface, the second side surface the third side surface the fourth side surface the fifth side surface the first curved corner, the second curved corner, the third curved corner, and the fourth curved corner of each of the first conductor and the second conductor overlap with the semiconductor layer,
   wherein, in the plan view of the semiconductor device, the first curved corner and the second curved corner of each of the first conductor and the second conductor overlap with the gate electrode,
   wherein, in the plan view of the semiconductor device, the third curved corner and the fourth curved corner of each of the first conductor and the second conductor do not overlap with the gate electrode, and
   wherein each of an angle between the first side surface of the first conductor and the second side surface of the first conductor, an angle between the first side surface of the first conductor and the third side surface of the first conductor, an angle between the first side surface of the second conductor and the second side surface of the second conductor, and an angle between the first side surface of the second conductor and the third side surface of the second conductor is greater than 90° and less than or equal to 150°.

2. A semiconductor device comprising:
   a transistor comprising:
      a semiconductor layer;
      a first conductor over the semiconductor layer;
      a second conductor over the semiconductor layer;
      a gate insulating film over the semiconductor layer, the first conductor, and the second conductor; and
      a gate electrode over the gate insulating film,
   wherein, in a plan view of the semiconductor device, each of the first conductor and the second conductor comprises a first side surface, a second side surface, a first curved corner between the first side surface and the second side surface, a third side surface, a second curved corner between the first side surface and the third side surface, a fourth side surface, a third curved corner between the second side surface and the fourth side surface, a fifth side surface, and a fourth curved corner between the third side surface and the fifth side surface, wherein, in the plan view of the semiconductor device, the first side surface, the second side surface, the third side surface, the fourth side surface, the fifth side surface, the first curved corner, the second curved corner, the third curved corner, and the fourth curved corner of each of the first conductor and the second conductor overlap with the semiconductor layer, wherein, in the plan view of the semiconductor device, the first curved corner and the second curved corner of each of the first conductor and the second conductor overlap with the gate electrode, wherein, in the plan view of the semiconductor device, the third curved corner and the fourth curved corner of each of the first conductor and the second conductor do not overlap with the gate electrode, wherein each of an angle between the first side surface of the first conductor and the second side surface of the first conductor, an angle between the first side surface of the first conductor and the third side surface of the first conductor, an angle between the first side surface of the second conductor and the second side surface of the second conductor, and an angle between the first side surface of the second conductor and the third side surface of the second conductor is greater than 90° and less than or equal to 150°, and wherein each of the second side surface of the first conductor and the third side surface of the first conductor overlaps with a first side surface of the gate electrode, and each of the second side surface of the second conductor and the third side surface of the second conductor overlaps with a second side surface of the gate electrode.

3. The semiconductor device according to claim 1,
wherein one of the first conductor and the second conductor serves as part of a write bit line, and
wherein the other of the first conductor and the second conductor serves as a floating node.

4. The semiconductor device according to claim 1, wherein the first side surface of the first conductor faces the first side surface of the second conductor.

5. The semiconductor device according to claim 1, further comprising a base insulating film including a first region and a second region,
wherein the first region of the base insulating film is in contact with the semiconductor layer,
wherein the second region of the base insulating film is not in contact with the semiconductor layer, and
wherein a thickness of the first region of the base insulating film is smaller than a thickness of the second region of the base insulating film.

6. The semiconductor device according to claim 2,
wherein one of the first conductor and the second conductor serves as part of a write bit line, and
wherein the other of the first conductor and the second conductor serves as a floating node.

7. The semiconductor device according to claim 2, wherein the first side surface of the first conductor faces the first side surface of the second conductor.

8. The semiconductor device according to claim 2, further comprising a base insulating film including a first region and a second region,
wherein the first region of the base insulating film is in contact with the semiconductor layer,
wherein the second region of the base insulating film is not in contact with the semiconductor layer, and
wherein a thickness of the first region of the base insulating film is smaller than a thickness of the second region of the base insulating film.

* * * * *